United States Patent
Sonokawa et al.

(10) Patent No.: US 9,144,964 B2
(45) Date of Patent: *Sep. 29, 2015

(54) PROCESS FOR MAKING LITHOGRAPHIC PRINTING PLATE

(71) Applicant: FUJIFILM CORPORATION, Minato-ku, Tokyo (JP)

(72) Inventors: Koji Sonokawa, Haibara-gun (JP); Tsubasa Fukuda, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/224,940

(22) Filed: Mar. 25, 2014

(65) Prior Publication Data

US 2014/0202349 A1    Jul. 24, 2014

Related U.S. Application Data

(63) Continuation of application No. PCT/JP2012/073578, filed on Sep. 14, 2012.

(30) Foreign Application Priority Data

Sep. 26, 2011 (JP) ................................. 2011-209917

(51) Int. Cl.
*G03F 7/00* (2006.01)
*B41C 1/10* (2006.01)
(Continued)

(52) U.S. Cl.
CPC .............. *B41C 1/1008* (2013.01); *G03F 7/033* (2013.01); *G03F 7/035* (2013.01); *G03F 7/32* (2013.01); *G03F 7/322* (2013.01); *B41C 2210/04* (2013.01); *B41C 2210/06* (2013.01); *B41C 2210/10* (2013.01); *G03F 7/029* (2013.01); *G03F 7/031* (2013.01)

(58) Field of Classification Search
CPC ..... G03F 7/32; B41C 2210/04; B41C 2210/06
USPC ................................................ 430/270.1, 302
See application file for complete search history.

(56) References Cited

U.S. PATENT DOCUMENTS

2008/0299488 A1    12/2008 Yu et al.
2009/0186299 A1    7/2009 Tao et al.
(Continued)

FOREIGN PATENT DOCUMENTS

EP    1 342 568 B1    10/2005
EP    1 916 568 A2    4/2008
(Continued)

OTHER PUBLICATIONS

International Search Report of PCT/JP2012/073578 dated Oct. 16, 2012.
(Continued)

*Primary Examiner* — Chanceity Robinson
(74) *Attorney, Agent, or Firm* — Sughrue Mion, PLLC

(57) ABSTRACT

A process for making a lithographic printing plate enables a one-bath processable lithographic printing plate having excellent printing durability, ink laydown and resistance to staining during printing. The process includes a step of producing a negative-working lithographic printing plate precursor having, above a support, a photopolymerizable photosensitive layer containing a vinylcarbazole compound-derived monomer unit-containing acrylic polymer and/or a urethane-acrylic hybrid polymer, a step of image-wise exposing the negative-working lithographic printing plate precursor, and a step of developing the exposed negative-working lithographic printing plate precursor by means of a developer having a pH of 4 to 10, comprising (Component A) a compound represented by Formula (I) and/or Formula (II) below and (Component B) water, and having an organic solvent content of less than 5 mass %. The process does not comprise a washing step or a gumming step before or after the development step.

20 Claims, 1 Drawing Sheet

(51) Int. Cl.
*G03F 7/033* (2006.01)
*G03F 7/035* (2006.01)
*G03F 7/32* (2006.01)
G03F 7/029 (2006.01)
G03F 7/031 (2006.01)

(56) References Cited

U.S. PATENT DOCUMENTS

2010/0216067 A1    8/2010  Miller et al.
2014/0020585 A1*   1/2014  Sonokawa .................. 101/465

FOREIGN PATENT DOCUMENTS

| EP | 2 693 270 A1 | 2/2014 |
| JP | 2009-086344 A | 4/2009 |
| WO | 2005/111727 A1 | 11/2005 |
| WO | 2008/027227 A1 | 3/2008 |

OTHER PUBLICATIONS

Extended European Search Report dated Apr. 23, 2015, issued by the European Patent Office in corresponding European Application No. 12837108.5.

* cited by examiner

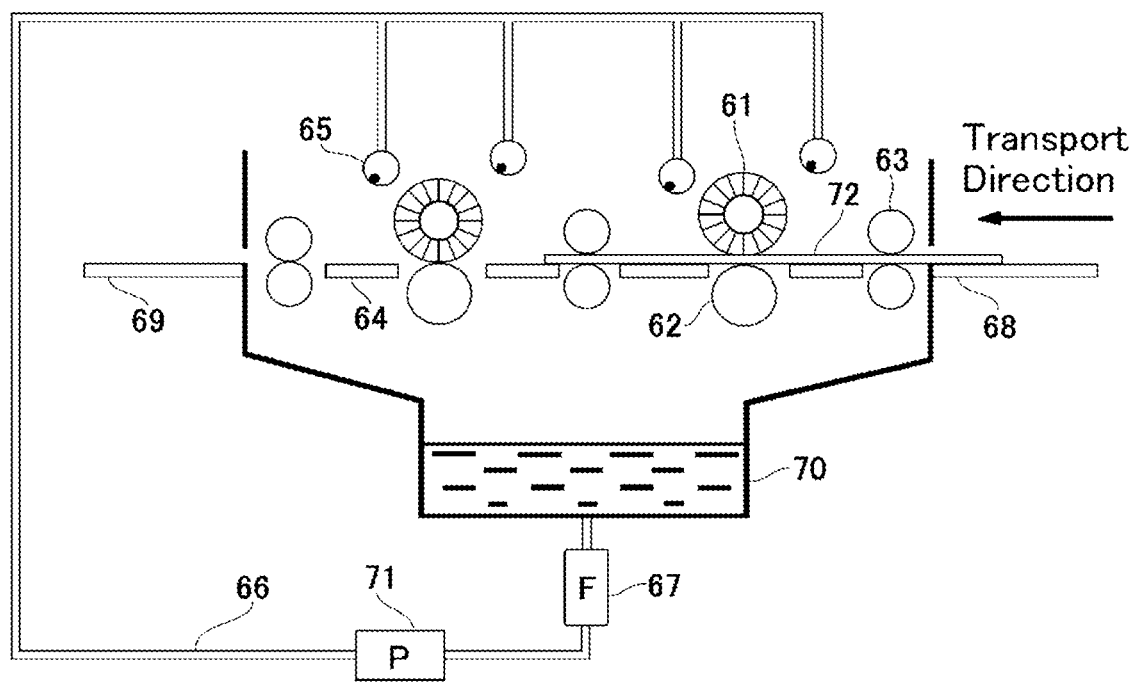

PROCESS FOR MAKING LITHOGRAPHIC PRINTING PLATE

CROSS-REFERENCE TO RELATED APPLICATIONS

The present application is a continuation application of International Application No. PCT/JP2012/073578, filed Sep. 14, 2012, which claims priority to Japanese Patent Application No. 2011-209917 filed on Sep. 26, 2011. The contents of these applications are incorporated herein by reference in their entirety.

FIELD OF THE INVENTION

The present invention relates to a process for making a lithographic printing plate.

BACKGROUND ART

In general, a lithographic printing plate is formed from a lipophilic image area for accepting ink and a hydrophilic non-image area for accepting dampening water in a printing process. Lithographic printing is a printing process in which the property of water and oil-based ink repelling each other is utilized so as to cause a difference in ink attachment on the surface of a lithographic printing plate with a lipophilic image area of the lithographic printing plate as an ink-accepting area and a hydrophilic non-image area as a dampening water-accepting area (non-ink-accepting area), and after inking only the image area ink is transferred to a printing substrate such as paper.

In order to make this lithographic printing plate, a lithographic printing plate precursor (PS plate) formed by providing a lipophilic photosensitive resin layer (photosensitive layer) on a hydrophilic support is widely used in the art. A lithographic printing plate is usually obtained by a process in which, after the lithographic printing plate precursor is exposed through an original image such as a lith film, a photosensitive layer that becomes an image area is made to remain, and unnecessary photosensitive layer that becomes a non-image area is removed by dissolving using a strong alkaline developer having a pH of no less than 12 to thus form a non-image area in which the surface of the hydrophilic support is exposed.

On the other hand, digitization techniques involving electronically processing, storing, and outputting image information by computer have been widespread in recent years, and various new image output methods responding to such digitization techniques have been put into practical use. Accompanying this, a computer-to-plate (CTP) technique has been attracting attention in which digitized image information is carried on a highly convergent radiant ray such as laser light and a lithographic printing plate precursor is scan-exposed by this light to directly produce a lithographic printing plate without intervention of a lith film. Therefore, obtaining a lithographic printing precursor suitable for these techniques has become one of the important technological challenges.

As a laser light source that can be used in the CTP technique, a solid-state laser such as a YAG laser or a semiconductor laser that emits infrared rays having a wavelength of 760 to 1,200 nm is very useful since one with high output and small size is available at low cost. A UV laser can also be used.

From the background described above, there is currently an even stronger desire than ever for compatibility with both digitization and simplification of plate making operations.

In response to this, for example, Patent Document 1 describes a process for making a plate by developing, using a gumming liquid, a lithographic printing plate precursor having provided above a hydrophilic support a photosensitive layer in which hydrophobic thermoplastic polymer particles are dispersed in a hydrophilic binder.

Patent Document 2 describes a method for one-bath processing a lithographic printing plate precursor by image-wisely exposing with an infrared laser a lithographic printing plate precursor comprising (i) a hydrophilic support and (ii) a photosensitive layer comprising a radically polymerizable ethylenically unsaturated monomer, a radical polymerization initiator, and an infrared absorbing dye, and then removing an uncured portion of the photosensitive layer using a gumming liquid.

Furthermore, Patent Document 3 describes a method for developing a lithographic printing plate precursor, the method comprising curing a radically polymerizable photosensitive layer by exposure to an infrared laser and removing an unexposed portion using a solvent-containing developer having a pH of less than 12 and comprising benzyl alcohol and an amphoteric surfactant having a specific structure.

Furthermore, Patent Document 4 describes a method for developing a lithographic printing plate precursor, the method comprising curing a radically polymerizable photosensitive layer by exposure to an infrared laser and removing an unexposed portion using a solvent-containing developer comprising no greater than 60 mass % of water, a water-soluble or water-dispersible solvent, and a surfactant having a specific structure.

Furthermore, Patent Document 5 discloses a method for developing a lithographic printing plate precursor by one-bath processing in which a radical polymerization-type photosensitive layer is cured by exposure to a UV-IR UV or IR laser, and an unexposed portion is removed using an aqueous solution having a pH of 2 to 10 and comprising an amphoteric surfactant and an anionic surfactant.

Patent Document 1: EP 1 342 568 B
Patent Document 2: International publication WO 2005/111727
Patent Document 3: International publication WO 2008/027227
Patent Document 4: US 2010/0216067 A1
Patent Document 5: JP-A-2009-086344 (JP-A denotes a Japanese unexamined patent application publication.)

DISCLOSURE OF THE INVENTION

Problems to be Solved by the Invention

In a conventional process for making a lithographic printing plate, after exposure it is necessary to carry out a step of removing an unwanted photosensitive layer by dissolving using a developer, etc., and simplifying such an additional wet treatment is cited as one of the problems with this process. In particular, disposal of effluent discharged accompanying processing with high pH alkali has been of great concern to the entire industry in recent years from the viewpoint of consideration of the global environment, and there is therefore a stronger desire for development to be carried out with an aqueous solution that is close to neutral as one way of simplifying the treatment. Furthermore, from another way of looking at simplification, a conventional high pH alkali development system is mainly a system involving processing in three baths in which a washing step of removing developer attached to a developed printing plate and a gumming step for protecting the hydrophilicity of a non-image area and de-oleophilizing are carried out after a development step, but a one-bath processing system that enables the amounts of water and chemicals to be reduced has been attracting considerable attention.

In the process for making a plate described in Patent Document 1, the lithographic printing plate precursor is imagewisely exposed using an infrared laser to thus fuse the hydrophobic thermoplastic polymer particles and form an image, and development is then carried out by removing an unexposed portion using a gumming liquid.

However, the method in which image formation involving thermal bonding of such microparticles is employed and a lithographic printing plate precursor that is obtained is developed by means of a gumming liquid has very good developability but low sensitivity and printing durability, and the image area surface to which the microparticles, which are easily dispersed in water, have been thermally bonded has the problem that ink laydown is poor.

The inventions described in Patent Documents 2 and 5 have high sensitivity and printing durability due to radical polymerization being employed for image formation, and the amounts of water and chemicals used can be greatly reduced due to one-bath processing, but an image area surface that has been formed by using a photosensitive layer that can be removed by a developer disclosed therein still has the problem of poor ink laydown.

Furthermore, since the invention described in Patent Document 3 and 4 uses a binder polymer, etc. having low water-solubility or water-dispersibility for a photosensitive layer, the printing durability is yet higher. However, in order to develop and remove such a photosensitive layer, an organic solvent is contained as a developing agent, and it can be expected that due to this organic solvent there will be the problem that, when one-bath processing is carried out using a developer disclosed therein, organic solvent in developer remaining on a non-image area will evaporate, a developed and removed component will be precipitated and become attached to a substrate, and resistance to staining during printing will be greatly degraded.

Therefore, it is an object of the present invention to provide a process for making a lithographic printing plate that enables a one-bath processable lithographic printing plate having excellent printing durability, ink laydown and resistance to staining during printing.

Means for Solving the Problems

The object has been attained by means described in <1> below. It is described below with <2> to <20>, which are preferred embodiments.
<1> a process for making a lithographic printing plate, the process comprising: a step of producing a negative-working lithographic printing plate precursor comprising above a support a photopolymerizable photosensitive layer comprising a vinylcarbazole compound-derived monomer unit-containing acrylic polymer and/or a urethane-acrylic hybrid polymer, a step of imagewisely exposing the negative-working lithographic printing plate precursor, and a step of developing the exposed negative-working lithographic printing plate precursor by means of a developer having a pH of 4 to 10, comprising at least (Component A) a compound represented by Formula (I) and/or Formula (II) below and (Component B) water, and having an organic solvent content of less than 5 mass %, wherein the process does not comprise a washing step or a gumming step before or after the development step,

wherein Formula (I) $R^1$ to $R^3$ independently denote an alkyl group, and in Formula (II) $R^4$ to $R^6$ independently denote an alkyl group, L denotes an alkylene group, and A denotes a carboxylate ion or a sulfonate ion,
<2> the process for making a lithographic printing plate according to <1>, wherein the developer has an organic solvent content of no greater than 1 mass %,
<3> the process for making a lithographic printing plate according to <1> or <2>, wherein Component A is a compound represented by Formula (II),
<4> the process for making a lithographic printing plate according to <3>, wherein at least one selected from the group consisting of $R^4$, $R^5$, and $R^6$ above comprises, in an alkyl chain of the alkyl group, a linking group selected from the group consisting of an ester bond, an amide bond, and an ether bond,
<5> the process for making a lithographic printing plate according to <3> or <4>, wherein $R^4$, $R^5$, and $R^6$ above have a total number of carbons of 8 to 22,
<6> the process for making a lithographic printing plate according to any one of <1> to <5>, wherein the developer further comprises a water-soluble polymer compound,
<7> the process for making a lithographic printing plate according to any one of <1> to <6>, wherein Component A has a content in the developer of 1 to 15 mass %,
<8> the process for making a lithographic printing plate according to any one of <1> to <7>, wherein Component A has a content in the developer of 4 to 10 mass %,
<9> the process for making a lithographic printing plate according to any one of <1> to <8>, wherein Component B has a content in the developer of at least 50 mass %,
<10> the process for making a lithographic printing plate according to any one of <1> to <9>, wherein the developer further comprises an anionic surfactant and/or a nonionic surfactant,
<11> the process for making a lithographic printing plate according to any one of <1> to <10>, wherein the developer has a pH of 6 to 8,
<12> the process for making a lithographic printing plate according to any one of <1> to <11>, wherein the developer comprises a carbonate salt and a bicarbonate salt,
<13> the process for making a lithographic printing plate according to any one of <1> to <12>, wherein the acrylic polymer further comprises an acrylonitrile-derived monomer unit,
<14> the process for making a lithographic printing plate according to any one of <1> to <13>, wherein the urethane-acrylic hybrid polymer comprises a monomer unit derived from a compound selected from the group consisting of diphenylmethane diisocyanate, m-tolylene diisocyanate, isophorone diisocyanate, and dicyclohexylmethane diisocyanate,
<15> the process for making a lithographic printing plate according to any one of <1> to <14>, wherein the photopolymerizable photosensitive layer is sensitive to infrared light and comprises a triphenylalkyl borate salt and/or a tetraphenyl borate salt, <16> the process for making a lithographic printing plate according to <15>, wherein the photopolymerizable photosensitive layer further comprises a copper phthalocyanine pigment, <17> the process for making a lithographic printing plate according to any one of <1> to <14>, wherein the photopolymerizable photosensitive layer is sensitive to infrared light and does not comprise a borate salt but comprises a coloring dye, <18> the process for making a lithographic printing plate according to any one of <15> to <17>, wherein the photopolymerizable photosensitive layer comprises a cyanine dye and an iodonium salt, <19> the process for making a lithographic printing plate according to any one of <1> to <14>, wherein the photopolymerizable photosensitive layer further comprises a dye, and <20> the process for making a lithographic printing plate according to <19>, wherein the dye has a wavelength of maximum absorption in the visible region (360 to 830 nm) of 600 to 700 nm.

Effects of the Invention

In accordance with the present invention, there can be provided a process for making an one-bath processable lithographic printing plate that enables a lithographic printing plate having excellent printing durability, ink laydown and resistance to staining during printing.

BRIEF DESCRIPTION OF DRAWINGS (FIG. 1)

A diagram showing the one example of automatic one-bath processing equipment for a lithographic printing plate precursor that can suitably be used in the process for making a lithographic printing plate of the present invention.

MODES FOR CARRYING OUT THE INVENTION

The process for making a lithographic printing plate of the present invention comprises a step of producing a negative-working lithographic printing plate precursor (hereinafter, also called a 'precursor production step') comprising above a support a photopolymerizable photosensitive layer comprising a vinylcarbazole compound-derived monomer unit-containing acrylic polymer (hereinafter, also called a 'specific acrylic polymer') and/or a urethane-acrylic hybrid polymer, a step of imagewisely exposing the negative-working lithographic printing plate precursor (hereinafter, also called an 'exposure step'), and a step of developing the exposed negative-working lithographic printing plate precursor (hereinafter, also called a 'development step') by means of a developer having a pH of 4 to 10, comprising (Component A) a compound represented by Formula (I) below and/or Formula (II) below and (Component B) water, and having an organic solvent content of less than 5 mass %, wherein the process does not comprise a washing step or a gumming step before or after the development step.

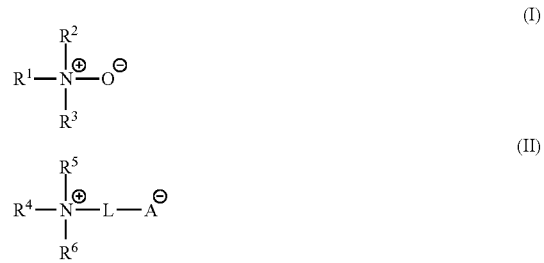

wherein in Formula (I) $R^1$ to $R^3$ independently denote an alkyl group, and in Formula (II) $R^4$ to $R^6$ independently denote an alkyl group, L denotes an alkylene group, and A denotes a carboxylate ion or a sulfonate ion.

The present invention is explained in detail below. The development step, which is the most characteristic step in the present invention, is explained first, and the other steps etc. are then explained.

In the present invention, the notation 'lower limit to upper limit', which expresses a numerical range, means 'at least the lower limit but no greater than the upper limit', and the notation 'upper limit to lower limit' means 'no greater than the upper limit but at least the lower limit'. That is, they are numerical ranges that include the upper limit and the lower limit.

Furthermore, '(Component A) compound represented by Formula (I) and/or Formula (II) below' etc. are simply called 'Component A' etc.

Furthermore, in the present invention, 'group' means both substituted and unsubstituted groups unless otherwise specified, and for example an 'alkyl group' means not only an unsubstituted alkyl group but also a substituted alkyl group.

Furthermore, in the present invention, 'mass %' is used for the same meaning as 'weight %', and 'parts by mass' is used for the same meaning as 'parts by weight'.

(Development Step)

The process for making a lithographic printing plate of the present invention comprises a step (development step) of developing the exposed negative-working lithographic printing plate precursor by means of a developer having a pH of 4 to 10, comprising at least (Component A) a compound represented by Formula (I) and/or Formula (II) below and (Component B) water, and having an organic solvent content of less than 5 mass %, and the process does not comprise a washing step or a gumming step before or after the development step.

<Developer>

The developer that is used in the process for making a lithographic printing plate of the present invention is an aqueous solution or aqueous dispersion comprising at least Components A, B and having an organic solvent content of less than 5 mass % above.

Components A, B and an organic solvent content of less than 5 mass % are explained below.

(Component A) Compound Represented by Formula (I) and/or Formula (II)

Component A is a compound represented by Formula (I) and/or Formula (II) below. It is surmised that this compound functions in a developer as an amphoteric surfactant that contributes to dispersion of a developed and removed component, etc. in the developer.

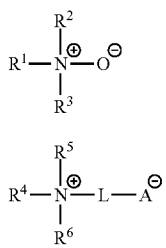

Wherein in Formula (I) $R^1$ to $R^3$ independently denote an alkyl group, and in Formula (II) $R^4$ to $R^6$ independently denote an alkyl group, L denotes an alkylene group, and A denotes a carboxylate ion or a sulfonate ion.

In Formula (I) above, $R^1$, $R^2$, and $R^3$ independently denote an alkyl group, at least one selected from the group consisting of $R^1$, $R^2$, and $R^3$ preferably has in alkyl chain of the alkyl group a linking group selected from the group consisting of an ester bond (—(C=O)O—), an ether bond (—O—), and an amide bond (—NH—(C=O)—). It is preferable for one or two selected from the group consisting of $R^1$, $R^2$, and $R^3$ to have the linking group, and it is more preferable for one thereof to have the linking group.

The number of carbons of each of $R^1$ to $R^3$ is preferably 1 to 30, more preferably 1 to 24, yet more preferably 1 to 20, and particularly preferably 1 to 18. Furthermore, the sum total of the carbons of $R^1$ to $R^3$ of Formula (I) above is preferably 8 to 22, and more preferably 10 to 20. When $R^1$ to $R^3$ have an ester bond or an amide bond as the linking group, the number of carbons means the number of carbons including the number of carbons contained in the linking group.

Furthermore, at least one selected from the group consisting of $R^1$, $R^2$, and $R^3$ is preferably alkyl group has 10 to 30 carbon atoms, more preferably unsubstituted alkyl group has 10 to 30 carbon atoms, acyloxyalkyl group has 10 to 30 carbon atoms, alkoxyalkyl group has 10 to 30 carbon atoms or alkylamidealkyl group has 10 to 30 carbon atoms, yet more preferably unsubstituted alkyl group has 10 to 30 carbon atoms or alkylamidealkyl group has 10 to 30 carbon atoms, particularly preferably alkylamidealkyl group has 10 to 30 carbon atoms In Formula (II) above, $R^4$, $R^5$, and $R^6$ independently denote an alkyl group, and at least one selected from the group consisting of $R^4$, $R^5$, and $R^6$ preferably has in its chain a linking group selected from the group consisting of an ester bond (—(C=O)O—), an ether bond (—O—), and an amide bond (—NH—(C=O)—). It is preferable for one or two selected from the group consisting of $R^4$, $R^5$, and $R^6$ to have the linking group, and it is more preferable for one thereof to have the linking group.

Furthermore, the alkyl group may have a substituent, and examples of the substituent include a hydroxy group.

The number of carbons of each of $R^4$ to $R^6$ is preferably 1 to 30, more preferably 1 to 24, yet more preferably 1 to 20, and particularly preferably 1 to 18. Furthermore, the sum total of the carbons of $R^4$ to $R^6$ of Formula (II) above is preferably 8 to 25, and more preferably 11 to 21. When $R^4$ to $R^6$ have an ester bond or an amide bond as the linking group, the number of carbons and the sum total of carbons mean the number of carbons including carbons contained in the linking group.

Furthermore, at least one selected from the group consisting of $R^4$, $R^5$, and $R^6$ is preferably alkyl group has 10 to 30 carbon atoms, more preferably unsubstituted alkyl group has 10 to 30 carbon atoms, acyloxyalkyl group has 10 to 30 carbon atoms, alkoxyalkyl group has 10 to 30 carbon atoms or alkylamidealkyl group has 10 to 30 carbon atoms, yet more preferably unsubstituted alkyl group has 10 to 30 carbon atoms or alkylamidealkyl group has 10 to 30 carbon atoms, particularly preferably alkylamidealkyl group has 10 to 30 carbon atoms In Formula (II) above, L denotes an alkylene group; the alkylene group preferably has 1 to 20 carbons, more preferably 1 to 12 carbons, yet more preferably 1 to 6 carbons, and particularly preferably 1 to 4 carbons.

Furthermore, the alkyl group and the alkylene group may comprise a substituent, and examples of the substituent include a hydroxy group.

In Formula (II) above, A denotes a carboxylate ion or a sulfonate ion, and is preferably a sulfonate ion.

In the present invention, Component A is preferably a compound represented by Formula (II).

Specific examples of Component A include, but are not limited to, the structures below.

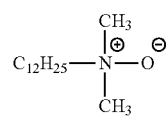

BO-1

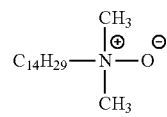

BO-2

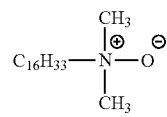

BO-3

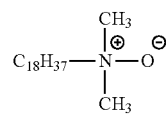

BO-4

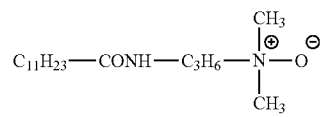

BO-5

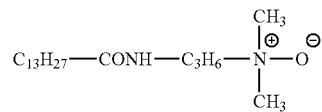

BO-6

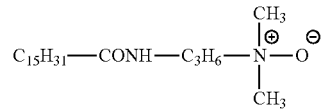

BO-7

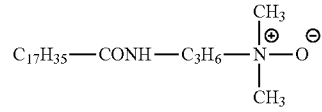

BO-8

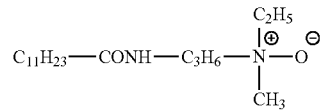

BO-9

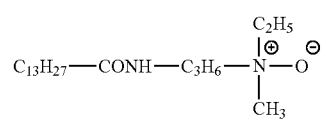
BO-10
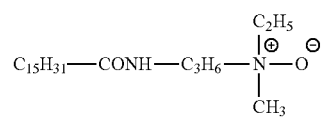
BO-11
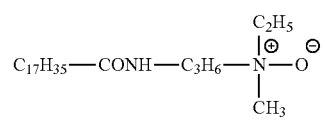
BO-12
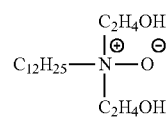
BO-13
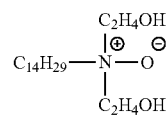
BO-14
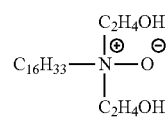
BO-15
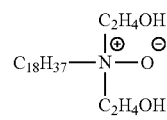
BO-16
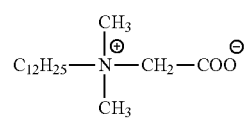
BC-1
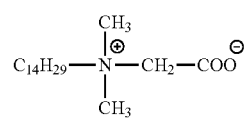
BC-2
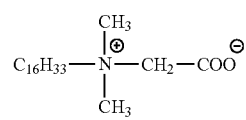
BC-3
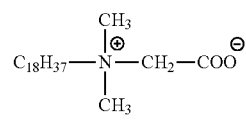
BC-4
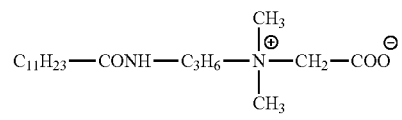
BC-5
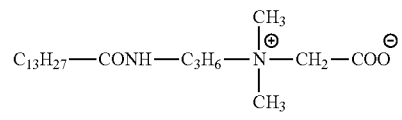
BC-6
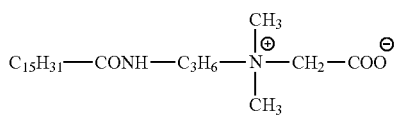
BC-7
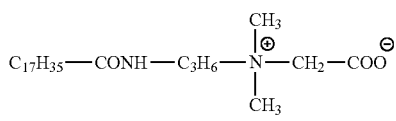
BC-8
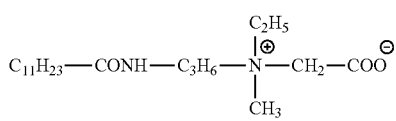
BC-9
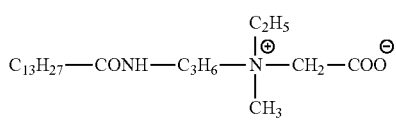
BC-10
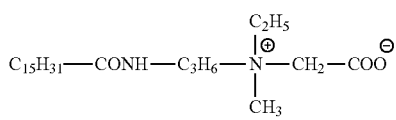
BC-11
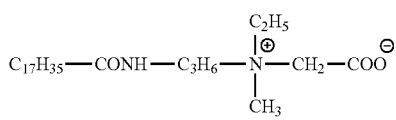
BC-12
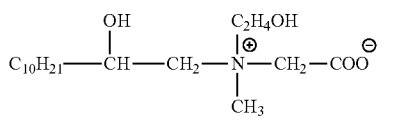
BC-13
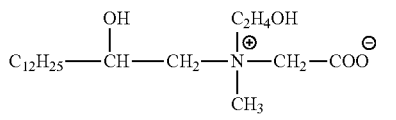
BC-14
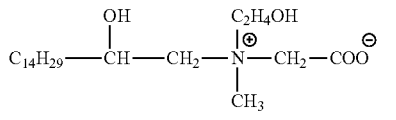
BC-15
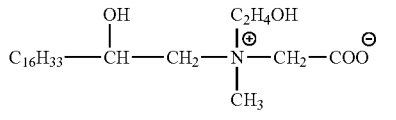
BC-16
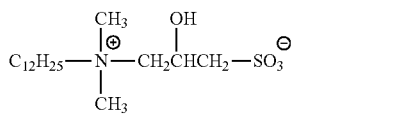
BS-1
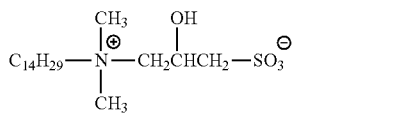
BS-2
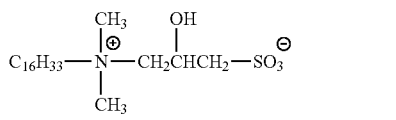
BS-3

-continued

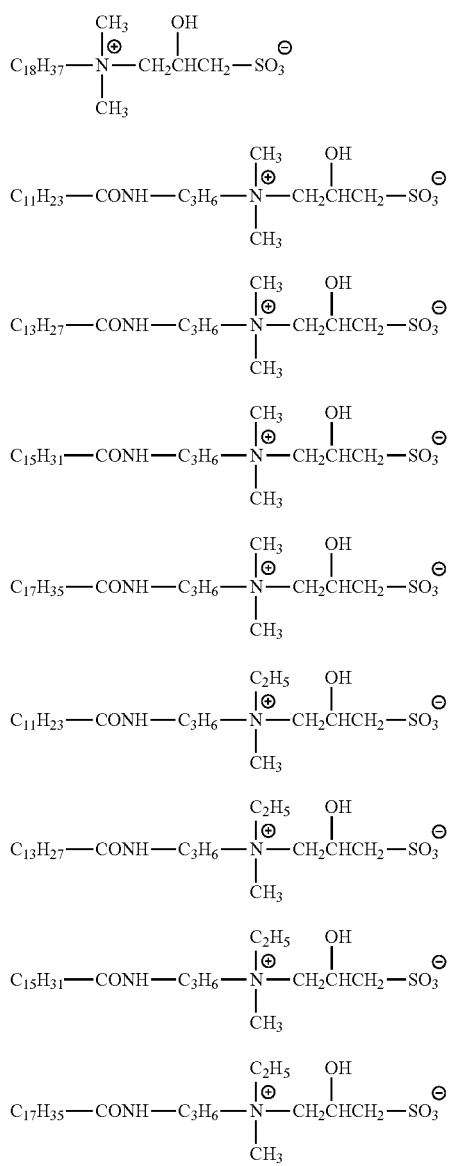

Among them, Component A is particularly preferably BO-5 to BO-7, BC-1, BC-2, BC-5 and BC-6.

Furthermore, Component A is commercially available as commercial products such as the 'AMPHITOL' series manufactured by Kao Corporation, the 'Softazoline' series manufactured by Kawaken Fine Chemicals Co., Ltd., the 'Paionine C' series manufactured by TAKEMOTO OIL & FAT Co., Ltd., or the 'Softamin' series, and the 'Ovazoline' series manufactured by TOHO CHEMICAL INDUSTRY Co., Ltd.

Component A preferably has a content in the developer of 0.5 to 20 mass %. When it is at least 0.5 mass %, the non-image area photosensitive layer has good developability, and when it is no greater than 20 mass %, the developed lithographic printing plate surface has acceptable stickiness.

Component A more preferably has a content in the developer of 1 to 15 mass %, and most preferably a content in the developer of 4 to 10 mass %.

With regard to Component A, one type thereof may be used on its own or two or more types may be used in combination.

(Component B) Water.

Component B is water.

The water referred to here denotes pure water, distilled water, ion-exchanged water, tap water, etc., and water of any hardness can be used.

The content of Component B in the developer is preferably at least 50 mass %. Furthermore, the content of Component B in the developer is preferably no greater than 99.5 mass %, and more preferably no greater than 99%.

(Organic Solvent)

In the present invention, the developer may comprise an organic solvent at less than 5 mass %.

The organic solvent in the developer referred to in the present invention is an organic compound, other than Component A, that is a liquid at normal temperature (20° C.) and is preferably a compound that solubilizes a developed and removed component. Furthermore, it is preferably soluble in water, which is a main component of the developer.

The developed and removed component may form a micelle with Component A in the developer so as to be solubilized or may be dissolved in the organic solvent. From the viewpoint of development speed and stability of the developed and removed component in the developer, it is more advantageous for the developer to contain an organic solvent, but in the case of one-bath processing it is disadvantageous in terms of staining during printing. It is surmised that this is due to the developed and removed component that has been dissolved by the organic solvent being precipitated when organic solvent of developer attached to the developed non-image area evaporates, and the developed and removed component becoming attached to the non-image area surface. Therefore, if there is no problem with developability, it is preferable for the content of the organic solvent to be smaller. It is essential for the content of the organic solvent to be less than 5 mass % since printing stains occur when it is contained at 5 mass % or greater; it is preferably no greater than 3 mass %, yet more preferably no greater than 1 mass %, and most preferably no greater than 0.1 mass %.

Organic solvent that can be used in the present invention preferably has a solubility in water at 20° C. of 1.5 to 7.0 g/100 mL. The solubility is more preferably 2.5 to 5.0 g/100 mL.

Specifically, organic solvent that can be used in the present invention is preferably a compound selected from the group consisting of 1-pentanol (2.7 g/100 mL), 2-pentanol (4.5 g/100 mL), 3-pentanol (5.2 g/100 mL), 2-methyl-1-butanol (3.0 g/100 mL), 3-methyl-1-butanol (2.7 g/100 mL), 3-methyl-2-butanol (5.6 g/100 mL), neopentyl alcohol (3.5 g/100 mL), 4-methyl-2-pentanol (2.0 g/100 mL), benzyl alcohol (4.0 g/100 mL), ethylene glycol monophenyl ether (2.7 g/100 mL), propylene glycol mono-n-butyl ether (4.4 g/100 mL), propyl acetate (1.6 g/100 mL), isopropyl acetate (4.3 g/100 mL), diethylene glycol monobutyl ether acetate (6.5 g/100 mL), diethyl ketone (1.7 g/100 mL), 2-pentanone (4.0 g/100 mL), and methyl isobutyl ketone (1.9 g/100 mL). These Organic solvent may be used singly or in a combination of two or more types.

Other components in the developer are described below.

The developer may comprise a surfactant (anionic, nonionic, cationic, amphoteric, etc.) other than the compound represented by Formula (I) and/or Formula (II) (Component A).

The anionic surfactant used in the present invention is not particularly limited, and a conventionally known anionic surfactant may be used. Examples of the anionic surfactant used in the present invention include a fatty acid salt, an abietic acid salt, a hydroxyalkanesulfonic acid salt, an alkanesulfonic acid salt, a dialkylsulfosuccinic acid salt, a straight-chain alkylbenzenesulfonic acid salt, a branched alkylbenzenesulfonic acid salt, an alkylnaphthalenesulfonic acid salt, an alkylphenoxypolyoxyethylene propylsulfonic acid salt, a polyoxyethylene alkylsulfophenyl ether salt, sodium N-methyl-N-oleyltaurine, a disodium N-alkylsulfosuccinic acid monoamide, a petroleum sulfonic acid salt, sulfated castor oil, sulfated beef tallow oil, a sulfate ester of a fatty acid alkyl ester, an alkylsulfate ester salt, a polyoxyethylene alkyl ether sulfate ester salt, a fatty acid monoglyceride sulfate ester salt, a polyoxyethylene alkyl phenyl ether sulfate ester salt, a polyoxyethylene styrylphenyl ether sulfate ester salt, an alkyl phosphate ester salt, a polyoxyethylene alkyl ether phosphate ester salt, a polyoxyethylene alkyl phenyl ether phosphate ester salt, a partially saponified styrene-maleic anhydride copolymer, a partially saponified olefin-maleic anhydride copolymer, a formaldehyde condensate of naphthalenesulfonic acid salt, an aromatic sulfonic acid salt, and an aromatic group-substituted polyoxyethylene sulfonic acid salt. Among them, a dialkylsulfosuccinic acid salt, an alkylsulfate ester salt, and/or an alkylnaphthalenesulfonic acid salt are particularly preferably used.

The cationic surfactant that can be used in the present invention is not particularly limited, and a conventionally known cationic surfactant may be used. Examples thereof include an alkylamine salt, a quaternary ammonium salt, a polyoxyethylene alkylamine salt, and a polyethylene polyamine derivative.

Examples of nonionic surfactant that can be used in the present invention include a polyethylene glycol type higher alcohol ethylene oxide adduct, an ethelene oxide adduct of phenol or naphtol, an alkylphenol ethylene oxide adduct, a fatty acid ethylene oxide adduct, a polyhydric alcohol fatty acid ester ethylene oxide adduct, a higher alkylamine ethylene oxide adduct, a fatty acid amide ethylene oxide adduct, an ethylene oxide adduct of an oil or fat, a polypropylene glycol ethylene oxide adduct, a dimethylsiloxane-ethylene oxide block copolymer, a dimethylsiloxane-(propylene oxide-ethylene oxide) block copolymer, a polyhydric alcohol type glycerol fatty acid ester, a pentaerythritol fatty acid ester, sorbitol and sorbitan fatty acid esters, a sucrose fatty acid ester, a polyhydric alcohol alkyl ether, and an alkanolamine fatty acid amide. Furthermore, an acetylene glycol- or acetylene alcohol-based oxyethylene adduct or a fluorine-based, silicone-based, etc. surfactant may also be used in the same manner.

With regard to these other surfactants, one type may be used on its own or two or more types may be used in combination.

The content of the other surfactant in the developer is preferably 0.01 to 10 mass %, and more preferably 0.01 to 5 mass %.

For the purpose of adjusting the pH and assisting dissolution of a non-image area of a photosensitive layer, an alkali agent may be added as an auxiliary agent. Examples of the alkali agent include a carbonate, a bicarbonate, and an organic alkali agent. The carbonate salt and the hydrogen carbonate salt are not particularly limited, but an alkali metal salt is preferable. As the alkali metal, lithium, sodium, and potassium can be cited, and sodium is particularly preferable. Examples of the organic alkali agent include monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine, pyridine, and tetramethylammonium hydroxide. These alkali agents may be used singly or in combination of two or more types.

The pH of the developer is not particularly limited but is preferably in the range of 6 to 8 from the viewpoint of environmental impact and, furthermore, from the viewpoint of work safety.

For the purpose of protecting of the surface of a non-image area after developing and removing of the photosensitive layer, the developer preferably contain a water-soluble polymer.

The water-soluble polymer that can be contained in the developer includes, for example, soybean polysaccharide, starch, gum Arabic, dextrin, a cellulose derivative (for example, carboxymethylcellulose, carboxyethylcellulose or methylcellulose) or a modified product thereof, pullulan, polyvinyl alcohol or a derivative thereof, polyvinylpyrrolidone, polyacrylamide, an acrylamide copolymer, a vinyl methyl ether/maleic anhydride copolymer, a vinyl acetate/maleic anhydride copolymer, and a styrene/maleic anhydride copolymer.

The water-soluble polymer compound preferably has an acid value of 0 to 3.0 meq/g.

Measurement of acid value may be carried out by titration using a standard automatic titrator with a 0.1 mol/L aqueous solution of sodium hydroxide (Wako Pure Chemical Industries, Ltd.).

As the soybean polysaccharide, those conventionally known may be used. For example, as a commercial product, Soyafibe (Fuji Oil Co., Ltd.) is available, and various product grades can be used. The soybean polysaccharide preferably used has a viscosity in the range of 10 to 100 mPa·sec. in a 10 mass % aqueous solution thereof.

Examples of the starch include sweet potato starch, potato starch, tapioca starch, wheat starch, and corn starch and, furthermore, modified starch and starch derivatives of the above.

Modified starches may be carried out by a method in which they are decomposed with an acid or an enzyme to the extent that the number of glucose residues per molecule is from 5 to 30 and then oxypropylene is added thereto in an alkali.

As starch derivatives, roasted starch such as British gum, enzymatically-modified dextrin such as enzyme dextrin and Schardinger dextrin, oxidized starch such as solubilized starch, pregelatinized starch such as modified pregelatinized starch and unmodified pregelatinized starch, esterified starch such as starch phosphate, fatty starch, starch sulfate, starch nitrate, starch xanthate, and starch carbamate, etherified starch such as a carboxyalkyl starch, a hydroxyalkyl starch, a sulfoalkyl starch, cyanoethyl starch, allyl starch, benzyl starch, carbamylethyl starch, and a dialkylamino starch, crosslinked starch such as methylol-crosslinked starch, hydroxyalkyl-crosslinked starch, phosphoric acid-crosslinked starch, and dicarboxylic acid-crosslinked starch, and starch graft polymers such as a starch-polyacrylamide copolymer, a starch-polyacrylic acid copolymer, a starch-polyvinyl acetate copolymer, a starch-polyacrylonitrile copolymer, a cationic starch-polyacrylic acid ester copolymer, a cationic starch-vinyl polymer copolymer, a starch-polystyrene-maleic acid copolymer, a starch-polyethylene oxide copolymer, and a starch-polypropylene copolymer are preferable.

Among the water-soluble polymers, soybean polysaccharide, starch, gum Arabic, dextrin, carboxymethylcellulose, or polyvinyl alcohol are preferable, and gum Arabic or starch are more preferable.

The water-soluble polymer may be used in combination of two or more types.

The content of the water-soluble polymer in the developer is preferably 0.1 to 20 mass %, and more preferably 0.5 to 10 mass %.

The developer may contain, in addition to the above-mentioned components, a wetting agent, a preservative, a chelating compound, an antifoaming agent, an organic acid, an inorganic acid, an inorganic salt, etc.

As the wetting agent, ethylene glycol, propylene glycol, triethylene glycol, butylene glycol, hexylene glycol, diethylene glycol, dipropylene glycol, glycerol, trimethylolpropane, diglycerol, etc. are suitably used. These wetting agents may be used singly or in a combination of two or more types. The wetting agent is preferably used in an amount of 0.1 to 5 mass % relative to the total weight of the developer.

As the preservative, for example, phenol or a derivative thereof, formalin, an imidazole derivative, sodium dehydroacetate, a 4-isothiazolin-3-one derivative, benzisothiazolin-3-one, 2-methyl-4-isothiazolin-3-one, a benzotriazole derivative, an amidine guanidine derivative, a quaternary ammonium salt, a pyridine derivative, a quinoline derivative, a guanidine derivative, diazine, a triazole derivative, oxazole, an oxazine derivative, or a nitrobromoalcohol such as 2-bromo-2-nitropropane-1,3-diol, 1,1-dibromo-1-nitro-2-ethanol, or 1,1-dibromo-1-nitro-2-propanol is preferably used. The preservatives may be used singly but it is preferable to use in combination at least two types of preservatives so as to exhibit efficacy toward various types of molds and bacteria.

The amount of preservative added is an amount that exhibits stable efficacy toward bacteria, molds, yeasts, etc., and depends on the type of bacterium, mold, or yeast, but is preferably in the range of 0.01 to 4 mass % relative to the total weight of the developer.

As the chelating compound, for example, ethylenediaminetetraacetic acid, the potassium salt thereof, or the sodium salt thereof; diethylenetriaminepentaacetic acid, the potassium salt thereof, or the sodium salt thereof; triethylenetetraminehexaacetic acid, the potassium salt thereof, or the sodium salt thereof; hydroxyethylethylenediaminetriacetic acid, the potassium salt thereof, or the sodium salt thereof; nitrilotriacetic acid or the sodium salt thereof; an organic phosphonic acid, for example, 1-hydroxyethane-1,1-diphosphonic acid, the potassium salt thereof, or the sodium salt thereof; or aminotri(methylenephosphonic acid), the potassium salt thereof, or the sodium salt thereof; or a phosphonoalkanetricarboxylic acid can be cited. An organic amine salt is also effective instead of the sodium salt or potassium salt of the chelating compounds.

As these chelating agents, those that are present stably in the developer and do not inhibit printing properties are selected. The amount thereof added is preferably 0.001 to 1.0 mass % relative to the total weight of the developer.

As the antifoaming agent, a normal silicone-based self emulsifying type, emulsifying type, nonionic, etc. compound having an HLB (Hydrophile-Lipophile Balance) of no greater than 5 may be used. Silicone antifoaming agents are preferable. Among them, any of an emulsifying dispersion type and a solubilizing type may be used.

The content of the antifoaming agent is preferably in the range of 0.001 to 1.0 mass % relative to the total weight of the developer.

Examples of the organic acid include citric acid, acetic acid, oxalic acid, malonic acid, salicylic acid, caprylic acid, tartaric acid, malic acid, lactic acid, levulinic acid, p-toluenesulfonic acid, xylenesulfonic acid, phytic acid, and an organic phosphonic acid. The organic acid may also be used in the form of an alkali metal salt or an ammonium salt.

The content of the organic acid is preferably 0.01 to 0.5 mass % relative to the total weight of the developer.

As the antifoaming agent, a normal silicone-based self emulsifying type, emulsifying type, nonionic, etc. compound having an HLB (Hydrophile-Lipophile Balance) of no greater than 5 may be used. Silicone antifoaming agents are preferable. Among them, any of an emulsifying dispersion type and a solubilizing type may be used.

The content of the antifoaming agent is preferably in the range of 0.001 to 1.0 mass % relative to the total weight of the developer.

Processing in the development step is not particularly limited, and development may be carried out by a known method, but it is preferably carried out using an automatic processor equipped with a rubbing member. Furthermore, the processing is more suitably carried out using an automatic processor equipped with supply means for the developer, etc. Examples of the automatic processor include an automatic processor described in JP-A-2006-235227, etc. in which a lithographic printing plate precursor after imagewisely recording is subjected to a rubbing treatment while being transported. Among them, an automatic processor using a rotating brush roller as the rubbing member is particularly preferable.

The preferable rotating brush roller that can be used in the present invention may be appropriately selected by taking account, for example, of the scratch resistance of the image area and the robustness of the support of the lithographic printing plate precursor.

As the rotating brush roller, a known rotating brush roller produced by implanting a brush material in a plastic or metal roller may be used. For example, a rotating brush roller described in JP-A-58-159533 and JP-A-3-100554, or a brush roller described in JU-B-62-167253 (JU-B denotes a Japanese examined utility model application publication), in which a metal or plastic groove-shaped member having a brush material implanted in rows therein is closely radially wrapped around a plastic or metal roller acting as a core, may be used. As the brush material, a plastic fiber (for example, a polyester-based synthetic fiber such as polyethylene terephthalate or polybutylene terephthalate; a polyamide-based synthetic fiber such as nylon 6.6 or nylon 6.10; a polyacrylic synthetic fiber such as polyacrylonitrile or a polyalkyl(meth) acrylate; or a polyolefin-based synthetic fiber such as polypropylene or polystyrene) may be used, for example, a brush material having a fiber bristle diameter of 20 to 400 μm and a bristle length of 5 to 30 mm may preferably be used.

Furthermore, the outer diameter of the rotating brush roller is preferably 30 to 200 mm, and the peripheral speed at the tip of the brush rubbing the plate surface is preferably 0.1 to 5 m/sec.

The direction of rotation of the rotating brush roller may be the same direction or the opposite direction with respect to the transport direction of the lithographic printing plate precursor, but when two or more rotating brush rollers are used in an automatic processor, it is preferable that at least one rotating brush roller rotates in the same direction and at least one rotating brush roller rotates in the opposite direction. By such an arrangement, the photosensitive layer in the non-image area can be more reliably removed. Furthermore, rocking the rotating brush roller in the rotational axis direction of the brush roller is also effective.

The developer that is used in the present invention may employ fresh liquid each time, but it is preferable to repeatedly use the developer after processing by circulating it through a filter.

As the filter for use in the invention, any filter may be used as long as it can filter the removed component of the image-recording layer mixed in a water washing unit. As a material of the filter, for example, a polyester resin, a polypropylene resin, a polyethylene resin a cellulose resin or cotton is preferably used. With respect to the configuration thereof, a structure in which a filter is held in the form of a cartridge in a housing as a replaceable filter is preferable. As the cartridge, a pleated type prepared by processing a filter paper made of a cellulose fiber with an epoxy resin in order to reinforce and prevent detachment of the fiber and casting in the form of pleats in order to increase a filtration area, a depth type prepared by winding up a yarn comprising many fibers (fiber bundle) from a central tube so as to form a gradual density gradient, or an adsorbing type prepared by housing an adsorbent in a case made of plastic, for example, polyethylene or prepared by supporting an adsorbent, for example, active carbon on media mainly composed of a resin, cellulose, a glass fiber and a water-absorbing polymer is preferably used. As the adsorbent, silica gel, active carbon, active aluminum, molecular sieve, clay and a material selected from superabsorbent fiber, calcium carbonate, calcium sulfate, potassium permanganate, sodium carbonate, potassium carbonate, sodium phosphate and active metal and ion exchanger used in various filters are used.

As a commercially available filter, a cartridge filter "TCW Type", "TCP Type" or "TCS Type" produced by Advantec Toyo Kaisha, Ltd. is preferably used.

A mesh diameter of the filter is preferably 5 to 500 μm, more preferably from 10 to 200 μm, yet more preferably 20 to 100 μm.

The process for making a lithographic printing plate of the present invention does not comprise a washing step or a gumming step before or after the development step.

The washing step and gumming step referred to here means one that is carried out after the development step in a standard three bath development system. As the washing step, use of any water such as usual tap water, well water, ion-exchanged water, or distilled water in order to suppress printing stains normally due to the developed and removed component becoming re-attached to the plate surface is known, and it is also known that water used in the washing step is always fresh water or water that is reused by circulating water that has been used in the washing step through the filter described above. In addition, the three bath development system referred to is a method in which the three processing steps of the development step, the washing step, and the gumming step are carried out in sequence; each processing step is carried out using a liquid processing solution in the respective tank (bath), that is, it is a development system comprising three bath processing steps having three types of processing baths.

As the gumming step (step of de-oleophilizing a non-image area by means of a gumming liquid), it is known that a non-image area is fully de-oleophilized usually by supplying a gumming liquid to the plate surface after the washing step. The de-oleophilization agent used in the gumming liquid is usually gum Arabic, and other than this various water-soluble polymer compounds (also called water-soluble resins) can be cited. Examples include dextrin, sterabic, Stractan, an alginate, a polyacrylate, hydroxyethyl cellulose, polyvinylpyrrolidone, polyacrylamide, methyl cellulose, hydroxypropyl cellulose, hydroxymethyl cellulose, a carboxyalkyl cellulose salt, a water-soluble polysaccharide extracted from soy pulp, pullulan or a pullulan derivative, and polyvinyl alcohol.

On the other hand, there is sometimes the problem that ink laydown is degraded due to the image area surface being de-oleophilized in the gumming step.

In the present invention, it has been found that even without carrying out the washing step and the gumming step, the developed and removed component does not become re-attached to the plate surface, and de-oleophilization of the non-image area is sufficient. Furthermore, due to these steps not being contained, it becomes possible to prevent ink laydown from being degraded due to the gumming step, and the effect in reducing the amount of water or chemical used is also large. The process for making a lithographic printing plate of the present invention does not carry out a washing step or a gumming step before or after the development step, and the only processing step is the step of development by means of the developer, that is, it is essential for it to be carried out using one processing bath (also called single bath processing).

In the present invention, it is optionally possible to comprise a drying step after the development step. Particularly, the drying step is preferably comprised as the last step at an automatic processor.

The drying step is preferably carried out by blowing dry wind of appropriate temperature after removing most of the developer by a roller nip.

(Exposure Step)

The process for making a lithographic printing plate of the present invention comprises a step of imagewisely exposing the negative-working lithographic printing plate precursor (exposure step).

The exposure step is carried out prior to the development step. In the exposure step, the negative-working lithographic printing plate precursor obtained in the precursor production step is preferably exposed through a transparent original image having a line image, a halftone image, etc. or is preferably imagewisely exposed by means of laser light scanning, etc. based on digital data.

The 'image' referred to in the present invention is a concept that includes an image in the narrow sense, such as graphics or pictorial photographs, as well as characters, numerals, symbols, etc., and also includes one in which the above are mixed.

Preferred examples of a light source preferable for the image exposure include a carbon arc lamp, a mercury lamp, a xenon lamp, a metal halide lamp, a strobe, a light-emitting diode (LED) or a laser beam. The laser beam is particularly preferable and includes a solid laser or semiconductor laser emitting an infrared ray having a wavelength of 760 to 1,200 nm, an ultraviolet semiconductor laser emitting light having a wavelength of 250 to 420 nm and an argon ion laser or an FD-YAG laser emitting visible light. Among them, from the standpoint of simplification of the plate making, a laser emitting an infrared ray which enables the work under a white lamp or a yellow lamp is preferable.

With regard to the infrared laser, the output is preferably 100 mW or more, the exposure time per pixel is preferably within 20 microseconds, and the irradiation energy is preferably 10 to 300 mJ/cm$^2$. In order to shorten the exposure time, it is preferred to use a multibeam laser device.

(Precursor Production Step)

The process for making a lithographic printing plate of the present invention comprises a step of producing a negative-working lithographic printing plate precursor comprising, above a support, a photopolymerizable photosensitive layer (also called simply a 'photosensitive layer') (precursor production step).

Constituent elements and components of the lithographic printing plate precursor that can be used in the present invention are explained below.

<Lithographic Printing Plate Precursor>

The lithographic printing plate precursor used in the present invention has an ability to form a negative-working image in which an image area is formed from a region that has been imagewisely exposed and cured and a non-image area is formed by removing an unexposed portion by processing as described above. In the present invention, 'comprising a photosensitive layer above a support' means both a case in which a photosensitive layer is directly provided on a support and a case in which another layer is provided between a photosensitive layer and a support, and does not exclude the presence of any layer that is provided in the lithographic printing plate precursor as desired such as a protective layer, an undercoat layer, an intermediate layer, or a back coat layer.

Photosensitive Layer

It is essential for the photopolymerizable photosensitive layer of the lithographic printing plate precursor used in the present invention to comprise an acrylic polymer having a vinylcarbazole compound-derived monomer unit (hereinafter, also called a specific acrylic polymer) and/or a urethane-acrylic hybrid polymer. Due to it comprising these, a process for making a lithographic printing plate that is good in terms of sensitivity, printing durability, and development sludge and has excellent resistance to printing stains can be obtained. In addition, it may only comprise either the specific acrylic polymer or the urethane-acrylic hybrid polymer or may comprise both the specific acrylic polymer and the urethane-acrylic hybrid polymer; although there are no particular limitations, it is preferable for it to comprise at least the specific acrylic polymer, and it is more preferable for it to comprise the specific acrylic polymer and the urethane-acrylic hybrid polymer.

As this representative image formation mechanism, an embodiment comprising (Component a) a sensitizing dye, (Component b) a polymerization initiator, and (Component c) a polymerizable compound and an exposed region is polymerized and cured to thus form an image area can be preferably cited. That is, the photosensitive layer preferably comprises (Component a) a sensitizing dye, (Component b) a polymerization initiator, and (Component c) a polymerizable compound.

Furthermore, it is preferable that the photosensitive layer is a photosensitive layer that is sensitive to infrared light.

Moreover, it is more preferable that the photosensitive layer is sensitive to infrared light and comprises a triphenylalkylborate salt and/or a tetraphenylborate salt, and it is yet more preferable that it further comprises a copper phthalocyanine pigment.

Furthermore, it is also preferable that the photosensitive layer is sensitive to infrared light and does not contain a borate salt but contains a coloring dye.

These photosensitive layers that are sensitive to infrared light particularly preferably comprise a cyanine dye and an iodonium salt.

Each component contained in the photosensitive layer is explained in sequence.

Vinylcarbazole Compound-Derived Monomer Unit-Containing Acrylic Polymer

The photosensitive layer of the present invention comprises one or more types of vinylcarbazole compound-derived monomer unit-containing acrylic polymer (specific acrylic polymer) and/or urethane-acrylic hybrid polymer.

As long as the specific acrylic polymer comprises a vinylcarbazole (N-vinylcarbazole)-derived monomer unit, the remaining repeating units may be derived from any monomer. It is preferably a monomer unit used for an acrylic polymer, which is explained in detail in the section of (Component d) other binder polymers.

Specifically, one comprising a constituent repeating unit derived from one or more types of (meth)acrylic acid, (meth)acrylic acid ester ((meth)acrylate), acrylonitrile, styrene and a styrene derivative, and poly(alkylene glycol)(meth)acrylate is more preferable, and among them a polymer further comprising an acrylonitrile-derived monomer unit is particularly preferable. Furthermore, the polymer is preferably an acrylic polymer (also called an 'acrylic resin'). Here, the acrylic polymer referred to is a polymer formed by homopolymerization or copolymerization of a (meth)acrylate compound.

The content of the vinylcarbazole-derived monomer unit in the specific acrylic polymer is preferably 2 to 50 mole % of the total monomer units, more preferably 5 to 30 mole %, and yet more preferably 8 to 15 mole %.

The weight-average molecular weight of the specific acrylic polymer that can be used in the present invention is preferably 2,000 to 1,000,000, and more preferably 10,000 to 200,000. The acid value (mgKOH/g) of the specific acrylic polymer when determined by a known method is preferably 20 to 400.

The content of the specific acrylic polymer is preferably 10 to 70 mass % relative to the total solids content of the photosensitive layer, and more preferably 20 to 50 mass %.

Urethane-Acrylic Hybrid Polymer

Furthermore, the photosensitive layer preferably comprises a urethane-acrylic hybrid polymer (also called simply a 'hybrid polymer') that is uniformly dispersed in the layer. This hybrid polymer is more preferably in the form of particles. This hybrid polymer has a weight-average molecular weight of 50,000 to 500,000 and has an average particle size of the particles of 10 to 10,000 nm, preferably 30 to 500 nm, and more preferably 30 to 150 nm.

These hybrid polymers may be aromatic or aliphatic depending on the structure of a starting material used in production. Two or more types of urethane-acrylic hybrid polymer particles may be used as a mixture. For example, a Hybridur 570 polymer dispersion and a Hybridur 870 polymer dispersion (both from Air Products and Chemicals Inc.) may be used by mixing.

The urethane-acrylic hybrid polymer that can be used in the present invention may usually be produced as follows. First, a polyol and an excess amount of a diisocyanate are reacted, thus giving a polyurethane prepolymer dispersed in water. The prepolymer preferably has a carboxy group. Subsequently, the prepolymer is mixed with at least one vinyl monomer such as an acrylate monomer or a substituted/unsubstituted styrene monomer and further with a tertiary amine, and this mixture is dispersed in water. By initiating polymerization by adding an oil-soluble initiator to this aqueous dispersion, a hybrid polymer that is dispersed in water as colloidal particles can be obtained. This dispersion is not a simple mixture of a polyurethane dispersion and an acrylic emulsion but a product in which polymerization of a urethane and polymerization of an acrylic component have occurred at the same time and have completed. The urethane-acrylic hybrid polymer particles are preferably dispersion-stabilized by a negative charge.

Furthermore, as described in the specification of U.S. Pat. No. 3,684,758, a method in which a polyurethane dispersion is first produced and an acrylic monomer is then added thereto to thus form an acrylic polymer in the presence of the polyurethane dispersion is also a useful method for obtaining a urethane-acrylic hybrid polymer dispersion.

As an alternative method, a method in which a urethane prepolymer and an acrylic monomer are dispersed together in water and a urethane polycondensation reaction and an acrylic polymerization reaction are made to progress at the same time is also described in for example the specifications of U.S. Pat. No. 4,644,030 and U.S. Pat. No. 5,173,526.

Details of the other production method and physical properties of the urethane-acrylic hybrid polymer are described by Galgoci et al. in JCT Coatings Tech., 2 (13), 28 to 36 (February, 2005).

With regard to the urethane-acrylic hybrid polymer that can be used in the present invention, the diisocyanate compound used as a starting material for the urethane is particularly preferably diphenylmethane diisocyanate, m-tolylene diisocyanate, isophorone diisocyanate, or dicyclohexylmethane diisocyanate. That is, the urethane-acrylic hybrid polymer particularly preferably has a monomer unit derived from a compound selected from the group consisting of diphenylmethane diisocyanate, m-tolylene diisocyanate, isophorone diisocyanate, and dicyclohexylmethane diisocyanate.

The urethane-acrylic hybrid polymer that is preferably used in the present invention may be a commercial product that is a dispersion of urethane-acrylic hybrid polymer particles, such as Hybridur 540, 560, 570, 580, 870, 878, or 880 available from Air Products and Chemicals, Inc. (Allentown, Pa.). These dispersions generally comprise urethane-acrylic hybrid polymer particles at a solids content of at least 30 mass %, and are dispersed in an appropriate aqueous medium, which may comprise a commercially available surfactant, antifoaming agent, dispersant, or preservative and, furthermore, a pigment or a water-dispersible organic solvent as additional components.

The urethane-acrylic hybrid polymer is preferably contained at 10 to 70 mass % relative to the total solids content of the photosensitive layer, and more preferably at 10 to 50 mass %.

(Component a) Sensitizing Dye

The photosensitive layer preferably comprises (Component a) a sensitizing dye. The sensitizing dye may be used without particular limitations as long as it absorbs light when imagewise exposed to attain an excited state, provides energy to a polymerization initiator, which is described later, by way of electron transfer, energy transfer, or generation of heat, and improves the polymerization-initiating function. A sensitizing dye having an absorption maximum at 300 to 450 nm or 750 to 1,400 nm is particularly preferably used.

Examples of the sensitizing dye having a maximum absorption in the wavelength region of 350 to 450 nm include a merocyanine dye, a benzopyran, a coumarin, an aromatic ketone, an anthracene, a styryl, and an oxazole.

Among sensitizing dyes having an absorption maximum in the wavelength region of 350 to 450 nm, from the viewpoint of high sensitivity a dye represented by Formula (IV) below is preferable.

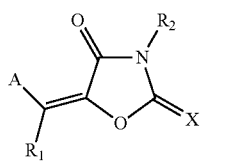
(IV)

Wherein Formula (IV), A denotes an optionally substituted aryl group or heteroaryl group, X denotes an oxygen atom, a sulfur atom, or N—(R$_3$). R$_1$, R$_2$, and R$_3$ independently denote a monovalent non-metallic atomic group, and A and R$_1$, and R$_2$ and R$_3$ may be bonded to each other to form an aliphatic or aromatic ring.

Formula (IV) is explained in further detail. R$_1$, R$_2$, and R$_3$ in Formula (IV) are independently a monovalent non-metallic atomic group, and preferably a hydrogen atom, a substituted or unsubstituted alkyl group, a substituted or unsubstituted alkenyl group, a substituted or unsubstituted aryl group, a substituted or unsubstituted heteroaryl group residue, a substituted or unsubstituted alkoxy group, a substituted or unsubstituted alkylthio group, a hydroxyl group, or a halogen atom.

A in Formula (IV) is now explained. A denotes an optionally substituted aryl group or heteroaryl group, and specific examples of the optionally substituted aryl group or heteroaryl group include the same examples as those described for R$_1$, R$_2$, and R$_3$ of Formula (IV).

Specific examples of the sensitizing dye include those described in paragraph Nos. 0047 to 0053 of JP-A-2007-58170, paragraph Nos. 0036 to 0037 of JP-A-2007-93866, and paragraph Nos. 0042 to 0047 of JP-A-2007-72816.

Furthermore, those described in JP-A-2006-189604, JP-A-2007-171406, JP-A-2007-206216, JP-A-2007-206217, JP-A-2007-225701, JP-A-2007-225702, JP-A-2007-316582, and JP-A-2007-328243 are also used preferably.

The sensitizing dye having an absorption maximum at 750 to 1,400 nm suitably used in the present invention (hereinafter, also called an 'infrared absorbing agent') is now explained in detail. As the infrared absorbing agent, a dye or a pigment is preferably used.

As the dye, commercial dyes and known dyes described in the literature such as 'Senryo Binran' (Dye Handbook) (Ed. The Society of Synthetic Organic Chemistry, Japan, 1970), etc. may be used. Specific examples thereof include an azo dye, a metal complex salt azo dye, a pyrazolone azo dye, a naphthoquinone dye, an anthraquinone dye, a phthalocyanine dye, a carbonium dye, a quinoneimine dye, a methine dye, a cyanine dye, a squarylium dye, a pyrylium salt, and a metal thiolate complex.

Among these dyes, a cyanine dye, a squarylium dye, a pyrylium salt, a nickel thiolate complex, and an indolenine cyanine dye are preferable, a cyanine dye and an indolenine cyanine dye are more preferable, and a cyanine dye represented by Formula (a) below is particularly preferable.

Formula (a)

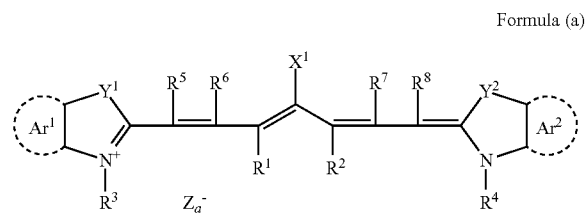

In Formula (a), X$^1$ denotes a hydrogen atom, a halogen atom, —NPh$_2$, X$^2$-L$^1$, or the group shown below. Here, Ph denotes a phenyl group, X$^2$ denotes an oxygen atom, a nitrogen atom, or a sulfur atom, L$^1$ denotes a hydrocarbon group having 1 to 12 carbon atoms, a hetero atom (N, S, O, a halogen atom, or Se)-containing aryl group, or a hetero atom-containing hydrocarbon group having 1 to 12 carbon atoms. X$_a^-$ is defined in the same manner as for Z$_a^-$, which is described later, and R$^a$ denotes a hydrogen atom or a substituent selected from the group consisting of an alkyl group, an aryl group, a substituted or unsubstituted amino group, and a halogen atom.

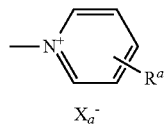

R[1] and R[2] independently denote a hydrocarbon group having 1 to 12 carbon atoms. From the viewpoint of storage stability of a photosensitive layer coating liquid, R[1] and R[2] are independently preferably hydrocarbon groups having two or more carbon atoms. R[1] and R[2] may be bonded each other to form a ring, and when forming a ring, it is particularly preferable to form a 5-membered ring or a 6-membered ring.

Ar[1] and Ar[2] may be identical to or different from each other, and denote an optionally substituted aryl group. Preferred examples of the aryl group include a benzene ring and a naphthalene ring. Preferred examples of the substituent include a hydrocarbon group having no greater than 12 carbon atoms, a halogen atom, and an alkoxy group having no greater than 12 carbon atoms. Y[1] and Y[2] may be identical to or different from each other, and denote a sulfur atom or a dialkylmethylene group having no greater than 12 carbon atoms. R[3] and R[4] may be identical to or different from each other, and denote an optionally substituted hydrocarbon group having no greater than 20 carbon atoms. Preferred examples of the substituent include an alkoxy group having no greater than 12 carbon atoms, a carboxy group, and a sulfo group.

R[5], R[6], R[7], and R[8] may be identical to or different from each other, and denote a hydrogen atom or a hydrocarbon group having no greater than 12 carbon atoms. From the availability of starting materials, a hydrogen atom is preferable. Furthermore, $Z_a^-$ denotes a counteranion. When a cyanine dye represented by Formula (a) has an anionic substituent in its structure and neutralization of charge is unnecessary, $Z_a^-$ is not required. From the viewpoint of storage stability of the photosensitive layer coating liquid, $Z_a^-$ is preferably a halogen ion, a perchlorate ion, a tetrafluoroborate ion, a hexafluorophosphate ion, or a sulfonate ion, and particularly preferably a perchlorate ion, a hexafluorophosphate ion, or an arylsulfonate ion.

Specific examples of the cyanine dye represented by Formula (a) preferably include compounds described in paragraph Nos. 0017 to 0019 of JP-A-2001-133969, compounds described in paragraph Nos. 0016 to 0021 of JP-A-2002-023360 and compounds described in paragraph Nos. 0012 to 0037 of JP-A-2002-040638, more preferably include compounds described in paragraph Nos. 0034 to 0041 of JP-A-2002-278057 and compounds described in paragraph Nos. 0080 to 0086 of JP-A-2008-195018, and most preferably include compounds described in paragraph Nos. 0035 to 0043 of JP-A-2007-90850.

Furthermore, compounds described in paragraph Nos. 0008 to 0009 of JP-A-5-5005 and compounds described in paragraph Nos. 0022 to 0025 of JP-A-2001-222101 are also used preferably.

In the present invention, it is preferable to use a water-soluble cyanine dye as a sensitizing dye.

Examples of the water-soluble cyanine dye include those described in JP-A-2004-351823, and those having as a hydrophilic group in the molecule at least one group selected from the group consisting of a sulfonic acid group and/or a salt thereof, a phosphonic acid group and/or a salt thereof, a carboxylic acid group and/or a salt thereof, and a hydroxy group are preferable.

Among them, one having in the molecule at least two from a sulfonic acid group and/or a salt thereof and a phosphonic acid group and/or a salt thereof and having as a counterion an inorganic ion is yet more preferable.

In the present invention, a mode in which the sensitizing dye comprises a cyanine colorant and, furthermore, comprises an iodonium salt is preferable. Such a constitution enables the sensitivity and printing durability to be improved.

With regard to such infrared absorbing dyes, only one type may be used or two or more types may be used in combination, and an infrared absorbing agent other than an infrared absorbing dye, such as a pigment, may be used in combination. As the pigment, compounds described in paragraph Nos. 0072 to 0076 of JP-A-2008-195018 are preferable.

As a pigment, commercial pigments and pigments described in 'Karaa Indekkusu' (C. I.) Binran (Handbook), 'Saishin Ganryo Binran' (Latest Pigments Handbook) (Ed. Nippon Ganryo Gijutsu Kyokai, 1977), 'Saishin Ganryo Ouyo Gijutsu' (Latest Pigment Application Techniques' (CMC Publishing, 1986), and 'Insatsu Inki Gijutsu' (Printing Ink Techniques) (CMC Publishing, 1984) may be used.

Examples of the type of pigment include a black pigment, a yellow pigment, an orange pigment, a brown pigment, a red pigment, a purple pigment, a blue pigment, a green pigment, a fluorescent pigment, a metal powder pigment and, in addition, polymer-binding dyes. Specifically, an insoluble azo pigment, an azo lake pigment, a condensed azo pigment, a chelate azo pigment, a phthalocyanine type pigment, an anthraquinone type pigment, perylene and perinone type pigments, a thioindigo type pigment, a quinacridone type pigment, a dioxazine type pigment, an isoindolinone type pigment, a quinophthalone type pigment, a dye lake pigment, an azine pigment, a nitroso pigment, a nitro pigment, a natural pigment, a fluorescent pigment, an inorganic pigment, carbon black, etc. may be used. Among these pigments, carbon black is preferable.

These pigments may be used with or without a surface treatment being carried out. As a method for the surface treatment, a method in which the surface is coated with a resin or wax, a method in which a surfactant is deposited, a method in which a reactive material (e.g. a silane coupling agent, an epoxy compound, a polyisocyanate, etc.) is bonded to the pigment surface, etc. can be considered. The above-mentioned surface treatment methods are described in 'Kinzoku Sekken no Seishitsu to Ouyo' (Properties and Applications of Metal Soaps) (SAIWAISHOBO), 'Insatsu Inki Gijutsu' (Printing Ink Techniques) (CMC Publishing, 1984), and 'Saishin Ganryo Ouyo Gijutsu' (Latest Pigment Application Techniques) (CMC Publishing, 1986).

The particle size of the pigment is preferably in the range of 0.01 μm to 10 μm, more preferably in the range of 0.05 μm to 1 μm, and particularly preferably in the range of 0.1 μm to 1 μm. When in above-mentioned range, the dispersion stability of the pigment in the photosensitive layer is excellent and a uniform photosensitive layer can be obtained.

As a method for dispersing the pigment, a known dispersion technique used for ink production, toner production, etc. may be used. Examples of a dispersion machine include an ultrasonic disperser, a sand mill, an attritor, a pearl mill, a super mill, a ball mill, an impeller, a disperser, a KD mill, a colloidal mill, a dynatron, a three roll mill, and a pressure kneader. Details are described in 'Saishin Ganryo Ouyo Gijutsu' (Latest Pigment Application Techniques) (CMC Publishing, 1986).

The amount of sensitizing dye added is preferably 0.05 to 30 parts by weight relative to 100 parts by weight of the total solids content of the photosensitive layer, more preferably 0.1 to 20 parts by weight, and yet more preferably 0.2 to 10 parts by weight.

The sensitizing dye may be added to the same layer as other components or may be added to another layer provided separately.

(Component b) Polymerization Initiator

The photosensitive layer in the present invention preferably contains a polymerization initiator (hereinafter, also called an 'initiator compound'). In the present invention, a radical polymerization initiator is preferably used.

As the initiator compound in the present invention, a compound known to a person skilled in the art may be used without any restrictions, and specific examples thereof include a trihalomethyl compound, a carbonyl compound, an organic peroxide, an azo type compound, an azide compound, a metallocene compound, a hexaarylbiimidazole compound, an organic boron compound, a disulfone compound, an oxime ester compound, an onium salt compound, and an iron arene complex. Among them, it is preferably at least one type selected from the group consisting of a hexaarylbiimidazole-based compound, an onium salt, a trihalomethyl compound, and a metallocene compound, and it is particularly preferably a hexaarylbiimidazole-based compound and an onium salt. The polymerization initiator may be used in combination of two or more types as appropriate.

As the hexaarylbiimidazole compound, there can be cited lophine dimers described in EP 0,024,629 B1, EP 0,107,792 B1, or U.S. Pat. No. 4,410,621 B, and examples thereof include 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluoromethylphenyl)-4,4',5,5'-tetraphenylbiimidazole.

The hexaarylbiimidazole-based compound is particularly preferably used in combination with a sensitizing dye having a maximum absorption at 350 to 450 nm.

Examples of the onium salt (functioning as an ionic polymerization initiator in the present invention, not as an acid generator) preferably used in the present invention include a sulfonium salt, an iodinium salt, and a diazonium salt represented by Formulae (RI-I) to (RI-III) below. A diaryl iodonium salt or a triaryl sulfonium salt is particularly preferably used. An onium salt is particularly preferably used in combination with an infrared absorbing agent having an absorption maximum at 750 to 1,400 nm.

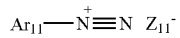

(RI-I)

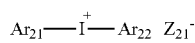

(RI-II)

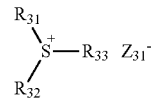

(RI-III)

In Formula (RI-I), $Ar_{11}$ denotes an aryl group that has not more than 20 carbons and that may have 1 to 6 substituents. Preferable examples of the substituent include an alkyl group having 1 to 12 carbons, an alkenyl group having 2 to 12 carbons, an alkynyl group having 2 to 12 carbons, an aryl group having 6 to 12 carbons, an alkoxy group having 1 to 12 carbons, an aryloxy group having 6 to 12 carbons, a halogen atom, an alkylamino group having 1 to 12 carbons, a dialkylamino group having 2 to 12 carbons, an alkylamide group or arylamide group having 1 to 12 carbons, a carbonyl group, a carboxy group, a cyano group, a sulfonyl group, a thioalkyl group having 1 to 12 carbons, and a thioaryl group having 6 to 12 carbons.

$Z_{11}^-$ denotes a monovalent anion, and specific examples of the monovalent anion include a halide ion, a perchlorate ion, a hexafluorophosphate ion, a tetrafluoroborate ion, a triphenylalkyl borate ion, a tetraphenyl borate ion, a sulfonate ion, a sulfinate ion, a thiosulfonate ion, or a sulfate ion. Among them, a perchlorate ion, a hexafluorophosphate ion, a tetrafluoroborate ion, a sulfonate ion, and a sulfinate ion are preferable from the viewpoint of stability, and a triphenylalkyl borate ion and a tetraphenyl borate ion are preferable from the viewpoint of high sensitivity.

In Formula (RI-II), $Ar_{21}$ and $Ar_{22}$ independently denote an aryl group that has not more than 20 carbons and that may have 1 to 6 substituents. Preferable examples of the substituent include an alkyl group having 1 to 12 carbons, an alkenyl group having 2 to 12 carbons, an alkynyl group having 2 to 12 carbons, an aryl group having 6 to 12 carbons, an alkoxy group having 1 to 12 carbons, an aryloxy group having 6 to 12 carbons, a halogen atom, an alkylamino group having 1 to 12 carbons, a dialkylamino group having 2 to 12 carbons, an alkylamide group or arylamide group having 1 to 12 carbons, a carbonyl group, a carboxy group, a cyano group, a sulfonyl group, a thioalkyl group having 1 to 12 carbons, or a thioaryl group having 6 to 12 carbons.

$Z_{21}^-$ denotes a monovalent anion. Specific examples include a halide ion, a perchlorate ion, a hexafluorophosphate ion, a tetrafluoroborate ion, a sulfonate ion, a sulfinate ion, a thiosulfonate ion, a sulfate ion, and a carboxylate ion. Among them, a perchlorate ion, a hexafluorophosphate ion, a tetrafluoroborate ion, a triphenylalkyl borate ion, a tetraphenyl borate ion, a sulfonate ion, a sulfinate ion, and a carboxylate ion are preferable from the viewpoint of stability and reactivity, and a triphenylalkyl borate ion and a tetraphenyl borate ion are particularly preferable from the viewpoint of high sensitivity.

In Formula (RI-III), $R_{31}$, $R_{32}$, and $R_{33}$ independently denote an aryl group that may have 1 to 6 substituents, an alkyl group, an alkenyl group, or an alkynyl group having not more than 20 carbons. Among them, the aryl group is preferable from the viewpoint of reactivity and stability. Examples of the substituent include an alkyl group having 1 to 12 carbons, an alkenyl group having 2 to 12 carbons, an alkynyl group having 2 to 12 carbons, an aryl group having 6 to 12 carbons, an alkoxy group having 1 to 12 carbons, an aryloxy group having 6 to 12 carbons, a halogen atom, an alkylamino group having 1 to 12 carbons, a dialkylamino group having 2 to 12 carbons, an alkylamide group or arylamide group having 1 to 12 carbons, a carbonyl group, a carboxy group, a cyano group, a sulfonyl group, a thioalkyl group having 1 to 12 carbons, and a thioaryl group having 6 to 12 carbons.

$Z_{31}^-$ denotes a monovalent anion. Specific examples of the monovalent anion include a halide ion, a perchlorate ion, a hexafluorophosphate ion, a tetrafluoroborate ion, a sulfonate ion, a sulfinate ion, a thiosulfonate ion, a sulfate ion, and a carboxylate ion. Among them, a perchlorate ion, a hexafluorophosphate ion, a tetrafluoroborate ion, a triphenylalkyl borate ion, a tetraphenyl borate ion, a sulfonate ion, a sulfinate ion, and a carboxylate ion are preferable from the viewpoint of stability and reactivity, and a triphenylalkyl borate ion and a tetraphenyl borate ion are particularly preferable from the viewpoint of high sensitivity.

Carboxylate ions described in JP-A-2001-343742 and JP-A-2002-148790 are also preferably used.

The onium salt is particularly preferably used in combination with an infrared absorber having a maximum absorption at 750 to 1,400 nm.

As other polymerization initiators, polymerization initiators described in JP-A-2007-171406, JP-A-2007-206216, JP-A-2007-206217, JP-A-2007-225701, JP-A-2007-225702, JP-A-2007-316582, and JP-A-2007-328243 may preferably be used.

The polymerization initiator in the present invention may be preferably used singly or in combination of two or more types.

In particular, in the present invention, it is preferable for the photopolymerizable photosensitive layer to be sensitive to infrared light and to comprise a triphenylalkyl borate salt and/or a tetraphenyl borate salt, and it is more preferable for it to comprise a triphenylalkyl borate salt or a tetraphenyl borate salt. In such a mode, the sensitivity and printing durability improve.

The content of the polymerization initiator used in the photosensitive layer in the present invention is preferably 0.01 to 20 mass % relative to the total weight of the solids content of the photosensitive layer, more preferably 0.1 to 15 mass %, and yet more preferably 1.0 to 10 mass %.

(Component c) Polymerizable Compound

The photosensitive layer preferably comprises (Component c) a polymerizable compound.

The polymerizable compound (Component c) that can be used in the present invention is an addition-polymerizable compound comprising at least one ethylenically unsaturated bond; a compound having at least one terminal ethylenically unsaturated bond is preferable, and a compound having two or more thereof is more preferable. As the polyfunctional ethylenically unsaturated compound, compounds having 2 to 20 terminal ethylenically unsaturated groups are preferable. These compound groups are widely known in the present industrial field, and, in the present invention, these may be used without particular limitation. These have chemical forms such as a monomer, a prepolymer, that is, a dimer, a trimer and an oligomer, or copolymers of monomers, and mixtures thereof.

Examples of the monomer include unsaturated carboxylic acids (such as acrylic acid, methacrylic acid, itaconic acid, crotonic acid, isocrotonic acid and maleic acid), and esters and amides thereof. Preferably esters of an unsaturated carboxylic acid and an aliphatic polyhydric alcoholic compound, or amides of an unsaturated carboxylic acid and an aliphatic polyvalent amine compound are used. Moreover, addition reaction products of unsaturated carboxylic acid esters or amides having a nucleophilic substituent such as a hydroxyl group, an amino group, or a mercapto group with monofunctional or polyfunctional isocyanates or epoxides, and dehydrating condensation reaction products with a polyfunctional carboxylic acid, etc. are also used preferably. Moreover, addition reaction products of unsaturated carboxylic acid esters or amides having an electrophilic substituent such as an isocyanato group or an epoxy group with monofunctional or polyfunctional alcohols, amines, or thiols, and substitution reaction products of unsaturated carboxylic acid esters or amides having a leaving group such as a halogeno group or a tosyloxy group with monofunctional or polyfunctional alcohols, amines, or thiols are also preferable. Moreover, as another example, the use of compounds obtained by replacing the unsaturated carboxylic acid with an unsaturated phosphonic acid, styrene, a vinyl ether or the like is also possible.

These are described in references such as JP-W-2006-508380 (JP-W denotes Japanese translation of a PCT international application), JP-A-2002-287344, JP-A-2008-256850, JP-A-2001-342222, JP-A-9-179296, JP-A-9-179297, JP-A-9-179298, JP-A-2004-294935, JP-A-2006-243493, JP-A-2002-275129, JP-A-2003-64130, JP-A-2003-280187, and JP-A-10-333321.

Specific examples of ester monomers comprising an ester of a polyhydric alcohol compound and an unsaturated carboxylic acid include acrylic acid esters such as ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate, ethylene oxide (EO)-modified isocyanurate triacrylate, and a polyester acrylate oligomer.

Examples of methacrylic acid esters include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy)phenyl]dimethylmethane, and bis[p-(methacryloxyethoxy)phenyl]dimethylmethane.

Examples of itaconic acid esters include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate.

Examples of crotonic acid esters include ethylene glycol dicrotonate, tetramethylene glycol dicrotonate, pentaerythritol dicrotonate, and sorbitol tetradicrotonate.

Examples of isocrotonic acid esters include ethylene glycol diisocrotonate, pentaerythritol diisocrotonate, and sorbitol tetraisocrotonate.

Examples of maleic acid esters include ethylene glycol dimaleate, triethylene glycol dimaleate, pentaerythritol dimaleate, and sorbitol tetramaleate.

As examples of other esters, aliphatic alcohol-based esters described in JP-B-46-27926, JP-B-51-47334 and JP-A-57-196231, those having an aromatic skeleton described in JP-A-

59-5240, JP-A-59-5241, and JP-A-2-226149, those having an amino group described in JP-A-1-165613, etc. may also be used preferably.

The above-mentioned ester monomers may be used as a mixture of two or more types.

Furthermore, specific examples of amide monomers including an amide of an aliphatic polyamine compound and an unsaturated carboxylic acid include methylenebisacrylamide, methylenebismethacrylamide, 1,6-hexamethylenebisacrylamide, 1,6-hexamethylenebismethacrylamide, diethylenetriaminetrisacrylamide, xylylenebisacrylamide, and xylylenebismethacrylamide.

Preferred examples of other amide-based monomers include those having a cyclohexylene structure described in JP-B-54-21726.

Furthermore, a urethane-based addition-polymerizable compound produced by an addition reaction of an isocyanate and a hydroxy group is also suitable, and specific examples thereof include a vinylurethane compound comprising two or more polymerizable vinyl groups per molecule in which a hydroxy group-containing vinyl monomer represented by Formula (ii) below is added to a polyisocyanate compound having two or more isocyanate groups per molecule described in JP-B-48-41708.

$$CH_2=C(R^4)COOCH_2CH(R^5)OH \quad (ii)$$

($R^4$ and $R^5$ independently denote H or $CH_3$.)

Furthermore, urethane acrylates described in JP-A-51-37193, JP-B-2-32293, JP-B-2-16765, JP-A-2003-344997, and 2006-65210, urethane compounds having an ethylene oxide-based skeleton described in JP-B-58-49860, JP-B-56-17654, JP-B-62-39417, JP-B-62-39418, JP-A-2000-250211, and 2007-94138, and urethane compounds having a hydrophilic group described in U.S. Pat. No. 7,153,632 B, JP-W-8-505958, JP-A-2007-293221, and JP-A-293223 are also preferable. Furthermore, by use of an addition-polymerizable compound having an amino structure or a sulfide structure in the molecule described in JP-A-63-277653, JP-A-63-260909, and JP-A-1-105238, a photosensitive resin composition having very good photosensitive speed can be obtained.

In addition, in the method of using the polymerizable compound, appropriate structure, combination, and amount added can be freely selected by taking account of the degree of polymerization inhibition due to oxygen, resolution, fogging properties, change in refractive index, surface tackiness, etc. Furthermore, depending on the case, the layer construction, for example, an undercoat layer or an overcoat layer, and the coating method may also be considered.

Details of the structures of these polymerizable compounds and the method of application in terms of single use or combined use, the amount added, etc. may be freely set according to the target performance and design of a lithographic printing plate precursor. The polymerizable compound is used in the range of preferably 5 to 75 mass % relative to the total solids content of the photosensitive layer, more preferably 25 to 70 mass %, and particularly preferably 30 to 60 mass %.

(Component d) Other Binder Polymer

The photosensitive layer preferably comprises one type or two or more types of other binder polymer (Component d) other than a vinylcarbazole compound-derived monomer unit-containing acrylic polymer and a urethane-acrylic hybrid polymer.

As the other binder polymer, any one of various polymers that are known in the present industrial field to be used in a photosensitive layer of a negative-working lithographic printing plate precursor, etc. may be used without limitations.

The binder polymer that can be used in the present invention preferably has a weight-average molecular weight of 2,000 to 1,000,000, and more preferably 10,000 to 200,000. The binder polymer preferably has an acid value (mgKOH/g) of 20 to 400 when it is determined by using a known method.

Some binders are water-insoluble but soluble in an alkaline developer which is commonly used in the process for making a lithographic printing plate. Examples of the binder polymer include but are not limited to, polymers derived from (meth) acrylic acid and (meth)acrylate, polyvinyl acetals, phenolic resin, polymers derived from styrene and derivatives thereof, (meth)acrylonitrile, N-substituted cyclic imides, or maleic anhydrides, such as those described in EP Pat. No. 1,182,033 B, and U.S. Pat. Nos. 6,309,792, 6,352,812, 6,569,603, and 6,893,797. The polymers having pendant vinyl groups as described in U.S. Pat. Nos. 6,899,994 and 4,511,645, and EP 1,182,033 A1 are also useful.

The binder polymer that is useful in the present invention has a hydrophobic skeleton and is formed from both constituent repeating units a) and b) below or only from the constituent repeating unit b).

a) A repeating unit having a pendant cyano group directly bonded to the hydrophobic skeleton.

b) A repeating unit having a pendant group comprising a poly(alkylene oxide) segment.

These polymeric binders comprise poly(alkyleneoxide) segments and preferably poly(ethyleneoxide) segments. These polymers can be graft copolymers having a main chain polymer and poly(alkyleneoxide) pendant side chains or segments of block copolymers having blocks of (alkyleneoxide)-containing recurring units and non(alkyleneoxide)-containing recurring units. Both graft and block copolymers can additionally have pendant cyano groups attached directly to the hydrophobic backbone. The alkylene oxide constitutional units are preferably an alkylene oxide group having 1 to 6 carbons, and more preferably an alkylene oxide group having 1 to 3 carbons. The alkylene portions can be linear or branched or substituted versions thereof. Poly(ethyleneoxide) and poly(propyleneoxide) segments are preferred and poly(ethyleneoxide) segments are most preferred.

In some embodiments, the binder polymer may comprise only the constituent repeating unit comprising a poly(alkyleneoxide) segment, and in other embodiments the polymer binder may comprise the constituent repeating unit comprising a poly(alkyleneoxide) segment and the constituent repeating unit comprising a pendant cyano group directly bonded to the hydrophobic skeleton. As one example, such a constituent repeating unit may comprise a pendant group comprising a cyano, cyano-substituted, or cyano-terminal alkylene group. The repeating unit may be derived from an ethylenically unsaturated monomer such as for example acrylonitrile, methacrylonitrile, methylcyanoacrylate, ethylcyanoacrylate, or a combination thereof. However, a cyano group may be introduced into a polymer by other conventional means. Examples of such a cyano group-containing binder polymer are described in the specification of US Pat. Laid-open No. 2005/003285.

By way of example, such polymeric binders can be formed by polymerization of a combination or mixture of suitable ethylenically unsaturated polymerizable monomers or macromers, such as:

A) acrylonitrile, methacrylonitrile, or a combination thereof,

B) poly(alkyleneoxide) esters of acrylic acid or methacrylic acid, such as poly(ethylene glycol) methyl ether acrylate, poly(ethylene glycol) methyl ether methacrylate, or a combination thereof, and C) optionally, monomers such as acrylic acid, methacrylic acid, styrene, hydroxystyrene, acrylate esters, methacrylate esters, acrylamide, methacrylamide, or a combination of such monomers.

The amount of poly(alkyleneoxide) segment in such a binder polymer is preferably 0.5 to 60 mass %, more preferably 2 to 50 mass %, yet more preferably 5 to 40 mass %, and particularly preferably 5 to 20 mass %. The amount of (alkyleneoxide) segment in the block copolymer is preferably 5 to 60 mass %, more preferably 10 to 50 mass %, and yet more preferably 10 to 30 mass %. A polymer binder comprising a poly(alkyleneoxide) side chain may be present in the form of dispersed particles.

The binder polymer is preferably one comprising constituent repeating units derived from one or more types of (meth)acrylic acid, a (meth)acrylate, styrene and a styrene derivative, and a poly(alkylene glycol)(meth)acrylate. Furthermore, the binder polymer is more preferably one comprising constituent repeating units derived from two or more types of the above monomers.

Other Components (1) Surfactant

The photosensitive layer in the present invention may comprise a surfactant in order to promote developability and improve the coated surface condition.

Examples of the surfactant include a nonionic surfactant, an anionic surfactant, a cationic surfactant, an amphoteric surfactant, and a fluorine-based surfactant.

Preferred examples of a surfactant include a fluorine-based surfactant containing a perfluoroalkyl group in the molecule. Examples of such a fluorine-based surfactant include an anionic type such as a perfluoroalkylcarboxylic acid salt, a perfluoroalkylsulfonic acid salt, or a perfluoroalkylphosphoric acid ester; an amphoteric type such as a perfluoroalkylbetaine; a cationic type such as a perfluoroalkyltrimethylammonium salt; and a nonionic type such as a perfluoroalkylamine oxide, a perfluoroalkyl ethylene oxide adduct, an oligomer containing a perfluoroalkyl group and a hydrophilic group, an oligomer containing a perfluoroalkyl group and a lipophilic group, an oligomer containing a perfluoroalkyl group, a hydrophilic group, and a lipophilic group, or a urethane containing a perfluoroalkyl group and a lipophilic group. Furthermore, a fluorine-based surfactant described in JP-A-62-170950, JP-A-62-226143, or JP-A-60-168144 may also be preferably cited.

The surfactant may be used singly or in combination of two or more types.

The content of the surfactant is preferably 0.001 to 10 mass % of the total solids content of the photosensitive layer, and more preferably 0.01 to 5 mass %.

(2) Colorant

The photosensitive layer in the present invention may contain as an image colorant a dye (colored dye) or a pigment having a large absorption in the visible light region. It is preferable to add a colorant since it becomes easy to differentiate between an image area and a non-image area after image formation.

Examples of the pigment that is used in the present invention include a phthalocyanine-based pigment, an azo-based pigment, and pigments such as carbon black and titanium oxide. In the present invention, it is particularly preferable to use a copper phthalocyanine pigment from the viewpoint of image formation sensitivity and printing durability. In particular, in the present invention, a mode in which the photopolymerizable photosensitive layer is sensitive to infrared light, comprises a triphenylalkyl borate salt and/or a tetraphenyl borate salt, and further comprises a copper phthalocyanine is preferable. In this case, the sensitivity and printing durability improve.

On the other hand, with regard to the dye, when the photosensitive layer contains a triphenylalkylborate salt or a tetraphenylborate salt (including a case in which it is present as a counterion of a polymerization initiator or an infrared-absorbing dye (IR dye)), although the reason is not clear, the lithographic printing plate precursor might become susceptible to fogging by faint light, and ease of handling during plate making is greatly degraded, but when a borate salt is not contained in the photosensitive layer, a dye may be used as a colorant in the same manner as for the pigment.

In addition a dye in the present invention is more soluble in water than a pigment and use of a dye in a photosensitive layer greatly increases an ease of removal of non-image area (developability).

Specific examples of the dye include Oil Yellow #101, Oil Yellow #103, Oil Pink #312, Oil Green BG, Oil Blue BOS, Oil Blue #603, Oil Black BY (all from Orient Chemical Industry Co., Ltd.), Victoria Pure Blue, Crystal Violet (CI 42555), Methyl Violet (CI 42535), Ethyl Violet, Rhodamine B (CI 45170B), Malachite Green (CI 42000), Methylene Blue (CI 52015), and dyes described in JP-A-62-293247

Among various color dyes, red dyes and blue dyes are preferable from the viewpoint of visibility and specific examples include Oil Pink #312, Victoria Pure Blue, Crystal Violet (CI 42555), Methyl Violet (CI 42535), Ethyl Violet, Rhodamine B (CI 45170B), and Methylene Blue (CI 52015), etc.

Blue dyes such as Victoria Pure Blue, Crystal Violet (CI 42555), Methyl Violet (CI 42535), Ethyl Violet and Methylene Blue (CI 52015) are preferable.

Victoria Pure Blue is more preferable.

Moreover such a dye is preferable as has a maximum absorption wavelength between 600 to 700 nm in the visible region of 360 to 830 nm and a blue dye that has a maximum absorption wavelength between 600 to 700 nm is more preferable.

The content of the colorant is preferably 0.01 to 10 mass %, more preferably 0.01 to 5 mass %, and further more preferably 0.05 to 2.5 mass % relative to the total solids content of the photosensitive layer.

(3) Printing-Out Agent

The photosensitive layer in the present invention may comprise a compound whose color is changed by an acid or a radical in order to form a printed-out image.

Examples of such a compound include various types of colorants such as diphenylmethane-based, triphenylmethane-based, thiazine-based, oxazine-based, xanthene-based, anthraquinone-based, iminoquinone-based, azo-based, and azomethine-based colorants.

The content of a dye whose color is changed by an acid or a radical is preferably 0.01 to 10 mass % relative to the photosensitive layer solids content.

(4) Polymerization Inhibitor

The photosensitive layer in the present invention preferably contains a small amount of a thermal polymerization inhibitor in order to inhibit undesired thermal polymerization of the polymerizable compound (Component c) during the production process of the photosensitive layer or the storage.

Examples of the thermal polymerization inhibitors include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and an aluminum salt of N-nitroso-N-phenylhydroxylamine.

The content of the polymerization inhibitor in the photosensitive layer is preferably in the range of 0.01 to 5 mass % relative to the total weight of solids in the photosensitive layer.

(5) Higher Fatty Acid Derivative

Furthermore, in the photosensitive layer in the present invention, in order to avoid polymerization inhibition due to oxygen, a higher fatty acid derivative such as behenic acid or behenic amide may be added and allowed to localize on the photosensitive layer surface during the drying step after the coating, as necessary.

The content of the higher fatty acid derivative in the photosensitive layer is preferably in the range 0.1 to 10 mass % relative to the total weight of solids in the photosensitive layer.

(6) Plasticizer

A plasticizer may be added to the photosensitive layer in the present invention in order to improve developability.

Examples of the plasticizer include phthalic acid esters such as dimethyl phthalate, diethyl phthalate, dibutyl phthalate, diisobutyl phthalate, dioctyl phthalate, octylcapryl phthalate, dicyclohexyl phthalate, ditridecyl phthalate, butylbenzyl phthalate, diisodecyl phthalate, and diallyl phthalate, glycol esters such as dimethyl glycol phthalate, ethylphthalyl ethyl glycolate, methylphthalyl ethyl glycolate, butylphthalyl butyl glycolate, and triethylene glycol dicaprylate, phosphoric acid esters such as tricresyl phosphate and triphenyl phosphate, aliphatic dibasic acid esters such as diisobutyl adipate, dioctyl adipate, dimethyl sebacate, dibutyl sebacate, dioctyl azelate, and dibutyl maleate, polyglycidyl methacrylate, triethyl citrate, glycerol triacetyl ester, and butyl laurate.

The content of the plasticizer is preferably no greater than 30 mass % relative to the total solids content of the photosensitive layer.

(7) Inorganic Particles

The photosensitive layer in the present invention may comprise inorganic particles in order to improve cured film strength and to improve developability.

Preferred examples of the inorganic particles include silica, alumina, magnesium oxide, titanium oxide, magnesium carbonate, calcium alginate, and mixtures thereof. They may be used for strengthening a film, improving adhesion at an interface by roughening a surface, etc.

The inorganic particles preferably have an average particle size of 5 nm to 10 µm, and more preferably 0.5 µm to 3 µm. When in this range, they are dispersed stably in the photosensitive layer and the film strength of the photosensitive layer is fully maintained, thus enabling a non-image area that is formed to have excellent hydrophilicity that can suppress staining during printing.

The inorganic particles described above may easily be obtained as a commercial product such as a colloidal silica dispersion.

The content of the inorganic particles is preferably no greater than 40 mass % relative to the total solids content of the photosensitive layer, and more preferably no greater than 30 mass %.

(8) Low-Molecular-Weight Hydrophilic Compound

The photosensitive layer in the present invention may comprise a low-molecular-weight hydrophilic compound in order to improve developability without degrading printing durability.

With regard to the low-molecular-weight hydrophilic compound, examples of a water-soluble organic compound include glycols such as ethylene glycol, diethylene glycol, triethylene glycol, propylene glycol, dipropylene glycol, and tripropylene glycol, ether or ester derivatives thereof, polyhydroxy compounds such as glycerol and pentaerythritol, organic amines such as triethanolamine, diethanolamine, and monoethanolamine, salts thereof, organic sulfonic acids such as an alkylsulfonic acid, toluenesulfonic acid, and benzenesulfonic acid, salts thereof, organic sulfamic acids such as an alkylsulfamic acid, salts thereof, organic sulfuric acids such as an alkylsulfuric acid and an alkyl ether sulfuric acid, salts thereof, organic phosphonic acids such as phenylphosphonic acid, salts thereof, organic carboxylic acids such as tartaric acid, oxalic acid, citric acid, malic acid, lactic acid, gluconic acid, and an amino acid, and salts thereof.

Among them, an organic sulfonic acid, an organic sulfamic acid, or an organic sulfate such as a sodium salt or a lithium salt of an organic sulfuric acid is preferably used.

These compounds have a small hydrophobic moiety structure, have hardly any interfacial activation effect, and are clearly differentiated from the surfactants described above, for which a long-chain alkylsulfonate, a long-chain alkylbenzenesulfonate, etc. is preferably used.

The amount of low-molecular-weight hydrophilic compound added to the photosensitive layer is preferably 0.5 to 20 mass % relative to the total solids content of the photosensitive layer, more preferably 1 to 10 mass %, and yet more preferably 2 to 8 mass %. When in this range, good developability and printing durability can be obtained.

With regard to the low-molecular-weight hydrophilic compound, one type may be used on its own or two or more types may be used as a mixture.

(9) Oleophilizing Agent

The lithographic printing plate precursor that can be used in the present invention may comprise in the photosensitive layer and/or the protective layer a phosphonium compound as an oleophilizing agent in order to improve ink laydown.

Preferred examples of the phosphonium compound include compounds described in JP-A-2006-297907 or JP-A-2007-50660.

As the oleophilizing agent, in addition to a phosphonium compound, a nitrogen-containing compound can also be cited as a desirable example. Preferred examples of the nitrogen-containing compound include an amine salt, a quaternary ammonium salt, an imidazolinium salt, a benzimidazolinium salt, a pyridinium salt, and a quinolinium salt. Among them, a quaternary ammonium salt and a pyridinium salt are preferably used.

The amount of oleophilizing agent added to the photosensitive layer or the protective layer is preferably 0.01 to 20 mass % of the solids content of each layer, more preferably 0.05 to 10 mass %, and yet more preferably 0.1 to 5 mass %. When in this range, good ink laydown can be obtained.

(10) Co-Sensitizer

The photosensitive layer may comprise a known compound referred to as a chain transfer agent or a co-sensitizer, which further improve the sensitivity or have a function of suppressing polymerization inhibition by oxygen, etc.

Examples of such a compound include amines such as compounds described in M. R. Sander et al., 'Journal of Polymer Society', Vol. 10, p. 3173 (1972), JP-B-44-20189, JP-A-51-82102, JP-A-52-134692, JP-A-59-138205, JP-A-60-84305, JP-A-62-18537, JP-A-64-33104, and Research Disclosure No. 33825, and specific examples include triethanolamine, N-phenylglycine, N-phenylaspartic acid, ethyl p-dimethylaminobenzoate, and N,N-dialkylaniline derivatives such as p-formyldimethylaniline and p-methylthiodimethylaniline.

The other examples of a compound functioning as a chain transfer agent include a group of compounds having SH, PH, SiH, or GeH in the molecules. These compounds can donate hydrogen to a low activity radical species to generate a radical or are oxidized and then deprotonated to generate a radical.

The photosensitive layer may preferably employ as a chain transfer agent a thiol compound (e.g. 2-mercaptobenzimidazole, 2-mercaptobenzothiazole, 2-mercaptobenzoxazole, 3-mercaptotriazole, 5-mercaptotetrazole, etc.) in particular. Among them, a thiol compound described in JP-A-2006-091479, etc. is particularly preferably used. In accordance with the use of the thiol compound as a chain transfer agent, a problem of odor and degradation of sensitivity due to evaporation from the photosensitive layer or diffusion to another layer can be avoided, the storage stability is excellent, and a lithographic printing plate precursor having high sensitivity and high durability can be obtained.

The amount of sensitizer or chain transfer agent used is preferably 0.01 to 20 mass % relative to the total solids content of the photosensitive layer, more preferably 0.1 to 15 mass %, and yet more preferably 1.0 to 10 mass %.

Formation of Photosensitive Layer

The photosensitive layer in the present invention is preferably formed by dispersing or dissolving each of the necessary components described above in a solvent to prepare a coating liquid, applying the liquid above a support, and drying.

As the solvent used here, there can be cited for example ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone, toluene, and water, but the present invention should not be construed as being limited thereto.

These solvents may be used singly or in combination of two or more types as a mixture.

The solids content concentration of the coating liquid is preferably 1 to 50 mass %.

The photosensitive layer in the present invention may also be formed by preparing a plurality of coating liquids by dispersing or dissolving the same or different components described above in the same or different solvents and repeatedly coating and drying a plurality of times to thus obtain a multi-layer structure.

The amount (solids content) of the photosensitive layer that the support is coated with after coating and drying may be varied depending on the use, but it is preferably 0.3 to 3.0 $g/m^2$. In the above-mentioned range good sensitivity and good film properties of the photosensitive layer can be obtained.

Various methods can be used for the coating. Examples of the method include bar coater coating, spin coating, spray coating, curtain coating, dip coating, air knife coating, blade coating, and roll coating.

Protective Layer

In the lithographic printing plate precursor of the present invention, a protective layer (oxygen-blocking layer) is preferably provided on the photosensitive layer in order to prevent diffusion and penetration of oxygen, which inhibits a polymerization reaction at the time of exposure. As a material that can be used in the protective layer, either a water-soluble polymer or a water-insoluble polymer may be used by appropriate selection, and two or more types may be mixed as necessary and used. Specific examples include polyvinyl alcohol, a modified polyvinyl alcohol, polyvinylpyrrolidone, a water-soluble cellulose derivative, and a poly(meth)acrylonitrile. Among them, it is preferable to use a water-soluble polymer compound having relatively good crystallinity. Specifically, use of polyvinyl alcohol as a main component can give the best results in terms of basic characteristics such as oxygen barrier properties and development removability.

The polyvinyl alcohol for use in the protective layer may be partially substituted with ester, ether or acetal as long as it contains unsubstituted vinyl alcohol units for achieving the necessary oxygen-blocking properties and water solubility. In the same way, part of the polyvinyl alcohol may have another copolymer component. The polyvinyl alcohol can be obtained by hydrolyzing a vinyl acetate. As specific examples of the polyvinyl alcohol, those with 69.0 to 100 mol % hydrolysis and from 300 to 2,400 polymerization repeating units can be cited. Specific examples thereof include PVA-102, PVA-103, PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-235, PVA-217EE, PVA-217E, PVA-220E, PVA-224E, PVA-403, PVA-405, PVA-420, PVA-424H, PVA-505, PVA-617, PVA-613, PVA-706, and L-8 (Kuraray Co., Ltd.). They can be used singly or as a mixture. In a preferred embodiment, the polyvinyl alcohol content in the protective layer is 20 to 95 mass %, and more preferably 30 to 90 mass %.

Furthermore, a known modified polyvinyl alcohol may preferably be used. In particular, an acid-modified polyvinyl alcohol containing a carboxylic acid group or a sulfonic acid group is preferably used. Specific preferred examples include polyvinyl alcohols described in JP-A-2005-250216 and JP-A-2006-259137.

When polyvinylalcohol is used as a mixture with other components, as a component used as a mixture, modified polyvinyl alcohol, polyvinylpyrrolidone or a modified product thereof is preferable from the viewpoint of oxygen-blocking properties and development removability. The content thereof in the protective layer is preferably 3.5 to 80 mass %, more preferably 10 to 60 mass %, and yet more preferably 15 to 30 mass %.

As other components of the protective layer, glycerol, dipropylene glycol, etc. can be added in an amount corresponding to several mass % of the (co)polymer to impart flexibility. Furthermore, an anionic surfactant such as a sodium alkylsulfate or sodium alkylsulfonate; an amphoteric surfactant such as an alkylaminocarboxylic acid salt or an alkylaminodicarboxylic acid salt; or a nonionic surfactant such as a polyoxyethylene alkyl phenyl ether can be added in an amount corresponding to several mass % of the (co)polymer.

Furthermore, it is also preferable for an inorganic layered compound to be contained in the protective layer of the lithographic printing plate precursor for the purpose of improving the oxygen-blocking properties and the photosensitive layer surface protection properties. Among inorganic layered compounds, a fluorine-based swelling synthetic mica, which is a synthetic inorganic layered compound, is particularly useful. Specific preferred examples include inorganic layered compounds described in JP-A-2005-119273.

The coat weight of the protective layer is preferably in the range of 0.02 to 10 $g/m^2$ as a coat weight after drying. When the protective layer contains the inorganic layered compound, it is more preferably in the range of 0.1 to 5 $g/m^2$, and when the protective layer does not contain the inorganic layered compound, it is more preferably in the range of 0.5 to 5 $g/m^2$.

Support

The support used for the lithographic printing plate precursor of the present invention is not particularly limited and may be a dimensionally stable plate-form hydrophilic support. Particularly, an aluminum plate is preferable. Prior to the aluminum plate being used, it is preferably subjected to a surface treatment such as a surface roughening treatment or an anodizing treatment. The surface roughening treatment for the aluminum plate surface may be carried out by various types of methods, and examples thereof include a mechanical surface roughening treatment, an electrochemical surface roughening treatment (a surface roughening treatment involving dissolving the surface electrochemically), and a chemical surface roughening treatment (a surface roughening treatment involving selectively dissolving the surface chemically). As these treatments, the methods described in paragraph Nos. 0241 to 0245 of JP-A-2007-206217 are preferably used.

The support preferably has a center line average roughness of 0.10 to 1.2 µm. When in the above-mentioned range, good adhesion to the photosensitive layer, good printing durability, and good resistance to printing stains can be obtained.

Moreover, the color density of the support is preferably 0.15 to 0.65 as a reflection density value. When in the above-mentioned range, it is possible to obtain good image formation properties by preventing halation during imagewisely exposure and to obtain good ease of plate inspection after development.

The support preferably has a thickness of 0.1 to 0.6 mm, more preferably 0.15 to 0.4 mm, and yet more preferably 0.2 to 0.3 mm.

Support Hydrophilization Treatment and Undercoat Layer

In the lithographic printing plate precursor of the present invention, in order to improve the hydrophilicity of a non-image region to thus prevent printing stains, it is preferable to subject a support surface to a hydrophilization treatment or provide an undercoat layer between a support and a photosensitive layer.

Examples of the hydrophilization treatment of a support surface include a treatment with an alkali metal silicate in which a support is immersed or electrolyzed in an aqueous solution of sodium silicate, etc., a treatment with potassium fluorozirconate, and a treatment with polyvinylphosphonic acid; a treatment method involving immersion in an aqueous solution of polyvinylphosphonic acid is preferably used.

As an undercoat layer, an undercoat layer comprising a compound comprising an acid group such as phosphonic acid, phosphoric acid, or sulfonic acid is preferably used. In order to improve adhesion to a photosensitive layer, these compounds preferably further comprise a polymerizable group. As the polymerizable group, an ethylenically unsaturated group is preferable. Furthermore, a compound comprising a hydrophilicity-imparting group such as an ethyleneoxy group can also be cited as a preferred compound.

These compounds may be a low-molecular-weight compound or a high-molecular-weight polymer compound. Furthermore, these compounds may be used as a mixture of two or more types as necessary.

Preferred specific examples of a compound for the undercoat layer include a silane coupling agent having an addition-polymerizable ethylenically unsaturated group described in JP-A-10-282679 and a phosphorus compound having an ethylenically unsaturated group described in JP-A-2-304441. Those comprising a low-molecular-weight or high-molecular-weight compound comprising a hydrophilic group, a functional group that interacts with a support surface, and a crosslinkable group (preferably an ethylenically unsaturated group) described in JP-A-2005-238816, JP-A-2005-125749, JP-A-2006-239867, or JP-A-2006-215263 are also preferably used.

The undercoat layer is applied by a known method. The undercoat layer preferably has a coat weight (solids content) of 0.1 to 100 mg/m$^2$, and more preferably 1 to 30 mg/m$^2$.

Backcoat Layer

After applying a surface treatment to the support or forming the undercoat layer above the support, a backcoat layer may as necessary be provided on the back surface of the support.

As the backcoat layer, there can preferably be cited, for example, a coating layer comprising an organic polymer compound described in JP-A-5-45885, and a coating layer comprising a metal oxide obtained by hydrolysis and polycondensation of an organic metal compound or an inorganic metal compound described in JP-A-6-35174. Among them, use of an alkoxy compound of silicon such as Si(OCH$_3$)$_4$, Si(OC$_2$H$_5$)$_4$, Si(OC$_3$H$_7$)$_4$, or Si(OC$_4$H$_9$)$_4$ is preferable since starting materials are inexpensive and readily available.

A lithographic printing plate obtained by the process for making a lithographic printing plate of the present invention is, for example, mounted on a plate cylinder of a printer and suitably used for printing a large number of sheets of printed material while supplying dampening water and a printing ink.

EXAMPLES

The present invention is specifically explained below by reference to Examples, but the present invention should not be construed as being limited to these Examples. 'Parts' and '%' are on a mass basis unless otherwise specified. In addition subscript figures in constituent units of a compound indicate mole ratios.

<Synthesis of Polymer Particles and Explanation of Terms for Chemical Substances Used in Photosensitive Layer Coating Solution>

PEGMA: 50 mass % aqueous solution of poly(ethylene glycol) methyl ether methacrylate with a number-average molecular weight (Mn) of about 2,080 available from Sigma-Aldrich (St. Louis, Mo.), Hybridur 580: urethane-acrylic hybrid polymer dispersion (40 mass %) available from Air Products and Chemicals Hybridur 870: urethane-acrylic hybrid polymer dispersion (40 mass %) available from Air Products and Chemicals SR399: dipentaerythritol pentaacrylate available from Sartomer Company Inc. Japan NK-Ester A-DPH: dipentaerythritol hexaacrylate available from Shin-Nakamura Chemical Co., Ltd.

CD9053: trifunctional organic acid ester compound available from Sartomer Company Inc. Japan Fluor N2900: surfactant available from Cytnix Masurf FS-1520: alkyl fluoride group-containing amphoteric surfactant available from Mason Chemical <Synthesis of Binder Polymer 1>

A 3-necked flask equipped with a magnetic stirrer, a water bath, and an N$_2$ inlet was charged with AIBN (2,2'-azobis (isobutyronitrile), Vazo-64, obtained from Du Pont, 1.6 parts), methyl methacrylate (20 parts), acrylonitrile (24 parts), N-vinylcarbazole (20 parts, obtained from Polymer Dajac), methacrylic acid (16 parts), and dimethyl acetamide (DMAC, 320 parts). The reaction mixture was heated to 60° C. and stirred overnight (16 hours) under N$_2$ gas atmosphere. This gave a 20% solution of binder polymer 1 in DMAC.

The composition of binder polymer 1 was methyl methacrylate/acrylonitrile/N-vinylcarbazole/methacrylic acid=21/48/11/20 (molar ratio), and when the molecular weight was measured in tetrahydrofuran by gel permeation chromatography, Mw (weight-average molecular weight) was about 52,000.

<Synthesis of Binder Polymer 2>

200 parts of the DMAC solution of binder polymer 1 synthesized above was weighed, and potassium hydroxide (2.6 parts) dissolved in water (20 parts) was slowly added thereto, thus forming a viscous liquid. After the mixture was stirred for 10 min., allyl bromide (6.7 parts) was added, and the mixture was stirred at 55° C. for 3 hours. 36% conc. hydrochloric acid (6 parts) in DMAC (20 parts) was added to the flask, and the reaction mixture was stirred for a further 3 hours. The reaction mixture thus formed was then slowly added dropwise to a mixture of 12,000 parts of ice water and 20 parts of conc. hydrochloric acid while stirring. A precipitate thus formed was filtered, washed with 1,608 parts of propanol, and subsequently washed with 2,000 parts of water. A white powder was obtained after filtration. The powder was dried at room temperature (10° C. to 25° C.) overnight and then at 50° C. for 3 hours, thus giving about 40 parts of binder polymer 2 as a solid substance.

The composition of binder polymer 2 was methyl methacrylate/acrylonitrile/N-vinylcarbazole/allyl methacrylate=21/48/11/20 (molar ratio), and Mw measured in the same manner as described above was about 57,000.

<Synthesis of Binder Polymer 3>

A 20 mass % solution of binder polymer 3 in DMAC was obtained in the same manner as for binder polymer 1 except that acrylonitrile was not used, the amount of methyl methacrylate was changed to 65 parts, and the amount of DMAC was changed to 400 parts.

The composition of binder polymer 3 was methyl methacrylate/N-vinylcarbazole/methacrylic acid=69/11/20 (molar ratio), and Mw measured as above was about 55,000.

<Synthesis of Binder Polymer 4 (Comparative Example)>

A 20% solution of binder polymer 4 in DMAC was obtained in the same manner as for binder polymer 1 except that N-vinylcarbazole was not used, the amount of methyl methacrylate was changed to 30 parts, and the amount of DMAC was changed to 280 parts.

The composition of binder polymer 4 was methyl methacrylate/acrylonitrile/methacrylic acid=32/48/20 (molar ratio), and Mw measured in the same manner as described above was about 50,000.

<Synthesis of Binder Polymer 5>

A four-necked ground glass flask equipped with a heating mantle, a temperature controller, a mechanical stirrer, a reflux condenser, a dropping funnel, and a nitrogen supply inlet was charged with DMAC (100.7 parts) and PEGMA (50% aqueous solution, 20 parts), and the reaction mixture was heated to 80° C. under a flow of nitrogen. A mixture of DMAC (125 parts), N-vinylcarbazole (25 parts), acrylonitrile (35 parts), styrene (20 parts), methacrylic acid (10 parts), and AIBN (0.5 parts, Vazo-64) was added to the above at 80° C. over 2 hours, and a reaction was subsequently carried out for hours while adding 1.25 parts of Vazo-64. From quantitative measurement of the nonvolatile content, the monomer reaction conversion was at least 99%. A polymer solution thus obtained was reprecipitated using 6,000 parts of water/ice (3:1) that was being stirred at high speed, and a polymer powder thus precipitated was filtered and then dried at room temperature for 24 hours and at 43° C. for 2 days, thus giving binder polymer 5 as a powder. The yield was 95%, and the acid value was 69 mg KOH/g (theoretical value: 65).

The composition of binder polymer 5 was PEGMA/acrylonitrile/N-vinylcarbazole/styrene/methacrylic acid=0.5/60/12/17/11 (molar ratio), and Mw measured in the same manner as described above was about 100,000.

<Synthesis of Urethane-Acrylic Hybrid Polymer 1>

A reactor purged with nitrogen was charged with Formrez 55-56 (poly(neopentyl adipate), which is a polyol available from Witco Chemical, Mw about 2,000) (100 parts). Added to this were methylene dicyclohexyl diisocyanate (90.6 parts) and as a tin catalyst 10% DABCO T-12 (dibutyltin dilaurate available from Air Products and Chemicals) (0.25 parts). This mixture was stirred at 92° C. for 3 hours. While stirring constantly, dimethylolpropionic acid (14.8 parts) was added, and subsequently 1-methyl-2-pyrrolidinone (54.6 parts) was added. The mixture was further maintained at 92° C. for 5 hours.

The prepolymer was cooled to 75° C., and butyl methacrylate (141.6 parts) and 1,6-hexanediol diacrylate (0.88 parts) were added. After the mixture was stirred for 15 min., when the free NCO % was measured, the NCO content was substantially 0%. Subsequently, the mixture was cooled to 25° C., triethylamine (10.66 parts) was added, and a reaction was carried out for 1 hour. After neutralization, the prepolymer/monomer mixture was dispersed in deionized water (489.97 parts). In order to carry out chain extension, ethylenediamine (8.97 parts) was dissolved in deionized water (16.67 parts) and added to the reactor, and a reaction was carried out for 2 hours. Subsequently, Vazo-64 free radical initiator (AIBN available from Du Pont) (0.88 parts) dissolved in 1-methyl-2-pyrrolidinone (6.93 parts) was added, and a mixture of butyl methacrylate (31.44 parts) and 2-hydroxyethyl methacrylate (29.12 parts) was also added. 5 min. later the dispersion was heated to 75° C. and maintained there for 2 hours.

After polymerization was completed, the dispersion was filtered using a filter, thus giving urethane-acrylic hybrid polymer 1.

The Mw of the urethane-acrylic hybrid polymer 1 thus obtained was estimated to be about 150,000. When the particle size thereof was measured using an LA-910 laser diffraction/scattering type particle size distribution analyzer manufactured by Horiba, Ltd., the ma (average diameter of area distribution) was 360 nm and the my (average diameter of volume distribution; center of gravity of distribution) was 440 nm.

<Synthesis of Urethane-Acrylic Hybrid Polymer 2>

A reactor purged with nitrogen was charged with Formrez 55-56 (poly(neopentyl adipate), which is a polyol available from Witco Chemical, Mw about 2,000) (200.1 parts). Added to this were methylene dicyclohexyl diisocyanate (105.3 parts) and as a tin catalyst 10% DABCO T-12 (dibutyltin dilaurate available from Air Products and Chemicals) (0.52 parts). This mixture was stirred at 92° C. for 3 hours. While stirring constantly, dimethylolpropionic acid (26.8 parts) was added, and subsequently 1-methyl-2-pyrrolidinone (110 parts) was added. The mixture was further maintained at 92° C. for 5 hours.

The prepolymer was cooled to 75° C., and methyl methacrylate (199.7 parts) was added. After the mixture was stirred for 15 min., when the free NCO % was measured, the NCO content was about 1 to 1.5%. Subsequently, the mixture was cooled to 25° C., triethylamine (19.5 parts) was added, and a reaction was carried out for 1 hour. After neutralization, methyl methacrylate (64.2 parts) and 2-hydroxyethyl methacrylate (64.2 parts) were added, and the mixture was stirred for 5 min. Then, the prepolymer was dispersed in deionized water (800.2 parts). In order to stop chain extension, diethanol amine (18.6 parts) was dissolved in deionized water (32.5 parts) and added to the reactor, and a reaction was carried out for 2 hours. Subsequently, Vazo-67 free radical initiator (2,2'-azobis(2-methylbutyronitrile) available from Du Pont) (3.94 parts) and a thiol chain transfer agent 1-dodecylthiol (20.2 parts) dissolved in 1-methyl-2-pyrrolidinone (13.52 parts) were added. 5 min. later the dispersion was heated to 75° C. and maintained there for 2 hours, thus giving urethane-acrylic hybrid polymer 2.

The Mw of the urethane-acrylic hybrid polymer 2 thus obtained was estimated to be about 30,000. The particle size measured by the method above was ma=230 nm and mv=350 nm.

<Synthesis of Urethane-Acrylic Hybrid Polymer 3>

Urethane-acrylic hybrid polymer 3 was synthesized in the same manner as for urethane-acrylic hybrid polymer 1 except that the diisocyanate compound used was changed from methylenedicyclohexyl diisocyanate to diphenylmethane diisocyanate (MDI).

The Mw of the urethane-acrylic hybrid polymer 3 thus obtained was estimated to be about 100,000. The particle size measured by the method above was ma=300 nm and mv=380 nm.

<Synthesis of Urethane-Acrylic Hybrid Polymer 4>

Urethane-acrylic hybrid polymer 4 was synthesized in the same manner as for urethane-acrylic hybrid polymer 1 except that the diisocyanate compound used was changed from methylenedicyclohexyl diisocyanate to m-tolylene diisocyanate (TDI).

The Mw of the urethane-acrylic hybrid polymer 4 thus obtained was estimated to be about 130,000. The particle size measured by the method above was ma=320 nm and mv=400 nm.

<Synthesis of Urethane-Acrylic Hybrid Polymer 5>

Urethane-acrylic hybrid polymer 5 was synthesized in the same manner as for urethane-acrylic hybrid polymer 1 except that the diisocyanate compound used was changed from methylenedicyclohexyl diisocyanate to isophorone diisocyanate (IpDI).

The Mw of the urethane-acrylic hybrid polymer 5 thus obtained was estimated to be about 150,000. The particle size measured by the method above was ma=340 nm and mv=450 nm.

<Synthesis of Urethane-Acrylic Hybrid Polymer 6>

Urethane-acrylic hybrid polymer 6 was synthesized in the same manner as for urethane-acrylic hybrid polymer 1 except that the diisocyanate compound used was changed from methylenedicyclohexyl diisocyanate to hexamethylene diisocyanate (HMDI).

The Mw of the urethane-acrylic hybrid polymer 6 thus obtained was estimated to be about 180,000. The particle size measured by the method above was ma=420 nm and mv=520 nm.

Examples 1 to 159 and Comparative Examples 1 to 39

Preparation of Lithographic Printing Plate Precursor (1)

(1) Preparation of Support (1)

A 0.3 mm thick aluminum plate (material: JIS A 1050) was subjected to a degreasing treatment with a 10 mass % aqueous solution of sodium aluminate at 50° C. for 30 sec. in order to remove rolling oil on the surface thereof. Thereafter, the aluminum plate surface was grained using three nylon brushes implanted with bundled bristles having a diameter of 0.3 mm and an aqueous suspension (specific gravity: 1.1 g/cm$^3$) of pumice having a median diameter of 25 μm and then washed well with water. The plate was etched by immersing it in a 25 mass % aqueous solution of sodium hydroxide at 45° C. for 9 sec. and, after washing with water, was immersed in a 20 mass % aqueous solution of nitric acid at 60° C. for 20 sec., followed by washing with water. The amount of etching of the grained surface was about 3 g/m$^2$.

Subsequently, the aluminum plate was subjected to a consecutive electrochemical surface roughening treatment using an AC voltage of 60 Hz. An electrolytic liquid used here was a 1 mass % aqueous solution of nitric acid (containing 0.5 mass % of aluminum ion) at a liquid temperature of 50° C. The electrochemical surface roughening treatment was carried out using as an AC power source waveform a trapezoidal rectangular wave alternating current having a duty ratio of 1:1 and a time TP from zero to peak current value of 0.8 msec. with a carbon electrode as the counter electrode. Ferrite was used as an auxiliary anode. The current density was 30 A/dm$^2$ as a peak current value, and 5% of the current flowing from the power source was diverted to the auxiliary anode. The quantity of electricity in the nitric acid electrolysis was 175 C/dm$^2$ when the aluminum plate was the anode. Following this, washing with water was carried out by means of a spray.

Subsequently, the aluminum plate was subjected to an electrochemical surface roughening treatment in the same manner as in the nitric acid electrolysis above using, as an electrolytic liquid, a 0.5 mass % aqueous solution of hydrochloric acid (containing 0.5 mass % of aluminum ion) at a liquid temperature of 50° C. under conditions of a quantity of electricity of 50 C/dm$^2$ when the aluminum plate was the anode, and was then washed with water by spraying. The plate was then treated in a 15 mass % aqueous solution of sulfuric acid (containing 0.5 mass % of aluminum ion) as an electrolytic liquid at a current density of 15 A/dm$^2$ to provide a direct current anodized film of 2.5 g/m$^2$, was then washed with water, and dried.

Furthermore, steam at 100° C. was sprayed onto the anodized film at a pressure of $1.033 \times 10^5$ Pa for 8 sec., thus carrying out a sealing treatment.

Subsequently, in order to guarantee hydrophilicity for a non-image area, a silicate treatment was carried out using a 2.5 mass % aqueous solution of sodium silicate No. 3 at 75° C. for 6 sec. The amount of Si attached was 10 mg/m$^2$. Subsequently, washing with water was carried out, thus giving support (1). The center line average roughness (Ra) of this substrate was measured using a stylus having a diameter of 2 μm and found to be 0.51 μm.

(2) Formation of Undercoat Layer

A support having an undercoat layer was then produced by coating support (1) above with undercoat layer coating solution (1) below at a dry coat weight of 20 mg/m$^2$.

Undercoat Layer Coating Solution (1)

Compound (I) for undercoat layer having structure below: 0.18 parts

Methanol: 55.24 parts

Water: 6.15 parts

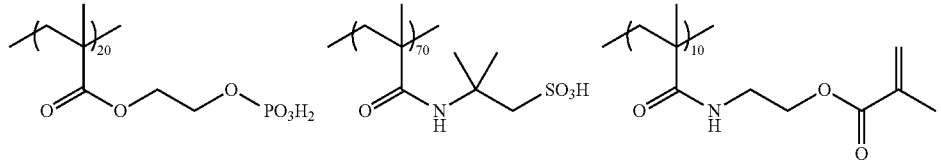

Compound (1) for undercoat layer (3) Formation of Photosensitive Layer

A photosensitive layer was formed at a dry coat weight of 1.0 g/m² by bar-coating the undercoat layer with photosensitive layer coating solution (1) having the composition below and drying in an oven at 100° C. for 60 sec.

Photosensitive layer coating solution (1) was prepared by mixing and stirring 10.467 parts of photosensitive liquid (1) below and 0.300 parts of an aqueous dispersion of the urethane-acrylic hybrid polymer used in the present invention and described in Table 1 to Table 4 immediately before coating.

Photosensitive Liquid (1)
Binder polymer described in Table 3: 0.240 parts as solids content
Infrared absorbing agent (1) below: 0.030 parts
Polymerization initiator (A) below: 0.162 parts
Polymerizable compound (tris(acryloyloxyethyl) isocyanurate) (NK ester A-9300, Shin-Nakamura Chemical Co., Ltd.): 0.192 parts
SR399 (Dipentaerythritol pentaacrylate): 0.062 parts
Pionin A-20 (Takemoto Oil & Fat Co., Ltd.): 0.055 parts
Benzyldimethyloctylammonium $PF_6$ salt: 0.018 parts
Fluorine-based surfactant (1) below: 0.008 parts
Methyl ethyl ketone: 1.091 parts
1-Methoxy-2-propanol: 8.609 parts

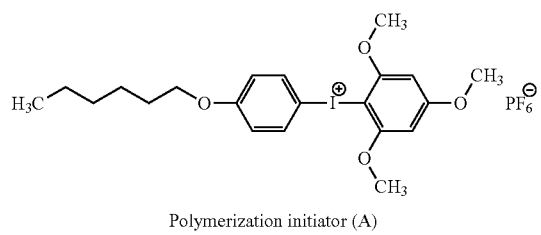

Polymerization initiator (A)

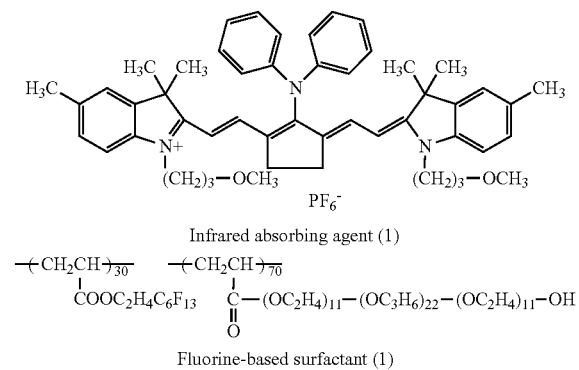

Infrared absorbing agent (1)

Fluorine-based surfactant (1)

(4) Formation of Protective Layer

Lithographic printing plate precursor (1) was obtained by forming a protective layer at a dry coat weight of 0.15 g/m² by bar-coating the photosensitive layer with protective layer coating solution (1) having the composition below and then drying in an oven at 120° C. for 60 sec.

Protective Layer Coating Solution (1)
Inorganic layered compound dispersion (1) below: 1.5 parts
Polyvinyl alcohol (CKS50, The Nippon Synthetic Chemical Industry Co., Ltd., sulfonic acid-modified, degree of saponification at least 99 mole %, degree of polymerization 300) 6 mass % aqueous solution: 0.55 parts
Polyvinyl alcohol (PVA-405, Kuraray Co., Ltd., degree of saponification 81.5 mole %, degree of polymerization 500) 6 mass % aqueous solution: 0.03 parts
Surfactant manufactured by Nihon Emulsion Co., Ltd. (Emalex 710) 1 mass % aqueous solution: 0.86 parts
Ion-exchanged water: 6.0 parts
Preparation of Inorganic Layered Compound Dispersion (1)

6.4 parts of a Somasif ME-100 synthetic mica (Co-op Chemical Co., Ltd.) was added to 193.6 parts of ion-exchanged water, and dispersion was carried out using a homogenizer until the average particle size (laser scattering method) became 3 μm. The aspect ratio of dispersed particles thus obtained was at least 100.

<Preparation of Lithographic Printing Plate Precursor (2)>
(1) Preparation of Support (2)

An aluminum plate that had been subjected to the electrochemical surface roughening treatment in the preparation of support (1) was provided with 1.5 g/m² of a direct current anodized film using 2.5 M phosphoric acid as an electrolyte at a voltage of 50 V and a maximum electric current density of 2 A/dm², then washed with water, and dried.

Subsequently, steam at 100° C. at a pressure of $1.033 \times 10^5$ Pa was sprayed onto the above anodized film for 15 sec., thus carrying out a sealing treatment.

Subsequently, it was immersed in a 0.4 mass % polyvinyl phosphonic acid aqueous solution at a liquid temperature of 50° C. for 10 sec., washed with water, and dried, thus giving support (2).

(2) Formation of Undercoat Layer, Photosensitive Layer and Protective Layer

Lithographic printing plate precursor (2) was obtained in the same manner as for lithographic printing plate precursor (1) except that support (2) above was used, no undercoat layer was provided, a photosensitive layer with a dry coat weight of 1.2 g/m² was provided by bar-coating photosensitive layer coating solution (2) below instead of photosensitive layer coating solution (1) and drying in an oven at 82° C. for 90 sec., and a protective layer with a dry coat weight of 0.4 g/m² was provided by bar-coating protective layer coating solution (2) below instead of protective layer coating solution (1).

Photosensitive Layer Coating Solution (2)
Binder polymer described in Table 1: 1.75 parts as solids content
Urethane-acrylic hybrid polymer described in Table 1: 2.34 parts as solids content
SR399: 2.66 parts
NK-Ester A-DPH: 2.66 parts
CD9053: 0.53 parts
Bis(t-butylphenyl)iodonium tetraphenylborate: 0.96 parts
Fluor N2900: 0.11 parts
Pigment 1: 0.73 parts
Infrared absorbing agent (2) below: 0.27 parts
Ion-exchanged water: 13.77 parts
1-Methoxy-2-propanol: 48.18 parts
2-Butyrolactone: 13.77 parts
2-Butanone: 61.94 parts Infrared absorbing agent (2)

Irgalith Blue GLVO
(C.I. Pigment Blue 15:4) 76.9 wt %

Disperbyk 167   15.4 wt %

7.7 wt %

Pigment 1

Disperbyk 167: dispersant available from Byk Chemie
Protective Layer Coating Solution (2)
Polyvinyl alcohol (PVA-405, Kuraray Co., Ltd., degree of saponification 81.5 mole %, degree of polymerization 500) 6 mass % aqueous solution: 66.33 parts
Masurf 1520: 0.02 parts
Ion-exchanged water: 8.65 parts <Preparation of Lithographic Printing Plate Precursor (3)>
(1) Preparation of Support (3)

The treatment with poly(vinylphosphonic acid) in the formation of support (2) was changed to a treatment with polyacrylic acid. That is, an aluminum plate that had been subjected to the treatments prior to the treatment with poly(vinylphosphonic acid) in the preparation of support (2) was immersed in a 1.0 mass % aqueous solution of polyacrylic acid at a liquid temperature of 25° C. for 8 sec., washed with water, and dried, thus giving support (3).

(2) Formation of Photosensitive Layer

Lithographic printing plate precursor (3) was obtained in the same manner as for lithographic printing plate precursor (1) except that support (3) above was subjected to bar coating, without providing an undercoat layer, by changing photosensitive layer coating solution (1) to photosensitive layer coating solution (3) below, dried in an oven at 90° C. for 90 sec. to thus provide a photosensitive layer having a dry coat weight of 1.5 g/m², and subjected to bar coating by changing protective layer coating solution (1) to protective layer coating solution (3) below to thus provide a protective layer having a dry coat weight of 2.1 g/m².

Photosensitive Layer Coating Solution (3)
Binder polymer described in Table 2: 8.50 parts as solids content
Reaction product of 1:2 hexamethylene diisocyanate and hydroxyethyl acrylate: 6.00 parts
Reaction product of 1:2 hexamethylene diisocyanate and pentaerythritol triacrylate: 6.00 parts
Polymerization initiator (B) below: 0.70 parts
Infrared absorbing agent (3) below: 0.20 parts
N-Phenyliminodiacetic acid: 0.25 parts
Crystal violet: 0.35 parts
Fluor N2900: 0.08 parts
1-Methoxy-2-propanol: 88.32 parts
2-Butyrolactone: 22.08 parts
2-Butanone: 110.40 parts Infrared absorbing agent (3)

Polymerization initiator (B)

Protective Layer Coating Solution (3)
6 mass % aqueous solution of polyvinyl alcohol (PVA-105, Kuraray Co., Ltd., degree of saponification at least 98 mole %, degree of polymerization 500): 66.33 parts
1 mass % aqueous solution of surfactant (Emalex 710) manufactured by Nihon Emulsion Co., Ltd.: 0.86 parts
Ion-exchanged water: 12.60 parts <Preparation of Lithographic Printing Plate Precursor (4)>
(1) Formation of Photosensitive Layer Lithographic printing plate precursor (4) was obtained in the same manner as for lithographic printing plate precursor (1) except that support (3) above was subjected to bar-coating, without providing an undercoat layer, photosensitive layer coating solution (4) below instead of photosensitive layer coating solution (1), subjected to drying in an oven at 90° C. for 90 sec. to thus provide a photosensitive layer having a dry coat weight of 1.5 g/m2, and subjected to coating protective layer coating solution (2) to thus provide a protective layer having a dry coat weight of 2.1 g/m².

Photosensitive Layer Coating Solution (4)
Binder polymer described in Table 1: 1.75 parts as solids content
Urethane-acrylic hybrid polymer described in Table 1: 2.34 parts as solids content
SR399: 2.66 parts
NK-Ester A-DPH: 2.66 parts
CD9053: 0.53 parts
Bis(t-butylphenyl)iodonium tetraphenylborate: 0.96 parts
Fluor N2900: 0.11 parts
Victoria Pure Blue: 0.73 parts
Infrared absorbing agent (2) above: 0.27 parts
Ion-exchanged water: 13.77 parts
1-Methoxy-2-propanol: 48.18 parts
2-Butyrolactone: 13.77 parts
2-Butanone: 61.94 parts <Preparation of Lithographic Printing Plate Precursor (5)>
(1) Formation of Photosensitive Layer Lithographic printing plate precursor (5) was obtained in the same manner as for lithographic printing plate precursor (1) except that support (3) above was subjected to bar-coating, without providing an undercoat layer, photosensitive layer coating solution (5) below instead of photosensitive layer coating solution (1), subjected to drying in an oven at 90° C. for 90 sec. to thus provide a photosensitive layer having a dry coat weight of 1.5 g/m², and subjected to coating protective layer coating solution (2) to thus provide a protective layer having a dry coat weight of 2.1 g/m².

Photosensitive Layer Coating Solution (5)
Binder polymer described in Table 1: 1.75 parts as solids content
Urethane-acrylic hybrid polymer described in Table 1: 2.34 parts as solids content
SR399: 2.66 parts
NK-Ester A-DPH: 2.66 parts
CD9053: 0.53 parts
Bis(t-butylphenyl)iodonium tetraphenylborate: 0.96 parts
Fluor N2900: 0.11 parts
Methyl Violet: 0.73 parts
Infrared absorbing agent (2) above: 0.27 parts
Ion-exchanged water: 13.77 parts
1-Methoxy-2-propanol: 48.18 parts
2-Butyrolactone: 13.77 parts
2-Butanone: 61.94 parts <Preparation of Lithographic Printing Plate Precursor (6)>
(1) Formation of Photosensitive Layer Lithographic printing plate precursor (6) was obtained in the same manner as for lithographic printing plate precursor (1) except that support (3) above was subjected to bar-coating, without providing an undercoat layer, photosensitive layer coating solution (6) below instead of photosensitive layer coating solution (1), subjected to drying in an oven at 90° C. for 90 sec. to thus provide a photosensitive layer having a dry coat weight of 1.5 g/m², and subjected to coating protective layer coating solution (2) to thus provide a protective layer having a dry coat weight of 2.1 g/m².

Photosensitive Layer Coating Solution (6)
Binder polymer described in Table 1: 1.75 parts as solids content
Urethane-acrylic hybrid polymer described in Table 1: 2.34 parts as solids content
SR399: 2.66 parts
NK-Ester A-DPH: 2.66 parts
CD9053: 0.53 parts
Bis(t-butylphenyl)iodonium tetraphenylborate: 0.96 parts
Fluor N2900: 0.11 parts
Rhodamine B: 0.73 parts
Infrared absorbing agent (2) above: 0.27 parts
Ion-exchanged water: 13.77 parts
1-Methoxy-2-propanol: 48.18 parts
2-Butyrolactone: 13.77 parts
2-Butanone: 61.94 parts <Preparation of Lithographic Printing Plate Precursor (7)>
(1) Formation of Photosensitive Layer Lithographic printing plate precursor (7) was obtained in the same manner as for lithographic printing plate precursor (1) except that support (3) above was subjected to bar-coating, without providing an undercoat layer, photosensitive layer coating solution (7) below instead of photosensitive layer coating solution (1), subjected to drying in an oven at 90° C. for 90 sec. to thus provide a photosensitive layer having a dry coat weight of 1.5 g/m², and subjected to coating protective layer coating solution (2) to thus provide a protective layer having a dry coat weight of 2.1 g/m².

Photosensitive Layer Coating Solution (7)
Binder polymer described in Table 1: 1.75 parts as solids content
Urethane-acrylic hybrid polymer described in Table 1: 2.34 parts as solids content
SR399: 2.66 parts
NK-Ester A-DPH: 2.66 parts
CD9053: 0.53 parts
Bis(t-butylphenyl)iodonium tetraphenylborate: 0.96 parts
Fluor N2900: 0.11 parts
Oil Yellow #101: 0.73 parts
Infrared absorbing agent (2) above: 0.27 parts
Ion-exchanged water: 13.77 parts
1-Methoxy-2-propanol: 48.18 parts
2-Butyrolactone: 13.77 parts
2-Butanone: 61.94 parts Exposure Lithographic printing plate precursors (1) and (2) were exposed using a Luxel PLATESETTER T-6000111, equipped with an infrared semiconductor laser, manufactured by Fujifilm Corporation under conditions of a drum outer face rotational speed of 1,000 rpm, a laser output of 70%, and a resolution of 2,400 dpi.

On the other hand, lithographic printing plate precursor (3) was exposed using a Trendsetter 3244VX, equipped with an infrared semiconductor laser, manufactured by Creo under conditions of an output of 10 W, a drum outer face rotational speed of 150 rpm, and a resolution of 2,400 dpi. Exposure images included a solid image and a fine line image.

Processing

In Examples 1 to 159, excluding Examples 13, 26, 39, and Comparative Examples 1 to 38, the exposed precursors were subjected to processing using the automatic one-bath processing equipment shown in FIG. 1 and then dried using a dryer. The developers used are shown in Table 1 to Table 3 below.

The developer was used by circulating using a pump through a 'TCW-75N-PPS' cartridge filter (mesh size: 75 μm) manufactured by Advantec Toyo Kaisha, Ltd.

In Comparative Examples 13, 26, and 39, the exposed plate precursors were subjected to development, washing with water, and gumming using a three bath development system automatic processor (LP-940HII, Fujifilm Corporation). The processing solution for each step was as follows.

The development step was carried out in a development bath using developer 1, which is described later.

The washing step was carried out in a water washing bath charged with tap water.

The gumming step was carried out in a gumming bath using gumming liquid 'FN-6 (negative PS plate finisher liquid)' manufactured by Fujifilm Corporation that had been diluted with an equivalent amount of tap water.

<Evaluation>

Ink laydown, resistance to printing stains, and printing durability of the lithographic printing plate made by development processing were evaluated by the following procedures. The evaluation results are shown in Tables 4 to 6.

(1) Ink Laydown

The processed lithographic printing plate was set on a plate cylinder of a LITHRONE 26 printer manufactured by Komori Corporation. Ecolity-2 (Fujifilm Corporation)/tap water=2/98 (ratio by volume) as dampening water and Values-G (N) black ink (Dainippon Ink and Chemicals, Incorporated) were used, printing was started by supplying the dampening water and the ink by a standard automatic printing start method of the LITHRONE 26, and printing was carried out on Tokubishi Art Paper (76.5 kg) at a printing speed of 10,000 sheets per hour.

The number of sheets of printing paper required for the ink density on the printing paper for an exposed portion region of the photosensitive layer to attain a defined reference density was counted and used as the ink laydown during the initial printing. The smaller the number of sheets of printing paper, the better the ink laydown.

(2) Resistance to Staining During Printing (Resistance to Printing Stains)

After evaluation of ink laydown during the initial printing described above was carried out, printing was restarted, and the amount of water supplied was gradually decreased by turning down the water dial of the printer until entanglement occurred in a halftone image. Here, the degree of occurrence of running stains was evaluated using the criteria below and used as the rank for resistance to printing stains.

A: good with a sufficient water/ink balance, resistant to running stains.

B: acceptable level, a little running stains occurred.

C: problem in practice, running stains occurred, halftone shadow side crushed.

D: bad running stains occurred with the water dial turned down only slightly.

(3) Printing Durability

After the evaluation of stains described above was carried out, printing was further continued while washing the plate surface using Multi Cleaner E (plate cleaner, Fujifilm Corporation) about every 5,000 sheets. When the number of prints was increased, the image recording layer was gradually worn, and the ink density on the printed material decreased. The end of printing was determined as being when the value obtained by measuring using a Gretag densitometer the halftone dot area percentage of material printed with a 20 μm FM screen 5% halftone decreased by 0.5% from the value measured for the 100th print, and the number of prints at that time was defined as the number for evaluation of printing durability.

From the results in Tables 4 to 6, it can be seen that in all of Examples 1 to 159 employing the process for making a lithographic printing plate of the present invention, lithographic printing plates having excellent printing durability, ink laydown, and resistance to printing stains could be obtained.

TABLE 1

| Example | Lithographic printing plate precursor | | | Development processing | | Amount of Component A (parts) |
|---|---|---|---|---|---|---|
| | Type | Binder polymer | Urethane-acrylic Hybrid polymer | Developer | Compound of Component A | |
| Example 1 | (2) | polymer 1 | Hybridur 580 | Developer 1 | BO-1 | 500 |
| Example 2 | (2) | polymer 1 | Hybridur 580 | Developer 1 | BO-5 | 500 |
| Example 3 | (2) | polymer 1 | Hybridur 580 | Developer 1 | BO-7 | 500 |
| Example 4 | (2) | polymer 1 | Hybridur 580 | Developer 1 | BO-13 | 500 |
| Example 5 | (2) | polymer 1 | Hybridur 580 | Developer 1 | BC-1 | 500 |
| Example 6 | (2) | polymer 1 | Hybridur 580 | Developer 1 | BC-5 | 500 |
| Example 7 | (2) | polymer 1 | Hybridur 580 | Developer 1 | BS-1 | 500 |
| Example 8 | (2) | polymer 1 | Hybridur 580 | Developer 1 | BS-3 | 500 |
| Example 9 | (2) | polymer 1 | Hybridur 580 | Developer 2 | BO-5 | 500 |
| Example 10 | (2) | polymer 1 | Hybridur 580 | Developer 2 | BC-1 | 500 |
| Example 11 | (2) | polymer 1 | Hybridur 580 | Developer 3 | BO-5 | 500 |
| Example 12 | (2) | polymer 1 | Hybridur 580 | Developer 3 | BC-1 | 500 |
| Example 13 | (2) | polymer 1 | Hybridur 580 | Developer 4 | BO-5 | 500 |
| Example 14 | (2) | polymer 1 | Hybridur 580 | Developer 4 | BC-1 | 500 |
| Example 15 | (2) | polymer 1 | Hybridur 580 | Developer 6 | BO-5 | 500 |
| Example 16 | (2) | polymer 1 | Hybridur 580 | Developer 6 | BC-1 | 500 |
| Example 17 | (2) | polymer 1 | Hybridur 580 | Developer 7 | BO-5 | 500 |
| Example 18 | (2) | polymer 1 | Hybridur 580 | Developer 7 | BC-1 | 500 |
| Example 19 | (2) | polymer 1 | Hybridur 580 | Developer 8 | BO-5 | 500 |
| Example 20 | (2) | polymer 1 | Hybridur 580 | Developer 8 | BC-1 | 500 |
| Example 21 | (2) | polymer 1 | Hybridur 580 | Developer 9 | BO-5 | 500 |
| Example 22 | (2) | polymer 1 | Hybridur 580 | Developer 9 | BC-1 | 500 |

TABLE 1-continued

| | | Lithographic printing plate precursor | | Development processing | | |
|---|---|---|---|---|---|---|
| Example | Type | Binder polymer | Urethane-acrylic Hybrid polymer | Developer | Compound of Component A | Amount of Component A (parts) |
| Example 23 | (2) | polymer 1 | Hybridur 580 | Developer 10 | BO-5 | 500 |
| Example 24 | (2) | polymer 1 | Hybridur 580 | Developer 10 | BC-1 | 500 |
| Example 25 | (2) | polymer 1 | Hybridur 580 | Developer 11 | BO-5 | 500 |
| Example 26 | (2) | polymer 1 | Hybridur 580 | Developer 11 | BC-1 | 500 |
| Example 27 | (2) | polymer 1 | Hybridur 580 | Developer 18 | BO-1 | 500 |
| Example 28 | (2) | polymer 1 | Hybridur 580 | Developer 18 | BO-5 | 500 |
| Example 29 | (2) | polymer 1 | Hybridur 580 | Developer 18 | BO-7 | 500 |
| Example 30 | (2) | polymer 1 | Hybridur 580 | Developer 18 | BO-13 | 500 |
| Example 31 | (2) | polymer 1 | Hybridur 580 | Developer 18 | BC-1 | 500 |
| Example 32 | (2) | polymer 1 | Hybridur 580 | Developer 18 | BC-5 | 500 |
| Example 33 | (2) | polymer 1 | Hybridur 580 | Developer 18 | BS-1 | 500 |
| Example 34 | (2) | polymer 1 | Hybridur 580 | Developer 18 | BS-3 | 500 |
| Example 35 | (2) | polymer 1 | Hybridur 580 | Developer 19 | BO-5 | 80 |
| Example 36 | (2) | polymer 1 | Hybridur 580 | Developer 19 | BC-1 | 300 |
| Example 37 | (2) | polymer 1 | Hybridur 580 | Developer 1 | BC-1 | 80 |
| Example 38 | (2) | polymer 1 | Hybridur 580 | Developer 1 | BC-1 | 300 |
| Example 39 | (2) | polymer 1 | Hybridur 580 | Developer 1 | BC-1 | 1,200 |
| Example 40 | (2) | polymer 1 | Hybridur 580 | Developer 1 | BC-1 | 1,800 |
| Example 41 | (2) | polymer 1 | Hybridur 580 | Developer 18 | BO-1, BC-1 | 250 each |
| Example 42 | (2) | polymer 1 | Hybridur 580 | Developer 18 | BO-5, BC-5 | 250 each |
| Example 43 | (2) | polymer 2 | Hybridur 580 | Developer 1 | BC-1 | 500 |
| Example 44 | (2) | polymer 3 | Hybridur 580 | Developer 1 | BC-1 | 500 |
| Example 45 | (2) | polymer 4 | Hybridur 580 | Developer 1 | BC-1 | 500 |
| Example 46 | (2) | polymer 5 | Hybridur 580 | Developer 1 | BC-1 | 500 |
| Example 47 | (2) | polymer 1 | None | Developer 1 | BC-1 | 500 |
| Example 48 | (2) | polymer 2 | None | Developer 1 | BC-1 | 500 |
| Example 49 | (2) | polymer 3 | None | Developer 1 | BC-1 | 500 |
| Example 50 | (2) | polymer 5 | None | Developer 1 | BC-1 | 500 |
| Example 51 | (2) | polymer 1 | Hybridur 870 | Developer 1 | BC-1 | 500 |
| Example 52 | (2) | polymer 1 | Hybrid polymer 1 | Developer 1 | BC-1 | 500 |
| Example 53 | (2) | polymer 1 | Hybrid polymer 2 | Developer 1 | BC-1 | 500 |
| Example 54 | (2) | polymer 1 | Hybrid polymer 3 | Developer 1 | BC-1 | 500 |
| Example 55 | (2) | polymer 1 | Hybrid polymer 4 | Developer 1 | BC-1 | 500 |
| Example 56 | (2) | polymer 1 | Hybrid polymer 5 | Developer 1 | BC-1 | 500 |
| Example 57 | (2) | polymer 1 | Hybrid polymer 6 | Developer 1 | BC-1 | 500 |
| Comp. Example 1 | (2) | polymer 1 | Hybridur 580 | Developer 5 | BO-5 | 500 |
| Comp. Example 2 | (2) | polymer 1 | Hybridur 580 | Developer 5 | BC-1 | 500 |
| Comp. Example 3 | (2) | polymer 1 | Hybridur 580 | Developer 12 | — | — |
| Comp. Example 4 | (2) | polymer 1 | Hybridur 580 | Developer 13 | — | — |
| Comp. Example 5 | (2) | polymer 1 | Hybridur 580 | Developer 14 | — | — |
| Comp. Example 6 | (2) | polymer 1 | Hybridur 580 | Developer 15 | — | — |
| Comp. Example 7 | (2) | polymer 1 | Hybridur 580 | Developer 16 | — | — |
| Comp. Example 8 | (2) | polymer 1 | Hybridur 580 | Developer 17 | — | — |
| Comp. Example 9 | (2) | polymer 1 | Hybridur 580 | SP-200 | — | — |
| Comp. Example 10 | (2) | polymer 4 | None | Developer 1 | BC-1 | 500 |
| Comp. Example 11 | (2) | polymer 4 | None | Developer 18 | BC-1 | 500 |
| Comp. Example 12 | (2) | polymer 4 | None | SP-200 | — | — |
| Comp. Example 13 | (2) | polymer 1 | Hybridur 580 | Developer 1* | BC-1 | 500 |

*In Comparative Example 13, the washing step and gumming step described above were carried out after the development step described in the table.

TABLE 2

| Example | Lithographic printing plate precursor Type | Binder polymer | Urethane-acrylic Hybrid polymer | Developer | Compound of Component A | Amount of Component A (parts) |
|---|---|---|---|---|---|---|
| Example 58 | (3) | polymer 1 | None | Developer 1 | BO-1 | 500 |
| Example 59 | (3) | polymer 1 | None | Developer 1 | BO-5 | 500 |
| Example 60 | (3) | polymer 1 | None | Developer 1 | BO-7 | 500 |
| Example 61 | (3) | polymer 1 | None | Developer 1 | BO-13 | 500 |
| Example 62 | (3) | polymer 1 | None | Developer 1 | BC-1 | 500 |
| Example 63 | (3) | polymer 1 | None | Developer 1 | BC-5 | 500 |
| Example 64 | (3) | polymer 1 | None | Developer 1 | BS-1 | 500 |
| Example 65 | (3) | polymer 1 | None | Developer 1 | BS-3 | 500 |
| Example 66 | (3) | polymer 1 | None | Developer 2 | BO-5 | 500 |
| Example 67 | (3) | polymer 1 | None | Developer 2 | BC-1 | 500 |
| Example 68 | (3) | polymer 1 | None | Developer 3 | BO-5 | 500 |
| Example 69 | (3) | polymer 1 | None | Developer 3 | BC-1 | 500 |
| Example 70 | (3) | polymer 1 | None | Developer 4 | BO-5 | 500 |
| Example 71 | (3) | polymer 1 | None | Developer 4 | BC-1 | 500 |
| Example 72 | (3) | polymer 1 | None | Developer 6 | BO-5 | 500 |
| Example 73 | (3) | polymer 1 | None | Developer 6 | BC-1 | 500 |
| Example 74 | (3) | polymer 1 | None | Developer 7 | BO-5 | 500 |
| Example 75 | (3) | polymer 1 | None | Developer 7 | BC-1 | 500 |
| Example 76 | (3) | polymer 1 | None | Developer 8 | BO-5 | 500 |
| Example 77 | (3) | polymer 1 | None | Developer 8 | BC-1 | 500 |
| Example 78 | (3) | polymer 1 | None | Developer 9 | BO-5 | 500 |
| Example 79 | (3) | polymer 1 | None | Developer 9 | BC-1 | 500 |
| Example 80 | (3) | polymer 1 | None | Developer 10 | BO-5 | 500 |
| Example 81 | (3) | polymer 1 | None | Developer 10 | BC-1 | 500 |
| Example 82 | (3) | polymer 1 | None | Developer 11 | BO-5 | 500 |
| Example 83 | (3) | polymer 1 | None | Developer 11 | BC-1 | 500 |
| Example 84 | (3) | polymer 1 | None | Developer 18 | BO-1 | 500 |
| Example 85 | (3) | polymer 1 | None | Developer 18 | BO-5 | 500 |
| Example 86 | (3) | polymer 1 | None | Developer 18 | BO-7 | 500 |
| Example 87 | (3) | polymer 1 | None | Developer 18 | BO-13 | 500 |
| Example 88 | (3) | polymer 1 | None | Developer 18 | BC-1 | 500 |
| Example 89 | (3) | polymer 1 | None | Developer 18 | BC-5 | 500 |
| Example 90 | (3) | polymer 1 | None | Developer 18 | BS-1 | 500 |
| Example 91 | (3) | polymer 1 | None | Developer 18 | BS-3 | 500 |
| Example 92 | (3) | polymer 1 | None | Developer 19 | BO-5 | 80 |
| Example 93 | (3) | polymer 1 | None | Developer 19 | BC-1 | 300 |
| Example 94 | (3) | polymer 1 | None | Developer 1 | BC-1 | 80 |
| Example 95 | (3) | polymer 1 | None | Developer 1 | BC-1 | 300 |
| Example 96 | (3) | polymer 1 | None | Developer 1 | BC-1 | 1,200 |
| Example 97 | (3) | polymer 1 | None | Developer 1 | BC-1 | 1,800 |
| Example 98 | (3) | polymer 1 | None | Developer 18 | BO-1, BC-1 | 250 each |
| Example 99 | (3) | polymer 1 | None | Developer 18 | BO-5, BC-5 | 250 each |
| Example 100 | (3) | polymer 2 | None | Developer 1 | BC-1 | 500 |
| Example 101 | (3) | polymer 3 | None | Developer 1 | BC-1 | 500 |
| Example 102 | (3) | polymer 5 | None | Developer 1 | BC-1 | 500 |
| Comp. Example 14 | (3) | polymer 1 | None | Developer 5 | BO-5 | 500 |
| Comp. Example 15 | (3) | polymer 1 | None | Developer 5 | BC-1 | 500 |
| Comp. Example 16 | (3) | polymer 1 | None | Developer 12 | — | — |
| Comp. Example 17 | (3) | polymer 1 | None | Developer 13 | — | — |
| Comp. Example 18 | (3) | polymer 1 | None | Developer 14 | — | — |
| Comp. Example 19 | (3) | polymer 1 | None | Developer 15 | — | — |
| Comp. Example 20 | (3) | polymer 1 | None | Developer 16 | — | — |
| Comp. Example 21 | (3) | polymer 1 | None | Developer 17 | — | — |
| Comp. Example 22 | (3) | polymer 1 | None | SP-200 | — | — |
| Comp. Example 23 | (3) | polymer 4 | None | Developer 1 | BC-1 | 500 |

TABLE 2-continued

| Example | Lithographic printing plate precursor Type | Binder polymer | Urethane-acrylic Hybrid polymer | Developer | Compound of Component A | Amount of Component A (parts) |
|---|---|---|---|---|---|---|
| Comp. Example 24 | (3) | polymer 4 | None | Developer 18 | BC-1 | 500 |
| Comp. Example 25 | (3) | polymer 4 | None | SP-200 | — | — |
| Comp. Example 26 | (3) | polymer 1 | None | Developer 1* | BC-1 | 500 |

*In Comparative Example 26, the washing step and gumming step described above were carried out after the development step described in the table in the same manner as for Comparative Example 13.

TABLE 3

| Example | Lithographic printing plate precursor Type | Binder polymer | Urethane-acrylic Hybrid polymer | Developer | Compound of Component A | Amount of Component A (parts) |
|---|---|---|---|---|---|---|
| Example 103 | (1) | polymer 1 | Hybridur 580 | Developer 1 | BO-1 | 500 |
| Example 104 | (1) | polymer 1 | Hybridur 580 | Developer 1 | BO-5 | 500 |
| Example 105 | (1) | polymer 1 | Hybridur 580 | Developer 1 | BO-7 | 500 |
| Example 106 | (1) | polymer 1 | Hybridur 580 | Developer 1 | BO-13 | 500 |
| Example 107 | (1) | polymer 1 | Hybridur 580 | Developer 1 | BC-1 | 500 |
| Example 108 | (1) | polymer 1 | Hybridur 580 | Developer 1 | BC-5 | 500 |
| Example 109 | (1) | polymer 1 | Hybridur 580 | Developer 1 | BS-1 | 500 |
| Example 110 | (1) | polymer 1 | Hybridur 580 | Developer 1 | BS-3 | 500 |
| Example 111 | (1) | polymer 1 | Hybridur 580 | Developer 2 | BO-5 | 500 |
| Example 112 | (1) | polymer 1 | Hybridur 580 | Developer 2 | BC-1 | 500 |
| Example 113 | (1) | polymer 1 | Hybridur 580 | Developer 3 | BO-5 | 500 |
| Example 114 | (1) | polymer 1 | Hybridur 580 | Developer 3 | BC-1 | 500 |
| Example 115 | (1) | polymer 1 | Hybridur 580 | Developer 4 | BO-5 | 500 |
| Example 116 | (1) | polymer 1 | Hybridur 580 | Developer 4 | BC-1 | 500 |
| Example 117 | (1) | polymer 1 | Hybridur 580 | Developer 6 | BO-5 | 500 |
| Example 118 | (1) | polymer 1 | Hybridur 580 | Developer 6 | BC-1 | 500 |
| Example 119 | (1) | polymer 1 | Hybridur 580 | Developer 7 | BO-5 | 500 |
| Example 120 | (1) | polymer 1 | Hybridur 580 | Developer 7 | BC-1 | 500 |
| Example 121 | (1) | polymer 1 | Hybridur 580 | Developer 8 | BO-5 | 500 |
| Example 122 | (1) | polymer 1 | Hybridur 580 | Developer 8 | BC-1 | 500 |
| Example 123 | (1) | polymer 1 | Hybridur 580 | Developer 9 | BO-5 | 500 |
| Example 124 | (1) | polymer 1 | Hybridur 580 | Developer 9 | BC-1 | 500 |
| Example 125 | (1) | polymer 1 | Hybridur 580 | Developer 10 | BO-5 | 500 |
| Example 126 | (1) | polymer 1 | Hybridur 580 | Developer 10 | BC-1 | 500 |
| Example 127 | (1) | polymer 1 | Hybridur 580 | Developer 11 | BO-5 | 500 |
| Example 128 | (1) | polymer 1 | Hybridur 580 | Developer 11 | BC-1 | 500 |
| Example 129 | (1) | polymer 1 | Hybridur 580 | Developer 18 | BO-1 | 500 |
| Example 130 | (1) | polymer 1 | Hybridur 580 | Developer 18 | BO-5 | 500 |
| Example 131 | (1) | polymer 1 | Hybridur 580 | Developer 18 | BO-7 | 500 |
| Example 132 | (1) | polymer 1 | Hybridur 580 | Developer 18 | BO-13 | 500 |
| Example 133 | (1) | polymer 1 | Hybridur 580 | Developer 18 | BC-1 | 500 |
| Example 134 | (1) | polymer 1 | Hybridur 580 | Developer 18 | BC-5 | 500 |
| Example 135 | (1) | polymer 1 | Hybridur 580 | Developer 18 | BS-1 | 500 |
| Example 136 | (1) | polymer 1 | Hybridur 580 | Developer 18 | BS-3 | 500 |
| Example 137 | (1) | polymer 1 | Hybridur 580 | Developer 19 | BO-5 | 80 |
| Example 138 | (1) | polymer 1 | Hybridur 580 | Developer 19 | BC-1 | 300 |
| Example 139 | (1) | polymer 1 | Hybridur 580 | Developer 1 | BC-1 | 80 |
| Example 140 | (1) | polymer 1 | Hybridur 580 | Developer 1 | BC-1 | 300 |
| Example 141 | (1) | polymer 1 | Hybridur 580 | Developer 1 | BC-1 | 1,200 |
| Example 142 | (1) | polymer 1 | Hybridur 580 | Developer 1 | BC-1 | 1,800 |
| Example 143 | (1) | polymer 1 | Hybridur 580 | Developer 18 | BO-1, BC-1 | 250 each |
| Example 144 | (1) | polymer 1 | Hybridur 580 | Developer 18 | BO-5, BC-5 | 250 each |
| Example 145 | (1) | polymer 2 | Hybridur 580 | Developer 1 | BC-1 | 500 |
| Example 146 | (1) | polymer 3 | Hybridur 580 | Developer 1 | BC-1 | 500 |
| Example 147 | (1) | polymer 4 | Hybridur 580 | Developer 1 | BC-1 | 500 |
| Example 148 | (1) | polymer 5 | Hybridur 580 | Developer 1 | BC-1 | 500 |
| Example 149 | (1) | polymer 1 | None | Developer 1 | BC-1 | 500 |
| Example 150 | (1) | polymer 2 | None | Developer 1 | BC-1 | 500 |
| Example 151 | (1) | polymer 3 | None | Developer 1 | BC-1 | 500 |
| Example 152 | (1) | polymer 5 | None | Developer 1 | BC-1 | 500 |
| Example 153 | (1) | polymer 1 | Hybridur 870 | Developer 1 | BC-1 | 500 |

TABLE 3-continued

| Example | Lithographic printing plate precursor Type | Binder polymer | Urethane-acrylic Hybrid polymer | Developer | Compound of Component A | Amount of Component A (parts) |
|---|---|---|---|---|---|---|
| Example 154 | (1) | polymer 1 | Hybrid polymer 1 | Developer 1 | BC-1 | 500 |
| Example 155 | (1) | polymer 1 | Hybrid polymer 2 | Developer 1 | BC-1 | 500 |
| Example 156 | (1) | polymer 1 | Hybrid polymer 3 | Developer 1 | BC-1 | 500 |
| Example 157 | (1) | polymer 1 | Hybrid polymer 4 | Developer 1 | BC-1 | 500 |
| Example 158 | (1) | polymer 1 | Hybrid polymer 5 | Developer 1 | BC-1 | 500 |
| Example 159 | (1) | polymer 1 | Hybrid polymer 6 | Developer 1 | BC-1 | 500 |
| Comp. Example 27 | (1) | polymer 1 | Hybridur 580 | Developer 5 | BO-5 | 500 |
| Comp. Example 28 | (1) | polymer 1 | Hybridur 580 | Developer 5 | BC-1 | 500 |
| Comp. Example 29 | (1) | polymer 1 | Hybridur 580 | Developer 12 | — | — |
| Comp. Example 30 | (1) | polymer 1 | Hybridur 580 | Developer 13 | — | — |
| Comp. Example 31 | (1) | polymer 1 | Hybridur 580 | Developer 14 | — | — |
| Comp. Example 32 | (1) | polymer 1 | Hybridur 580 | Developer 15 | — | — |
| Comp. Example 33 | (1) | polymer 1 | Hybridur 580 | Developer 16 | — | — |
| Comp. Example 34 | (1) | polymer 1 | Hybridur 580 | Developer 17 | — | — |
| Comp. Example 35 | (1) | polymer 1 | Hybridur 580 | SP-200 | — | — |
| Comp. Example 36 | (1) | polymer 4 | None | Developer 1 | BC-1 | 500 |
| Comp. Example 37 | (1) | polymer 4 | None | Developer 18 | BC-1 | 500 |
| Comp. Example 38 | (1) | polymer 4 | None | SP-200 | — | — |
| Comp. Example 39 | (1) | polymer 1 | Hybridur 580 | Developer 1* | BC-1 | 500 |

*In Comparative Example 39, the washing step and gumming step described above were carried out after the development step described in the table in the same manner as for Comparative Example 13.

Composition of Developer Used in Development Step
<Developer 1 (pH: 7.0)>
Water: amount required to make up to 10,000 parts when combined with the other components
Amphoteric surfactant described in Table 1 to Table 3 and Table 7: amount described in Table 1 to Table 3 and Table 7
<Developer 2 (pH: 7.0)>
Water: amount required to make up to 10,000 parts when combined with the other components
Benzyl alcohol: 50 parts
Amphoteric surfactant described in Table 1 to Table 3 and Table 7: amount described in Table 1 to Table 3 and Table 7
<Developer 3 (pH: 7.0)>
Water: amount required to make up to 10,000 parts when combined with the other components
Benzyl alcohol: 150 parts
Amphoteric surfactant described in Table 1 to Table 3 and Table 7: amount described in Table 1 to Table 3 and Table 7
<Developer 4 (pH: 7.0)>
Water: amount required to make up to 10,000 parts when combined with the other components
Benzyl alcohol: 400 parts
Amphoteric surfactant described in Table 1 to Table 3 and Table 7: amount described in Table 1 to Table 3 and Table 7
<Developer 5 (pH: 7.0), Comparative Example>
Water: amount required to make up to 10,000 parts when combined with the other components
Benzyl alcohol: 1,000 parts
Amphoteric surfactant described in Table 1 to Table 3 and Table 7: amount described in Table 1 to Table 3 and Table 7
<Developer 6 (pH: 7.0)>
Water: amount required to make up to 10,000 parts when combined with the other components
Amphoteric surfactant described in Table 1 to Table 3 and Table 7: amount described in Table 1 to Table 3 and Table 7
Gum arabic: 250 parts
<Developer 7 (pH: 7.0)>
Water: amount required to make up to 10,000 parts when combined with the other components
Amphoteric surfactant described in Table 1 to Table 3 and Table 7: amount described in Table 1 to Table 3 and Table 7
Hydroxyalkylated starch (Penon JE66, Nippon Starch Chemical Co.): 700 parts
<Developer 8 (pH: 7.0)>
Water: amount required to make up to 10,000 parts when combined with the other components
Amphoteric surfactant described in Table 1 to Table 3 and Table 7: amount described in Table 1 to Table 3 and Table 7
Emalex 710 (polyoxyethylene lauryl ether (10E.O.), nonionic surfactant, manufactured by Nihon Emulsion Co., Ltd.): 500 parts
<Developer 9 (pH: 7.0)>
Water: amount required to make up to 10,000 parts when combined with the other components
Amphoteric surfactant described in Table 1 to Table 3 and Table 7: amount described in Table 1 to Table 3 and Table 7
Pluronic L31 (ethylene oxide-propylene oxide block copolymer, nonionic surfactant, manufactured by ADEKA Corporation): 500 parts <Developer 10 (pH: 7.0)>
Water: amount required to make up to 10,000 parts when combined with the other components
Amphoteric surfactant described in Table 1 to Table 3 and Table 7: amount described in Table 1 to Table 3 and Table 7
PELEX NBL (sodium alkylnaphthalene sulphonate, anionic surfactant, manufactured by Kao Corporation): 500 parts <Developer 11 (pH: 7.0)>
Water: amount required to make up to 10,000 parts when combined with the other components
Amphoteric surfactant described in Table 1 to Table 3 and Table 7: amount described in Table 1 to Table 3 and Table 7
Newcol B13SN (polyoxyethylene aryl ether sulfate, anionic surfactant, manufactured by Nippon Nyukazai Co., Ltd.): 500 parts <Developer 12 (pH: 7.0), Comparative Example>
Water: amount required to make up to 10,000 parts when combined with the other components
Emalex 710 (manufactured by Nihon Emulsion Co., Ltd.): 500 parts <Developer 13 (pH: 7.0), Comparative Example>
Water: amount required to make up to 10,000 parts when combined with the other components
Pluronic L31 (nonionic surfactant, manufactured by ADEKA Corporation): 500 parts <Developer 14 (pH: 7.0), Comparative Example>
Water: amount required to make up to 10,000 parts when combined with the other components
PELEX NBL (anionic surfactant, manufactured by Kao Corporation): 500 parts <Developer 15 (pH: 7.0), Comparative Example>
Water: amount required to make up to 10,000 parts when combined with the other components
Newcol B13SN (polyoxyethylene aryl ether sulfate, anionic surfactant, manufactured by Nippon Nyukazai Co., Ltd.): 500 parts <Developer 16 (pH: 7.0), Comparative Example>
Water: amount required to make up to 10,000 parts when combined with the other components
Pionin B111 (lauryltrimethylammonium chloride, cationic surfactant, manufactured by Takemoto Oil & Fat Co., Ltd.): 500 parts <Developer 17 (pH: 7.0), Comparative Example>
Water: amount required to make up to 10,000 parts when combined with the other components
Imidazoline-type amphoteric surfactant (BI-1) below: 500 parts

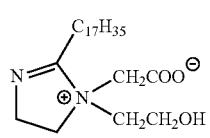

Amphoteric surfactant (BI-1)

<Developer 18 (pH: 9.8)>
Water: amount required to make up to 10,000 parts when combined with the other components
Sodium carbonate: 130 parts
Sodium bicarbonate: 70 parts
Amphoteric surfactant described in Table 1 to Table 3 and Table 7: amount described in Table 1 to Table 3 and Table 7
Monoammonium phosphate: 20 parts
2-Bromo-2-nitropropane-1,3-diol: 0.1 parts
2-Methyl-4-isothiazolin-3-one: 0.1 parts <Developer 19 (pH: 9.8)>
Water: amount required to make up to 10,000 parts when combined with the other components
Sodium carbonate: 130 parts
Sodium bicarbonate: 70 parts
Amphoteric surfactant described in Table 1 to Table 3 and Table 7: amount described in Table 1 to Table 3 and Table 7
Gum arabic: 250 parts
Hydroxyalkylated starch (Penon JE66, Nippon Starch Chemical Co.): 700 parts
Monoammonium phosphate: 20 parts
2-Bromo-2-nitropropane-1,3-diol: 0.1 parts
2-Methyl-4-isothiazolin-3-one: 0.1 parts <Other Developers in Table 1, in Comparative Example>
SP-200: benzyl alcohol-containing (5 to 10 mass %) and alkylated sodium naphthalene sulfonate-containing (10 to 15 mass %) developer manufactured by Kodac Polychrome Graphics LLC.

TABLE 4

| Example | Ink laydown | Resistance to staining during printing | Printing durability |
| --- | --- | --- | --- |
| Example 1 | 8 sheets | A | 120,000 sheets |
| Example 2 | 8 sheets | A | 120,000 sheets |
| Example 3 | 10 sheets | A | 120,000 sheets |
| Example 4 | 10 sheets | A | 120,000 sheets |
| Example 5 | 8 sheets | A | 120,000 sheets |
| Example 6 | 8 sheets | A | 120,000 sheets |
| Example 7 | 10 sheets | A | 120,000 sheets |
| Example 8 | 10 sheets | A | 120,000 sheets |
| Example 9 | 8 sheets | A | 120,000 sheets |
| Example 10 | 8 sheets | A | 120,000 sheets |
| Example 11 | 10 sheets | B | 100,000 sheets |
| Example 12 | 10 sheets | B | 100,000 sheets |
| Example 13 | 12 sheets | B | 100,000 sheets |
| Example 14 | 12 sheets | B | 100,000 sheets |
| Example 15 | 15 sheets | A | 120,000 sheets |
| Example 16 | 15 sheets | A | 120,000 sheets |
| Example 17 | 15 sheets | A | 120,000 sheets |
| Example 18 | 15 sheets | A | 120,000 sheets |
| Example 19 | 8 sheets | A | 120,000 sheets |
| Example 20 | 8 sheets | A | 120,000 sheets |
| Example 21 | 8 sheets | A | 120,000 sheets |
| Example 22 | 8 sheets | A | 120,000 sheets |
| Example 23 | 8 sheets | A | 120,000 sheets |
| Example 24 | 8 sheets | A | 120,000 sheets |
| Example 25 | 8 sheets | A | 120,000 sheets |
| Example 26 | 8 sheets | A | 120,000 sheets |
| Example 27 | 8 sheets | A | 120,000 sheets |
| Example 28 | 8 sheets | A | 120,000 sheets |
| Example 29 | 10 sheets | A | 120,000 sheets |
| Example 30 | 10 sheets | A | 120,000 sheets |
| Example 31 | 8 sheets | A | 120,000 sheets |
| Example 32 | 8 sheets | A | 120,000 sheets |
| Example 33 | 10 sheets | A | 120,000 sheets |
| Example 34 | 10 sheets | A | 120,000 sheets |
| Example 35 | 15 sheets | A | 120,000 sheets |
| Example 36 | 15 sheets | A | 120,000 sheets |
| Example 37 | 8 sheets | B | 120,000 sheets |
| Example 38 | 10 sheets | B | 120,000 sheets |
| Example 39 | 12 sheets | A | 100,000 sheets |
| Example 40 | 15 sheets | A | 100,000 sheets |
| Example 41 | 8 sheets | A | 120,000 sheets |
| Example 42 | 8 sheets | A | 120,000 sheets |
| Example 43 | 8 sheets | A | 120,000 sheets |
| Example 44 | 10 sheets | A | 120,000 sheets |
| Example 45 | 10 sheets | A | 100,000 sheets |
| Example 46 | 8 sheets | A | 120,000 sheets |
| Example 47 | 8 sheets | A | 120,000 sheets |
| Example 48 | 8 sheets | A | 120,000 sheets |
| Example 49 | 10 sheets | A | 120,000 sheets |
| Example 50 | 8 sheets | A | 120,000 sheets |
| Example 51 | 10 sheets | A | 120,000 sheets |
| Example 52 | 10 sheets | A | 120,000 sheets |
| Example 53 | 10 sheets | A | 120,000 sheets |

TABLE 4-continued

| Example | Ink laydown | Resistance to staining during printing | Printing durability |
|---|---|---|---|
| Example 54 | 10 sheets | A | 120,000 sheets |
| Example 55 | 10 sheets | A | 120,000 sheets |
| Example 56 | 10 sheets | A | 120,000 sheets |
| Example 57 | 10 sheets | A | 100,000 sheets |
| Comp. Example 1 | 35 sheets | D | 40,000 sheets |
| Comp. Example 2 | 35 sheets | D | 40,000 sheets |
| Comp. Example 3 | Development not possible | Evaluation not possible | Evaluation not possible |
| Comp. Example 4 | Development not possible | Evaluation not possible | Evaluation not possible |
| Comp. Example 5 | 30 sheets | D | 100,000 sheets |
| Comp. Example 6 | 30 sheets | C | 100,000 sheets |
| Comp. Example 7 | Development not possible | Evaluation not possible | Evaluation not possible |
| Comp. Example 8 | 10 sheets | D | 80,000 sheets |
| Comp. Example 9 | 30 sheets | D | 100,000 sheets |
| Comp. Example 10 | 15 sheets | A | 40,000 sheets |
| Comp. Example 11 | 15 sheets | A | 20,000 sheets |
| Comp. Example 12 | 35 sheets | C | 20,000 sheets |
| Comp. Example 13 | 35 sheets | A | 120,000 sheets |

TABLE 5

| Example | Ink laydown | Resistance to staining during printing | Printing durability |
|---|---|---|---|
| Example 58 | 8 sheets | A | 100,000 sheets |
| Example 59 | 8 sheets | A | 100,000 sheets |
| Example 60 | 10 sheets | A | 100,000 sheets |
| Example 61 | 10 sheets | A | 100,000 sheets |
| Example 62 | 8 sheets | A | 100,000 sheets |
| Example 63 | 8 sheets | A | 100,000 sheets |
| Example 64 | 10 sheets | A | 100,000 sheets |
| Example 65 | 10 sheets | A | 100,000 sheets |
| Example 66 | 8 sheets | A | 100,000 sheets |
| Example 67 | 8 sheets | A | 100,000 sheets |
| Example 68 | 10 sheets | B | 80,000 sheets |
| Example 69 | 10 sheets | B | 80,000 sheets |
| Example 70 | 12 sheets | B | 80,000 sheets |
| Example 71 | 12 sheets | B | 80,000 sheets |
| Example 72 | 15 sheets | A | 100,000 sheets |
| Example 73 | 15 sheets | A | 100,000 sheets |
| Example 74 | 15 sheets | A | 100,000 sheets |
| Example 75 | 15 sheets | A | 100,000 sheets |
| Example 76 | 8 sheets | A | 100,000 sheets |
| Example 77 | 8 sheets | A | 100,000 sheets |
| Example 78 | 8 sheets | A | 100,000 sheets |
| Example 79 | 8 sheets | A | 100,000 sheets |
| Example 80 | 8 sheets | A | 100,000 sheets |
| Example 81 | 8 sheets | A | 100,000 sheets |
| Example 82 | 8 sheets | A | 100,000 sheets |
| Example 83 | 8 sheets | A | 100,000 sheets |
| Example 84 | 8 sheets | A | 100,000 sheets |
| Example 85 | 8 sheets | A | 100,000 sheets |
| Example 86 | 10 sheets | A | 100,000 sheets |
| Example 87 | 10 sheets | A | 100,000 sheets |
| Example 88 | 8 sheets | A | 100,000 sheets |
| Example 89 | 8 sheets | A | 100,000 sheets |
| Example 90 | 10 sheets | A | 100,000 sheets |
| Example 91 | 10 sheets | A | 100,000 sheets |
| Example 92 | 15 sheets | A | 100,000 sheets |
| Example 93 | 15 sheets | A | 100,000 sheets |
| Example 94 | 8 sheets | B | 100,000 sheets |
| Example 95 | 10 sheets | B | 100,000 sheets |
| Example 96 | 12 sheets | A | 80,000 sheets |
| Example 97 | 15 sheets | A | 80,000 sheets |
| Example 98 | 8 sheets | A | 100,000 sheets |
| Example 99 | 8 sheets | A | 100,000 sheets |
| Example 100 | 8 sheets | A | 100,000 sheets |
| Example 101 | 10 sheets | A | 100,000 sheets |
| Example 102 | 8 sheets | A | 100,000 sheets |
| Comp. Example 14 | 35 sheets | D | 20,000 sheets |
| Comp. Example 15 | 35 sheets | D | 20,000 sheets |
| Comp. Example 16 | Development not possible | Evaluation not possible | Evaluation not possible |
| Comp. Example 17 | Development not possible | Evaluation not possible | Evaluation not possible |
| Comp. Example 18 | 30 sheets | D | 80,000 sheets |
| Comp. Example 19 | 30 sheets | C | 80,000 sheets |
| Comp. Example 20 | Development not possible | Evaluation not possible | Evaluation not possible |
| Comp. Example 21 | 10 sheets | D | 40,000 sheets |
| Comp. Example 22 | 30 sheets | D | 80,000 sheets |
| Comp. Example 23 | 15 sheets | A | 20,000 sheets |
| Comp. Example 24 | 15 sheets | A | 10,000 sheets |
| Comp. Example 25 | 35 sheets | C | 10,000 sheets |
| Comp. Example 26 | 35 sheets | A | 100,000 sheets |

TABLE 6

| Example | Ink laydown | Resistance to staining during printing | Printing durability |
|---|---|---|---|
| Example 103 | 8 sheets | A | 140,000 sheets |
| Example 104 | 8 sheets | A | 140,000 sheets |
| Example 105 | 10 sheets | A | 140,000 sheets |
| Example 106 | 10 sheets | A | 140,000 sheets |
| Example 107 | 8 sheets | A | 140,000 sheets |
| Example 108 | 8 sheets | A | 140,000 sheets |
| Example 109 | 10 sheets | B | 140,000 sheets |
| Example 110 | 10 sheets | B | 140,000 sheets |
| Example 111 | 8 sheets | B | 140,000 sheets |
| Example 112 | 8 sheets | B | 140,000 sheets |
| Example 113 | 10 sheets | B | 120,000 sheets |
| Example 114 | 10 sheets | B | 120,000 sheets |
| Example 115 | 12 sheets | B | 120,000 sheets |
| Example 116 | 12 sheets | B | 120,000 sheets |
| Example 117 | 15 sheets | A | 140,000 sheets |
| Example 118 | 15 sheets | A | 140,000 sheets |
| Example 119 | 15 sheets | A | 140,000 sheets |
| Example 120 | 15 sheets | A | 140,000 sheets |
| Example 121 | 8 sheets | A | 140,000 sheets |
| Example 122 | 8 sheets | A | 140,000 sheets |
| Example 123 | 8 sheets | A | 140,000 sheets |
| Example 124 | 8 sheets | A | 140,000 sheets |
| Example 125 | 8 sheets | A | 140,000 sheets |
| Example 126 | 8 sheets | A | 140,000 sheets |
| Example 127 | 8 sheets | A | 140,000 sheets |
| Example 128 | 8 sheets | A | 140,000 sheets |
| Example 129 | 8 sheets | A | 140,000 sheets |
| Example 130 | 8 sheets | A | 140,000 sheets |
| Example 131 | 10 sheets | A | 140,000 sheets |
| Example 132 | 10 sheets | A | 140,000 sheets |
| Example 133 | 8 sheets | A | 140,000 sheets |
| Example 134 | 8 sheets | A | 140,000 sheets |
| Example 135 | 10 sheets | B | 140,000 sheets |
| Example 136 | 10 sheets | B | 140,000 sheets |
| Example 137 | 15 sheets | A | 140,000 sheets |
| Example 138 | 15 sheets | A | 140,000 sheets |
| Example 139 | 8 sheets | B | 140,000 sheets |
| Example 140 | 10 sheets | B | 140,000 sheets |
| Example 141 | 12 sheets | A | 120,000 sheets |
| Example 142 | 15 sheets | A | 120,000 sheets |
| Example 143 | 8 sheets | A | 140,000 sheets |
| Example 144 | 8 sheets | A | 140,000 sheets |
| Example 145 | 8 sheets | A | 140,000 sheets |
| Example 146 | 10 sheets | A | 140,000 sheets |
| Example 147 | 10 sheets | A | 120,000 sheets |
| Example 148 | 8 sheets | A | 140,000 sheets |
| Example 149 | 8 sheets | A | 140,000 sheets |
| Example 150 | 8 sheets | A | 140,000 sheets |
| Example 151 | 10 sheets | A | 140,000 sheets |
| Example 152 | 8 sheets | A | 140,000 sheets |
| Example 153 | 10 sheets | A | 140,000 sheets |

TABLE 6-continued

| Example | Ink laydown | Resistance to staining during printing | Printing durability |
|---|---|---|---|
| Example 154 | 10 sheets | A | 140,000 sheets |
| Example 155 | 10 sheets | A | 140,000 sheets |
| Example 156 | 10 sheets | A | 140,000 sheets |
| Example 157 | 10 sheets | A | 140,000 sheets |
| Example 158 | 10 sheets | A | 140,000 sheets |
| Example 159 | 10 sheets | A | 120,000 sheets |
| Comp. Example 27 | 35 sheets | D | 40,000 sheets |
| Comp. Example 28 | 35 sheets | D | 40,000 sheets |
| Comp. Example 29 | Development not possible | Evaluation not possible | Evaluation not possible |
| Comp. Example 30 | Development not possible | Evaluation not possible | Evaluation not possible |
| Comp. Example 31 | 30 sheets | D | 120,000 sheets |
| Comp. Example 32 | 30 sheets | C | 120,000 sheets |
| Comp. Example 33 | Development not possible | Evaluation not possible | Evaluation not possible |
| Comp. Example 34 | 10 sheets | D | 100,000 sheets |
| Comp. Example 35 | 30 sheets | D | 120,000 sheets |
| Comp. Example 36 | 15 sheets | B | 40,000 sheets |
| Comp. Example 37 | 15 sheets | A | 20,000 sheets |
| Comp. Example 38 | 35 sheets | C | 20,000 sheets |
| Comp. Example 39 | 35 sheets | B | 140,000 sheets |

Examples 160 to 216 and Comparative Examples 40 to 52

Preparation of Lithographic Printing Plate Precursor (8)>

Lithographic printing plate precursor (8) was obtained in the same manner as for lithographic printing plate precursor (1) except that photosensitive layer coating solution (1) in the preparation of lithographic printing plate precursor (1) was changed to photosensitive layer coating solution (8) having the composition below, and protective layer coating solution (1) was changed to protective layer coating solution (3).
Photosensitive layer coating solution (8)
Polymerization initiator (1) below: 0.18 parts
Sensitizing dye (1) below (wavelength of absorption maximum; 359 nm): 0.06 parts
Binder polymer described in Table 7: 0.54 parts as solids content
Urethane-acrylic hybrid polymer in Table 7: 0.84 parts as solids content
Polymerizable compound (Aronix M-315, Toagosei Co., Ltd.): 0.45 parts
Leuco crystal violet: 0.20 parts
Thermopolymerization inhibitor: 0.01 parts (N-nitrosophenylhydroxylamine aluminum salt)
Pionin A-20 (Takemoto Oil & Fat Co., Ltd.): 0.05 parts
Fluorine-based surfactant (1) above: 0.001 parts
Methyl ethyl ketone: 3.50 parts
1-Methoxy-2-propanol: 8.00 parts

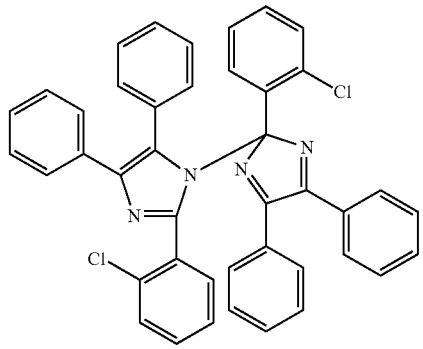

Polymerization initiator (1)

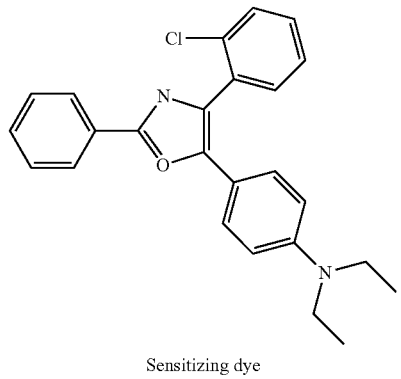

Sensitizing dye

<Exposure>
Lithographic printing plate precursor (8) was imagewisely exposed using a Vx9600 Violet semiconductor laser plate setter (equipped with InGaN type semiconductor laser (light emission wavelength 405 nm±10 nm/output 30 mW)) manufactured by Fujifilm Electronic Imaging (FFEI). Image drawing was carried out at a resolution of 2,438 dpi using an FM screen (TAFFETA 20) manufactured by Fujifilm Corporation at a plate surface exposure of 0.05 mJ/cm$^2$.

The exposure image included a solid image and a fine line image.
<Processing and Evaluation>
Examples 160 to 216 and Comparative Examples 40 to 51 excluding Comparative Example 52, were subjected to processing and to the evaluations shown in Table 7 in the same manner as for Examples 1. Furthermore, Comparative Example 52 was subjected to processing and to the evaluations shown in Table 7 in the same manner as for Comparative Examples 13.

The results thus obtained are shown in Table 8.
From the results of Table 8, it can be seen that in all of Examples 160 to 216, which employed the process for making a lithographic printing plate of the present invention, the results were good in terms of printing durability, ink laydown and resistance to staining during printing.

TABLE 7

| Example | Lithographic printing plate precursor Type | Binder polymer | Urethane-acrylic Hybrid polymer | Developer | Development processing Compound of Component A | Amount of Component A (parts) |
|---|---|---|---|---|---|---|
| Example 160 | (8) | polymer 1 | Hybridur 580 | Developer 1 | BO-1 | 500 |
| Example 161 | (8) | polymer 1 | Hybridur 580 | Developer 1 | BO-5 | 500 |

TABLE 7-continued

| Example | Lithographic printing plate precursor Type | Binder polymer | Urethane-acrylic Hybrid polymer | Developer | Compound of Component A | Amount of Component A (parts) |
|---|---|---|---|---|---|---|
| Example 162 | (8) | polymer 1 | Hybridur 580 | Developer 1 | BO-7 | 500 |
| Example 163 | (8) | polymer 1 | Hybridur 580 | Developer 1 | BO-13 | 500 |
| Example 164 | (8) | polymer 1 | Hybridur 580 | Developer 1 | BC-1 | 500 |
| Example 165 | (8) | polymer 1 | Hybridur 580 | Developer 1 | BC-5 | 500 |
| Example 166 | (8) | polymer 1 | Hybridur 580 | Developer 1 | BS-1 | 500 |
| Example 167 | (8) | polymer 1 | Hybridur 580 | Developer 1 | BS-3 | 500 |
| Example 168 | (8) | polymer 1 | Hybridur 580 | Developer 2 | BO-5 | 500 |
| Example 169 | (8) | polymer 1 | Hybridur 580 | Developer 2 | BC-1 | 500 |
| Example 170 | (8) | polymer 1 | Hybridur 580 | Developer 3 | BO-5 | 500 |
| Example 171 | (8) | polymer 1 | Hybridur 580 | Developer 3 | BC-1 | 500 |
| Example 172 | (8) | polymer 1 | Hybridur 580 | Developer 4 | BO-5 | 500 |
| Example 173 | (8) | polymer 1 | Hybridur 580 | Developer 4 | BC-1 | 500 |
| Example 174 | (8) | polymer 1 | Hybridur 580 | Developer 6 | BO-5 | 500 |
| Example 175 | (8) | polymer 1 | Hybridur 580 | Developer 6 | BC-1 | 500 |
| Example 176 | (8) | polymer 1 | Hybridur 580 | Developer 7 | BO-5 | 500 |
| Example 177 | (8) | polymer 1 | Hybridur 580 | Developer 7 | BC-1 | 500 |
| Example 178 | (8) | polymer 1 | Hybridur 580 | Developer 8 | BO-5 | 500 |
| Example 179 | (8) | polymer 1 | Hybridur 580 | Developer 8 | BC-1 | 500 |
| Example 180 | (8) | polymer 1 | Hybridur 580 | Developer 9 | BO-5 | 500 |
| Example 181 | (8) | polymer 1 | Hybridur 580 | Developer 9 | BC-1 | 500 |
| Example 182 | (8) | polymer 1 | Hybridur 580 | Developer 10 | BO-5 | 500 |
| Example 183 | (8) | polymer 1 | Hybridur 580 | Developer 10 | BC-1 | 500 |
| Example 184 | (8) | polymer 1 | Hybridur 580 | Developer 11 | BO-5 | 500 |
| Example 185 | (8) | polymer 1 | Hybridur 580 | Developer 11 | BC-1 | 500 |
| Example 186 | (8) | polymer 1 | Hybridur 580 | Developer 18 | BO-1 | 500 |
| Example 187 | (8) | polymer 1 | Hybridur 580 | Developer 18 | BO-5 | 500 |
| Example 188 | (8) | polymer 1 | Hybridur 580 | Developer 18 | BO-7 | 500 |
| Example 189 | (8) | polymer 1 | Hybridur 580 | Developer 18 | BO-13 | 500 |
| Example 190 | (8) | polymer 1 | Hybridur 580 | Developer 18 | BC-1 | 500 |
| Example 191 | (8) | polymer 1 | Hybridur 580 | Developer 18 | BC-5 | 500 |
| Example 192 | (8) | polymer 1 | Hybridur 580 | Developer 18 | BS-1 | 500 |
| Example 193 | (8) | polymer 1 | Hybridur 580 | Developer 18 | BS-3 | 500 |
| Example 194 | (8) | polymer 1 | Hybridur 580 | Developer 19 | BO-5 | 80 |
| Example 195 | (8) | polymer 1 | Hybridur 580 | Developer 19 | BC-1 | 300 |
| Example 196 | (8) | polymer 1 | Hybridur 580 | Developer 1 | BC-1 | 80 |
| Example 197 | (8) | polymer 1 | Hybridur 580 | Developer 1 | BC-1 | 300 |
| Example 198 | (8) | polymer 1 | Hybridur 580 | Developer 1 | BC-1 | 1,200 |
| Example 199 | (8) | polymer 1 | Hybridur 580 | Developer 1 | BC-1 | 1,800 |
| Example 200 | (8) | polymer 1 | Hybridur 580 | Developer 18 | BO-1, BC-1 | 250 each |
| Example 201 | (8) | polymer 1 | Hybridur 580 | Developer 18 | BO-5, BC-5 | 250 each |
| Example 202 | (8) | polymer 2 | Hybridur 580 | Developer 1 | BC-1 | 500 |
| Example 203 | (8) | polymer 3 | Hybridur 580 | Developer 1 | BC-1 | 500 |
| Example 204 | (8) | polymer 4 | Hybridur 580 | Developer 1 | BC-1 | 500 |
| Example 205 | (8) | polymer 5 | Hybridur 580 | Developer 1 | BC-1 | 500 |
| Example 206 | (8) | polymer 1 | None | Developer 1 | BC-1 | 500 |
| Example 207 | (8) | polymer 2 | None | Developer 1 | BC-1 | 500 |
| Example 208 | (8) | polymer 3 | None | Developer 1 | BC-1 | 500 |
| Example 209 | (8) | polymer 5 | None | Developer 1 | BC-1 | 500 |
| Example 210 | (8) | polymer 1 | Hybridur 870 | Developer 1 | BC-1 | 500 |
| Example 211 | (8) | polymer 1 | Hybrid polymer 1 | Developer 1 | BC-1 | 500 |
| Example 212 | (8) | polymer 1 | Hybrid polymer 2 | Developer 1 | BC-1 | 500 |
| Example 213 | (8) | polymer 1 | Hybrid polymer 3 | Developer 1 | BC-1 | 500 |
| Example 214 | (8) | polymer 1 | Hybrid polymer 4 | Developer 1 | BC-1 | 500 |
| Example 215 | (8) | polymer 1 | Hybrid polymer 5 | Developer 1 | BC-1 | 500 |
| Example 216 | (8) | polymer 1 | Hybrid polymer 6 | Developer 1 | BC-1 | 500 |
| Comp. Example 40 | (8) | polymer 1 | Hybridur 580 | Developer 5 | BO-5 | 500 |
| Comp. Example 41 | (8) | polymer 1 | Hybridur 580 | Developer 5 | BC-1 | 500 |
| Comp. Example 42 | (8) | polymer 1 | Hybridur 580 | Developer 12 | — | — |
| Comp. Example 43 | (8) | polymer 1 | Hybridur 580 | Developer 13 | — | — |
| Comp. Example 44 | (8) | polymer 1 | Hybridur 580 | Developer 14 | — | — |
| Comp. Example 45 | (8) | polymer 1 | Hybridur 580 | Developer 15 | — | — |
| Comp. Example 46 | (8) | polymer 1 | Hybridur 580 | Developer 16 | — | — |

TABLE 7-continued

| Example | Lithographic printing plate precursor Type | Binder polymer | Urethane-acrylic Hybrid polymer | Developer | Compound of Component A | Amount of Component A (parts) |
|---|---|---|---|---|---|---|
| Comp. Example 47 | (8) | polymer 1 | Hybridur 580 | Developer 17 | — | — |
| Comp. Example 48 | (8) | polymer 1 | Hybridur 580 | SP-200 | — | — |
| Comp. Example 49 | (8) | polymer 4 | None | Developer 1 | BC-1 | 500 |
| Comp. Example 50 | (8) | polymer 4 | None | Developer 18 | BC-1 | 500 |
| Comp. Example 51 | (8) | polymer 4 | None | SP-200 | — | — |
| Comp. Example 52 | (8) | polymer 1 | Hybridur 580 | Developer 1* | BC-1 | 500 |

*In Comparative Example 52, the washing step and gumming step described above were carried out after the development step described in the table in the same manner as for Comparative Example 13.

TABLE 8

| Example | Ink laydown | Resistance to staining during printing | Printing durability |
|---|---|---|---|
| Example 160 | 8 sheets | A | 140,000 sheets |
| Example 161 | 8 sheets | A | 140,000 sheets |
| Example 162 | 10 sheets | A | 140,000 sheets |
| Example 163 | 10 sheets | A | 140,000 sheets |
| Example 164 | 8 sheets | A | 140,000 sheets |
| Example 165 | 8 sheets | A | 140,000 sheets |
| Example 166 | 10 sheets | B | 140,000 sheets |
| Example 167 | 10 sheets | B | 140,000 sheets |
| Example 168 | 8 sheets | B | 140,000 sheets |
| Example 169 | 8 sheets | B | 140,000 sheets |
| Example 170 | 10 sheets | B | 120,000 sheets |
| Example 171 | 10 sheets | B | 120,000 sheets |
| Example 172 | 12 sheets | B | 120,000 sheets |
| Example 173 | 12 sheets | B | 120,000 sheets |
| Example 174 | 15 sheets | A | 140,000 sheets |
| Example 175 | 15 sheets | A | 140,000 sheets |
| Example 176 | 15 sheets | A | 140,000 sheets |
| Example 177 | 15 sheets | A | 140,000 sheets |
| Example 178 | 8 sheets | A | 140,000 sheets |
| Example 179 | 8 sheets | A | 140,000 sheets |
| Example 180 | 8 sheets | A | 140,000 sheets |
| Example 181 | 8 sheets | A | 140,000 sheets |
| Example 182 | 8 sheets | A | 140,000 sheets |
| Example 183 | 8 sheets | A | 140,000 sheets |
| Example 184 | 8 sheets | A | 140,000 sheets |
| Example 185 | 8 sheets | A | 140,000 sheets |
| Example 186 | 8 sheets | A | 140,000 sheets |
| Example 187 | 8 sheets | A | 140,000 sheets |
| Example 188 | 10 sheets | A | 140,000 sheets |
| Example 189 | 10 sheets | A | 140,000 sheets |
| Example 190 | 8 sheets | A | 140,000 sheets |
| Example 191 | 8 sheets | A | 140,000 sheets |
| Example 192 | 10 sheets | B | 140,000 sheets |
| Example 193 | 10 sheets | B | 140,000 sheets |
| Example 194 | 15 sheets | A | 140,000 sheets |
| Example 195 | 15 sheets | A | 140,000 sheets |
| Example 196 | 8 sheets | B | 140,000 sheets |
| Example 197 | 10 sheets | B | 140,000 sheets |
| Example 198 | 12 sheets | A | 120,000 sheets |
| Example 199 | 15 sheets | A | 120,000 sheets |
| Example 200 | 8 sheets | A | 140,000 sheets |
| Example 201 | 8 sheets | A | 140,000 sheets |
| Example 202 | 8 sheets | A | 140,000 sheets |
| Example 203 | 10 sheets | A | 140,000 sheets |
| Example 204 | 10 sheets | A | 120,000 sheets |
| Example 205 | 8 sheets | A | 140,000 sheets |
| Example 206 | 8 sheets | A | 140,000 sheets |
| Example 207 | 8 sheets | A | 140,000 sheets |
| Example 208 | 10 sheets | A | 140,000 sheets |
| Example 209 | 8 sheets | A | 140,000 sheets |
| Example 210 | 10 sheets | A | 140,000 sheets |
| Example 211 | 10 sheets | A | 140,000 sheets |
| Example 212 | 10 sheets | A | 140,000 sheets |
| Example 213 | 10 sheets | A | 140,000 sheets |
| Example 214 | 10 sheets | A | 140,000 sheets |
| Example 215 | 10 sheets | A | 140,000 sheets |
| Example 216 | 10 sheets | A | 120,000 sheets |
| Comp. Example 40 | 35 sheets | D | 40,000 sheets |
| Comp. Example 41 | 35 sheets | D | 40,000 sheets |
| Comp. Example 42 | Development not possible | Evaluation not possible | Evaluation not possible |
| Comp. Example 43 | Development not possible | Evaluation not possible | Evaluation not possible |
| Comp. Example 44 | 30 sheets | D | 120,000 sheets |
| Comp. Example 45 | 30 sheets | C | 120,000 sheets |
| Comp. Example 46 | Development not possible | Evaluation not possible | Evaluation not possible |
| Comp. Example 47 | 10 sheets | D | 100,000 sheets |
| Comp. Example 48 | 30 sheets | D | 120,000 sheets |
| Comp. Example 49 | 15 sheets | B | 40,000 sheets |
| Comp. Example 50 | 15 sheets | A | 20,000 sheets |
| Comp. Example 51 | 35 sheets | C | 20,000 sheets |
| Comp. Example 52 | 35 sheets | B | 140,000 sheets |

Examples 217 to 220

Processing and Evaluation

In Examples 217 to 220, the processing and evaluation shown in Table 9 were carried out in the same manner as in Example 1, Example 58, Example 103, and Example 160 except that developer 20 having the composition shown below was used instead of developer 1 in Example 1, Example 58, Example 103, and Example 160. The results obtained are shown in Table 9.

From the results in Table 9, it can be seen that in all of Examples 217 to 220 employing the process for making a lithographic printing plate of the present invention, lithographic printing plates having excellent printing durability, ink laydown, and resistance to printing stains could be obtained.

<Developer 20 (pH: 4.4)>
Water: amount required to make up to 10,000 parts when combined with the other components
Hydroxypropylated starch (Penon JE66, Nippon Starch Chemical Co.): 1,800 parts
Gum arabic: 460 parts
Monoammonium phosphate: 16 parts
Caustic soda: 18 parts
Phosphoric acid: 40 parts
Citric acid: 10 parts
Propylene glycol: 97 parts
Benzyl alcohol: 180 parts
Exemplified compound B-14: 500 parts Comparative Examples 53 to 60

In Comparative Examples 53 to 60, the processing and evaluation shown in Table 9 were carried out in the same manner as in Example 1, Example 58, Example 103, and Example 160 except that developer 21 and developer 22 having the compositions shown below were used instead of developer 1 in Example 1, Example 58, Example 103, and Example 160. The results obtained are shown in Table 9.

From the results of Table 9, it can be seen that all of Comparative Examples 53 to 60 had problems with performance.

<Developer 21 (pH: 3.1), Comparative Example>
Water: amount required to make up to 10,000 parts when combined with the other components
Hydroxypropylated starch (Penon JE66, Nippon Starch Chemical Co.): 2,200 parts
Gum arabic: 400 parts
Monoammonium phosphate: 20 parts
Caustic soda: 9.5 parts
Phosphoric acid: 72 parts
Ethylene glycol: 200 parts
Benzyl alcohol: 220 parts
Exemplified compound B-14: 500 parts
<Developer 22 (pH: 12.3), Comparative Example>
DV-3: CTP developer manufactured by Fujifilm Corporation

TABLE 9

| Example | Lithographic printing plate precursor Type | Binder polymer | Urethane-acrylic Hybrid polymer | Developer | Compound of Component A | Component A (parts) | Ink laydown | evaluation Resistance to staining during printing | Printing durability |
|---|---|---|---|---|---|---|---|---|---|
| Example 217 | (2) | polymer 1 | Hybridur 580 | Developer 20 | B-14 | 500 | 8 sheets | A | 100,000 sheets |
| Example 218 | (3) | polymer 1 | None | Developer 20 | B-14 | 500 | 8 sheets | A | 80,000 sheets |
| Example 219 | (1) | polymer 1 | Hybridur 580 | Developer 20 | B-14 | 500 | 8 sheets | A | 120,000 sheets |
| Example 220 | (8) | polymer 1 | Hybridur 580 | Developer 20 | B-14 | 500 | 8 sheets | A | 120,000 sheets |
| Comp. Example 53 | (2) | polymer 1 | Hybridur 580 | Developer 21 | B-14 | 500 | Development not possible | Evaluation not possible | Evaluation not possible |
| Comp. Example 54 | (2) | polymer 1 | Hybridur 580 | Developer 22 | — | 500 | image areas damaged | D | Evaluation not possible |
| Comp. Example 55 | (3) | polymer 1 | None | Developer 21 | B-14 | 500 | Development not possible | Evaluation not possible | Evaluation not possible |
| Comp. Example 56 | (3) | polymer 1 | None | Developer 22 | — | 500 | image areas damaged | D | Evaluation not possible |
| Comp. Example 57 | (1) | polymer 1 | Hybridur 580 | Developer 21 | B-14 | 500 | Development not possible | Evaluation not possible | Evaluation not possible |
| Comp. Example 58 | (1) | polymer 1 | Hybridur 580 | Developer 22 | — | 500 | image areas damaged | D | Evaluation not possible |
| Comp. Example 59 | (8) | polymer 1 | Hybridur 580 | Developer 21 | B-14 | 500 | Development not possible | Evaluation not possible | Evaluation not possible |
| Comp. Example 60 | (8) | polymer 1 | Hybridur 580 | Developer 22 | — | 500 | image areas damaged | D | Evaluation not possible |

Examples 221 to 231 and Comparative Examples 61

Preparation of Lithographic Printing Plate Precursor

Lithographic printing plate precursors used in Examples 221 to 231 and Comparative Example 61 were obtained in the same manner as for lithographic printing plate precursor (1) except that photosensitive layer coating solution (1) in the preparation of lithographic printing plate precursor (1) was changed to photosensitive layer coating solution shown in Table 10, and developer (1) was changed to developer shown in Table 10.

<Processing and Evaluation>

Examples 221 to 231 and Comparative Examples 61 were subjected to development processing and to the evaluations in the same manner as for Examples 1 expect further evaluation of processability described below.

The results thus obtained are shown in Table 10.

(4) Processability

In the processing step described above, after processing of 20 $m^2$ per L of developer was carried out, the developer was drained, deposition on the bottom and the filter part of the processing bath were examined, and the degree of occurrence of stains at this point was evaluated using the criteria below and used as the rank for processability.

5: good without deposition.
4: no problem, although slight deposition occurred.
3: no problem in practice; although slight deposition occurred, it could be washed away by running water.
2: acceptable level; although deposition occurred, it could be washed away by rubbing.
1: deposition occurred, and a problem was caused with processability.

EXPLANATION OF REFERENCE NUMERALS AND SYMBOLS

61 Rotating brush roller
62 Backing roller
63 Transport roller
64 Transport guide plate
65 Spray pipe
66 Pipeline
67 Filter
68 Plate supply table
69 Plate discharge table
70 Developer tank
71 Circulation pump
72 Plate

What is claimed is:

1. A process for making a lithographic printing plate, the process comprising:
a step of preparing a negative-working lithographic printing plate precursor comprising above a support a photopolymerizable photosensitive layer comprising a vinylcarbazole compound-derived monomer unit-containing acrylic polymer and/or a urethane-acrylic hybrid polymer,
a step of imagewisely exposing the negative-working lithographic printing plate precursor, and
a step of developing the exposed negative-working lithographic printing plate precursor by means of a developer having a pH of 4 to 10, comprising at least (Component A) a compound represented by Formula (I) below and/or Formula (II) below and (Component B) water, and having an organic solvent content of less than 5 mass %,

TABLE 10

| Example | photosensitive layer coating solution | Urethane-acrylic Hybrid polymer | color | Developer | Processability | Ink laydown | Resistance to staining during printing | Printing durability |
|---|---|---|---|---|---|---|---|---|
| Example 221 | (2) | Pigment 1 | Blue | Developer 1 | 2 | 10 sheets | A | 120,000 sheets |
| Example 222 | (3) | Crystal Violet | Blue | Developer 1 | 5 | 10 sheets | A | 120,000 sheets |
| Example 223 | (4) | Victoria Pure Blue | Blue | Developer 1 | 5 | 10 sheets | A | 120,000 sheets |
| Example 224 | (5) | Methyl Violet | Blue | Developer 1 | 5 | 10 sheets | A | 120,000 sheets |
| Example 225 | (6) | Rhodamine B | Red | Developer 1 | 4 | 10 sheets | A | 120,000 sheets |
| Example 226 | (7) | Oil Yellow #101 | Yellow | Developer 1 | 3 | 10 sheets | A | 120,000 sheets |
| Example 227 | (3) | Crystal Violet | Blue | Developer 5 | 5 | 35 sheets | C | 40,000 sheets |
| Example 228 | (4) | Victoria Pure Blue | Blue | Developer 5 | 5 | 35 sheets | C | 40,000 sheets |
| Example 229 | (5) | Methyl Violet | Blue | Developer 5 | 5 | 35 sheets | C | 40,000 sheets |
| Example 230 | (6) | Rhodamine B | Red | Developer 5 | 3 | 35 sheets | C | 40,000 sheets |
| Example 231 | (7) | Oil Yellow #101 | Yellow | Developer 5 | 2 | 35 sheets | C | 40,000 sheets |
| Comp. Example 61 | (2) | Pigment 1 | Blue | Developer 5 | 1 | 40 sheets | D | 40,000 sheets | wherein the process does not comprise a washing step or a gumming step before or after the development step,

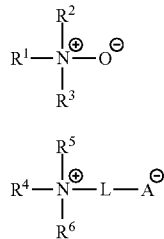

wherein in Formula (I) $R^1$ to $R^3$ independently denote an alkyl group, and in Formula (II) $R^4$ to $R^6$ independently denote an alkyl group, L denotes an alkylene group, and A denotes a carboxylate ion or a sulfonate ion.

2. The process for making a lithographic printing plate according to claim 1, wherein the developer has an organic solvent content of no greater than 1 mass %.

3. The process for making a lithographic printing plate according to claim 1, wherein Component A is a compound represented by Formula (II).

4. The process for making a lithographic printing plate according to claim 3, wherein at least one selected from the group consisting of $R^4$, $R^5$, and $R^6$ above comprises, in an alkyl chain of the alkyl group, a linking group selected from the group consisting of an ester bond, an amide bond, and an ether bond.

5. The process for making a lithographic printing plate according to claim 3, wherein $R^4$, $R^5$, and $R^6$ above have a total number of carbons of 8 to 22.

6. The process for making a lithographic printing plate according to claim 1, wherein the developer further comprises a water-soluble polymer compound.

7. The process for making a lithographic printing plate according to claim 1, wherein Component A has a content in the developer of 1 to 15 mass %.

8. The process for making a lithographic printing plate according to claim 1, wherein Component A has a content in the developer of 4 to 10 mass %.

9. The process for making a lithographic printing plate according to claim 1, wherein Component B has a content in the developer of at least 50 mass %.

10. The process for making a lithographic printing plate according to claim 1, wherein the developer further comprises an anionc surfactant and/or a nonionic surfactant.

11. The process for making a lithographic printing plate according to claim 1, wherein the developer has a pH of 6 to 8.

12. The process for making a lithographic printing plate according to claim 1, wherein the developer comprises a carbonate salt and a bicarbonate salt.

13. The process for making a lithographic printing plate according to claim 1, wherein the acrylic polymer further comprises an acrylonitrile-derived monomer unit.

14. The process for making a lithographic printing plate according to claim 1, wherein the urethane-acrylic hybrid polymer comprises a monomer unit derived from a compound selected from the group consisting of diphenylmethane diisocyanate, m-tolylene diisocyanate, isophorone diisocyanate, and dicyclohexylmethane diisocyanate.

15. The process for making a lithographic printing plate according to claim 1, wherein the photopolymerizable photosensitive layer is sensitive to infrared light and comprises a triphenylalkyl borate salt and/or a tetraphenyl borate salt.

16. The process for making a lithographic printing plate according to claim 15, wherein the photopolymerizable photosensitive layer further comprises a copper phthalocyanine pigment.

17. The process for making a lithographic printing plate according to claim 1, wherein the photopolymerizable photosensitive layer is sensitive to infrared light and does not comprise a borate salt but comprises a coloring dye.

18. The process for making a lithographic printing plate according to claim 15, wherein the photopolymerizable photosensitive layer comprises a cyanine dye and an iodonium salt.

19. The process for making a lithographic printing plate according to claim 1, wherein the photopolymerizable photosensitive layer further comprises a dye.

20. The process for making a lithographic printing plate according to claim 19, wherein the dye has a wavelength of maximum absorption in the range of 600 to 700 nm when measured in the visible region of 360 to 830 nm.

* * * * *